US012791584B2

(12) United States Patent
Jang et al.

(10) Patent No.: US 12,791,584 B2
(45) Date of Patent: Nov. 10, 2026

(54) SEMICONDUCTOR TEST DEVICE AND MANUFACTURING METHOD THEREOF

(71) Applicant: Olum Material Corporation, Yongin-si (KR)

(72) Inventors: Taek Yong Jang, Seongnam-si (KR); Jae Seob Lee, Seoul (KR); Mu Gyeom Kim, Pyeongtaek-si (KR); Young Ho Lee, Yongin-si (KR)

(73) Assignee: Olum Material Corporation, Yongin-si (KR)

( * ) Notice: Subject to any disclaimer, the term of this patent is extended or adjusted under 35 U.S.C. 154(b) by 0 days.

(21) Appl. No.: 19/415,692

(22) Filed: Dec. 10, 2025

(65) Prior Publication Data

US 2026/0243802 A1 Aug. 20, 2026

(30) Foreign Application Priority Data

Feb. 17, 2025 (KR) ........................ 10-2025-0020171
May 30, 2025 (KR) ........................ 10-2025-0071530
Aug. 11, 2025 (KR) ........................ 10-2025-0110395

(51) Int. Cl.
*G01R 1/073* (2006.01)
*G01R 3/00* (2006.01)
*G01R 31/27* (2006.01)

(52) U.S. Cl.
CPC ............. *G01R 1/0735* (2013.01); *G01R 3/00* (2013.01); *G01R 31/27* (2013.01)

(58) Field of Classification Search
CPC ......... G01R 1/0735; G01R 3/00; G01R 31/27
USPC ......................... 324/500, 600, 76.11, 755.09
See application file for complete search history.

(56) References Cited

U.S. PATENT DOCUMENTS 6,107,109 A 8/2000 Akram et al.
10,797,038 B2 * 10/2020 Yu .......................... H10P 74/23
2002/0027441 A1 3/2002 Akram
2005/0225342 A1 * 10/2005 Maruyama ........... G01R 1/0408 438/689
2006/0281222 A1 * 12/2006 Shoji .................... G01R 1/0735 438/107
2007/0024272 A1 * 2/2007 Zentai ................ G01R 31/2812 324/763.01

(Continued)

FOREIGN PATENT DOCUMENTS

KR 10-2004-0004878 1/2004
KR 10-1839949 3/2018

(Continued)

*Primary Examiner* — Huy Q Phan
*Assistant Examiner* — Trung Q Nguyen

(57) ABSTRACT

Provided are a semiconductor test device and a manufacturing method thereof. A semiconductor test device according to an embodiment is designed for testing an electrical connection of a semiconductor and includes a membrane portion comprising a first surface and a plurality of aperture patterns extending in a direction of a second surface opposite to the first surface, wherein the membrane portion includes a metal thin film portion having the plurality of aperture patterns, and an insulating layer portion having an insulating material coated on a surface of the metal thin film portion; neighboring aperture patterns are insulated from each other; and a conductive thin film layer is formed on at least a side surface of each of the aperture patterns to provide an electrical connection path from a top to a bottom of the aperture pattern.

15 Claims, 69 Drawing Sheets

(56) References Cited

U.S. PATENT DOCUMENTS

| | | | | |
|---|---|---|---|---|
| 2009/0017565 | A1* | 1/2009 | Hasebe | G01R 31/2889 257/E23.021 |
| 2010/0304510 | A1* | 12/2010 | Okamoto | H10P 74/207 257/E21.531 |
| 2019/0311960 | A1* | 10/2019 | Tan | G01R 31/2846 |
| 2024/0027494 | A1* | 1/2024 | Tong | G01R 1/06755 |

FOREIGN PATENT DOCUMENTS

| | | |
|---|---|---|
| KR | 10-2194251 | 12/2020 |
| KR | 10-2021-0149352 | 12/2021 |

* cited by examiner (a)

(b)

(a)

(b)

(c)

(d)

(e)

(d)

(e)

(f)

(a)

(b)

(c)

(a)

(b)

(c)

(d)

(e)

(a')

(b')

Invar Fe-36 mass%Ni alloy (a)

(b)

(PO25-1057-US)

(a)

(b)

(c)

(d)

(d)

(a)

(b)

(a)

(b)

(a)

(b)

(a)

(b)

SEMICONDUCTOR TEST DEVICE AND MANUFACTURING METHOD THEREOF

CROSS-REFERENCE TO RELATED APPLICATION(S)

This application claims the benefit under 35 USC § 119(a) of Korean Patent Application No. 10-2025-0020171, filed on Feb. 17, 2025, No. 10-2025-0071530, filed on May 30, 2025, No. 10-2025-0110395, filed on Aug. 11, 2025, in the Korean Intellectual Property Office, the entire disclosure of which is incorporated herein by reference for all purposes.

BACKGROUND

1. Field

The present invention relates to a semiconductor test device and a manufacturing method thereof. More specifically, it relates to a semiconductor test device capable of performing a test by contacting micro bumps of a semiconductor device, and a manufacturing method thereof.

2. Description of Related Art

With the rapid development of semiconductor technology, the packaging technology for semiconductor integrated devices has required high integration and high performance. Therefore, a variety of techniques for a three-dimensional (3D) structure in which a plurality of semiconductor chips are vertically stacked have been developed, in addition to a two-dimensional (2D) structure in which semiconductor chips having integrated circuits formed therein are two-dimensionally arranged on a printed circuit board (PCB) through wires or bumps.

Such a 3D structure can be implemented through a stacked semiconductor device in which a plurality of semiconductor chips are vertically stacked. The semiconductor chips stacked in the vertical direction may be mounted on a semiconductor package substrate while being electrically connected to each other through a plurality of through-electrodes, for example, through-silicon vias (TSVs).

In the case of a stacked semiconductor device, micro bumps may be arranged to facilitate physical contact between the stacked semiconductor chips. The stacked semiconductor chips transmit various signals through TSVs and bumps, and thus a test is required to verify whether they are properly connected.

SUMMARY

Therefore, the present invention has been devised to solve the aforementioned problems of the related art and an object of the present invention is to provide a semiconductor test device capable of performing a test by contacting micro bumps of a semiconductor device, and a manufacturing method thereof.

In addition, an object of the present invention is to provide a semiconductor test device that can prevent damage to micro bumps and enable precise alignment during connection.

However, these objects are merely illustrative, and the scope of the present invention is not limited thereto.

The present invention provides a semiconductor test device for testing an electrical connection of a semiconductor, including: a membrane portion comprising a first surface and a plurality of aperture patterns extending in a direction of a second surface opposite to the first surface, wherein the membrane portion includes a metal thin film portion having the plurality of aperture patterns, and an insulating layer portion having an insulating material coated on a surface of the metal thin film portion; neighboring aperture patterns are insulated from each other; and a conductive thin film layer is formed on at least a side surface of each of the aperture patterns to provide an electrical connection path from a top to a bottom of the aperture pattern, wherein the conductive thin film layer includes: a first conductive thin film layer formed to extend in a horizontal direction by a predetermined distance from a top of the side surface of the aperture pattern; a second conductive thin film layer formed to extend in a horizontal direction by a predetermined distance from a bottom of the side surface of the aperture pattern; and a third conductive thin film layer formed on the side surface of the aperture pattern.

A thickness of the first conductive thin film layer or the second conductive thin film layer may be greater than a thickness of the third conductive thin film layer.

The third conductive thin film layer may provide the electrical connection path by mediating between the first conductive thin film layer and the second conductive thin film layer.

The semiconductor test device may further include a holder portion which includes a hollow region and is connected to an edge of the membrane portion.

The metal thin film portion may include a first metal thin film portion including the first surface, and a second metal thin film portion connected to an upper part of the first metal thin film portion and including the second surface, and the widths of the first metal thin film portion and the second metal thin film portion may differ from each other.

A width of a first aperture pattern in the first metal thin film portion may be greater than a width of a second aperture pattern in the second metal thin film portion, and a portion where the first aperture pattern of the first metal thin film portion and the second aperture pattern of the second metal thin film portion differ may be provided as a cantilever portion protruding inward into each of the aperture patterns.

The first conductive thin film layer may be formed on at least an upper part of the cantilever portion, and the third conductive thin film layer may be formed on at least a side part of the cantilever portion.

A contact protrusion portion may be formed to protrude from the first surface of the metal thin film portion.

On the first surface, the contact protrusion portion may come into contact with a flat pad of a semiconductor, and on the second surface, the conductive thin film layer formed on each of the aperture patterns may come into contact with a micro bump of the semiconductor.

The conductive thin film layer may be formed by performing sputtering or deposition on each of the first surface and the second surface.

The conductive thin film layer may be formed through a through pattern of a sputtering mask after placing the sputtering mask on each of the first surface and the second surface.

The first conductive thin film layer or the second conductive thin film layer may be formed to have a sidewall angle of 5° to 60°.

The conductive thin film layer may have a length that extends further in a lateral direction than the through pattern of the sputtering mask.

The first conductive thin film layer may be formed such that its thickness decreases in a horizontal direction away from the aperture pattern, and the third conductive thin film layer may be formed such that its thickness decreases in the horizontal direction away from the aperture pattern.

The present invention also provides a method for manufacturing a semiconductor test device for testing an electrical connection of a semiconductor, including: (a) providing a membrane portion including a first surface and a plurality of aperture patterns extending in a direction of a second surface opposite to the first surface, wherein the membrane portion includes a metal thin film portion having the plurality of aperture patterns, and an insulating layer portion having an insulating material coated on a surface of the metal thin film portion; and (b) forming a conductive thin film layer on at least a side surface of each of the aperture patterns to provide an electrical connection path from a top to a bottom of the aperture pattern, wherein the conductive thin film layer in step (b) is formed by performing sputtering on each of the first surface and the second surface, and the conductive thin film layer includes: a first conductive thin film layer formed to extend in a horizontal direction by a predetermined distance from a top of the side surface of the aperture pattern; a second conductive thin film layer formed to extend in a horizontal direction by a predetermined distance from a bottom of the side surface of the aperture pattern; and a third conductive thin film layer formed on the side surface of the aperture pattern.

Other features and aspects will be apparent from the following detailed description, the drawings, and the claims.

Figure 1:
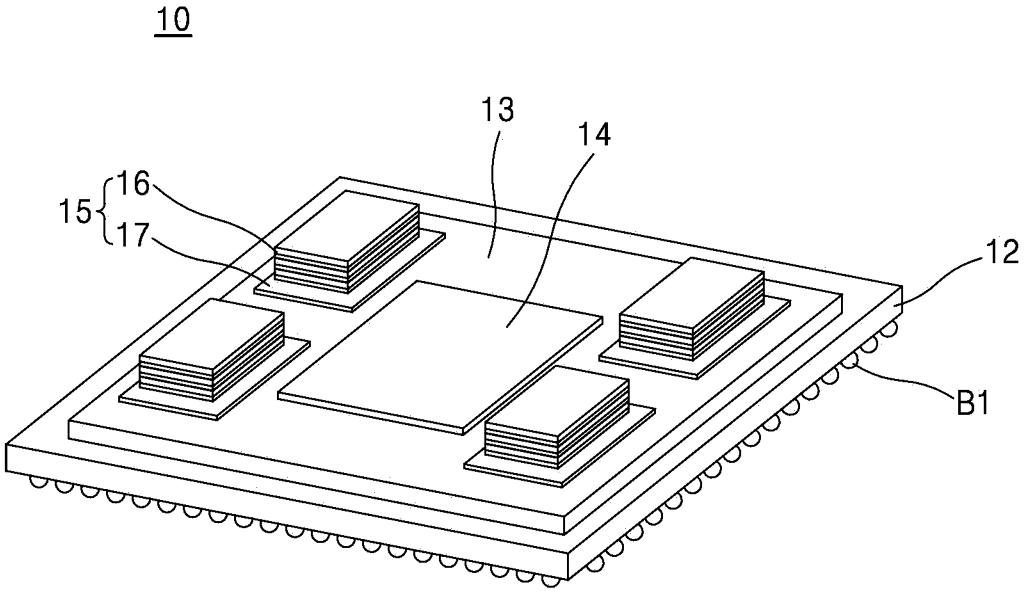
FIG. 1 illustrates a schematic diagram showing a semiconductor chip structure according to an embodiment.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed descriptions of the invention will be made with reference to the accompanying drawings illustrating specific embodiments of the invention by way of example. These embodiments will be described in detail such that the invention can be carried out by one of ordinary skill in the art. It should be understood that various embodiments of the invention are different, but are not necessarily mutually exclusive. For example, a specific shape, structure, and characteristic of an embodiment described herein may be implemented in another embodiment without departing from the scope of the invention. In addition, it should be understood that a position or placement of each component in each disclosed embodiment may be changed without departing from the scope of the invention. Accordingly, there is no intent to limit the invention to the following detailed descriptions. The scope of the invention is defined by the appended claims and encompasses all equivalents that fall within the scope of the appended claims. In the drawings, like reference numerals denote like functions, and the dimensions such as lengths, areas, and thicknesses of elements may be exaggerated for clarity.

Hereinafter, to allow one of ordinary skill in the art to easily carry out the invention, embodiments of the present invention will be described in detail with reference to the accompanying drawings.

Figure 2:
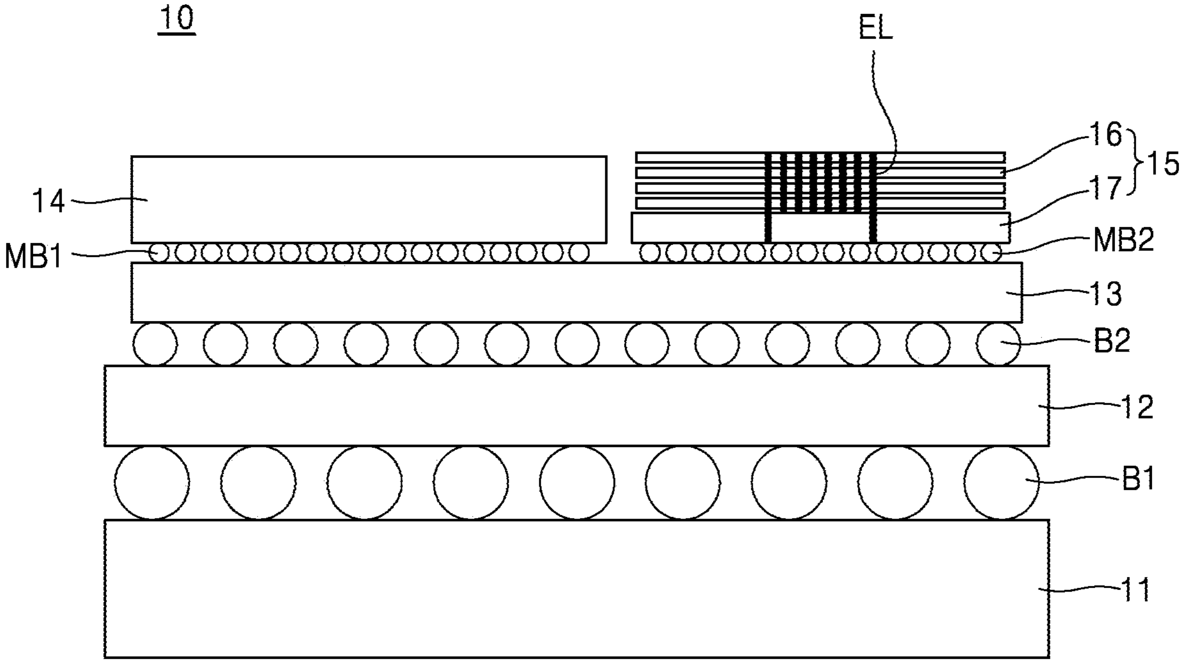
FIG. 2 illustrates a schematic cross-sectional view showing a semiconductor chip structure according to an embodiment.

FIG. 1 illustrates a schematic diagram showing a semiconductor chip structure according to an embodiment. FIG. 2 illustrates a schematic cross-sectional view showing a semiconductor chip structure according to an embodiment.

Referring to FIGS. 1 and 2, a semiconductor device 10 according to an embodiment may include a base substrate 11, a package substrate 12, an interposer 13, a first semiconductor package 14, and a second semiconductor package 15. The semiconductor device 10 may be implemented as a system-in-package in which heterogeneous semiconductor chips are assembled into a single package. Each of the semiconductor chips assembled into a single package in the semiconductor device 10 may correspond to a semiconductor package. For example, the semiconductor device 10 may be provided as a semiconductor package in which AI semiconductor chips are combined.

The base substrate 11 and the package substrate 12 may be provided as printed circuit boards (PCBs) with circuit patterns. For example, the base substrate 11 may be provided as the base of a graphics card. The base substrate 11 may be equipped with a PCI Express, a display connector, and the like. Bumps B1 may be interposed between the base substrate 11 and the package substrate 12 to transmit electrical signals.

The interposer 13 may be provided to accommodate a plurality of semiconductor packages 14 and 15. For example, a plurality of upper pads (not shown) may be formed on the silicon interposer 13, and the first semiconductor package 14 and the second semiconductor package 15 may be electrically connected through these upper pads. The first semiconductor package 14 and the second semiconductor package 15 may be stacked on the package substrate 12 via the interposer 13.

The first semiconductor package 14 may be provided as a processor. The first semiconductor package 14 may be stacked on the interposer 13. For example, the first semiconductor package 14, which is a graphics processing unit (GPU), may be electrically connected to the interposer 13 through the coupling of the micro bumps MB1 of the first semiconductor package 14 and the upper pads (not shown) of the interposer 13.

The second semiconductor package 15 may be provided as a memory package. For example, the second semiconductor package 15 may be provided as a high-bandwidth memory (HBM), which is a stacked semiconductor memory. The second semiconductor package 15 may include multiple stacked memory dies 16 and a controller die 17. The multiple memory dies 16 and the controller die 17 may transmit electrical signals through through-silicon vias (TSV) EL. The second semiconductor package 15 may be coupled to an upper pad (not shown) of the interposer 13 via micro bumps MB2 on a lower portion of the second semiconductor package 15, and the second semiconductor package 15 may be electrically connected to the interposer 13.

A stacked semiconductor memory (HBM) may be manufactured and tested in the form of stacked wafers, then diced into individual dies or individual semiconductor chips. Traditionally, a test is performed on the wafer in its stacked form before dicing. After dicing, it becomes difficult to make contact with individual dies or semiconductor chips using probes. Conventional probes are equipped with pins approximately 100 μm in size. However, the lower micro bumps of increasingly integrated stacked semiconductor memory (HBM) have a size and pitch ranging from a few to several tens of micrometers, making it difficult to make contact with conventional probes. Components that are difficult to make contact with probes may undergo testing after being assembled into a single package, which may lead to a problem where even properly functioning components must be discarded due to a few defective components.

In addition, in the case of micro bumps MB2 located on the lower portion of individual stacked semiconductor memory, their small size and susceptibility to deformation under pressure may be problematic. When a stacked semiconductor memory is individually tested, some micro bumps may be damaged, deformed, or misaligned during the process of pressing the stacked semiconductor memory for testing, leading to product defects. Therefore, there is a need for a semiconductor test device that can prevent damage to micro bumps.

Meanwhile, in addition to individual stacked semiconductor memory, there is also a possibility that some micro bumps may be damaged when testing is performed on wafers in a stacked state. Therefore, there is a need for a semiconductor test device that can perform a test by contacting the micro bumps in a way that prevents damage to them while ensuring accurate and precise alignment with the micro bumps.

The present invention is characterized by providing a semiconductor test device that can prevent damage to micro bumps and perform a test by contacting the micro bumps, and a manufacturing method thereof.

Figure 3:
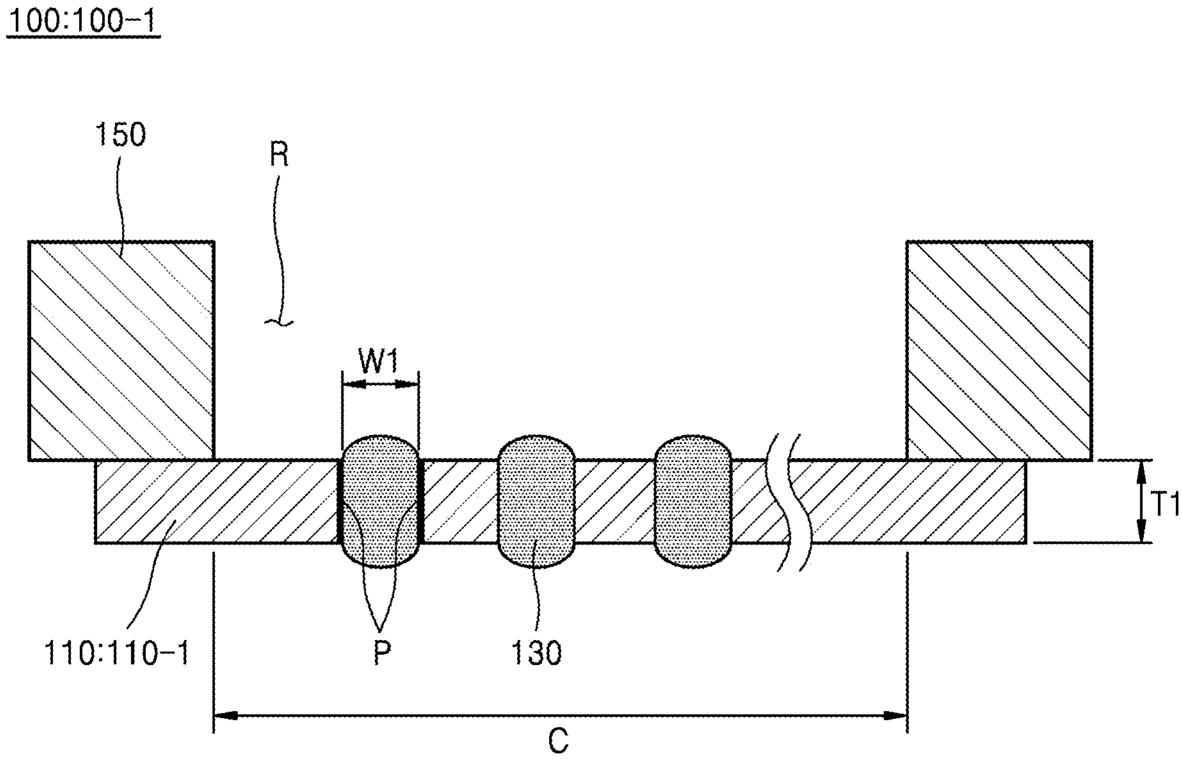
FIG. 3 illustrates a schematic diagram showing a semiconductor test device according to a first embodiment of the present invention.
Figure 4:
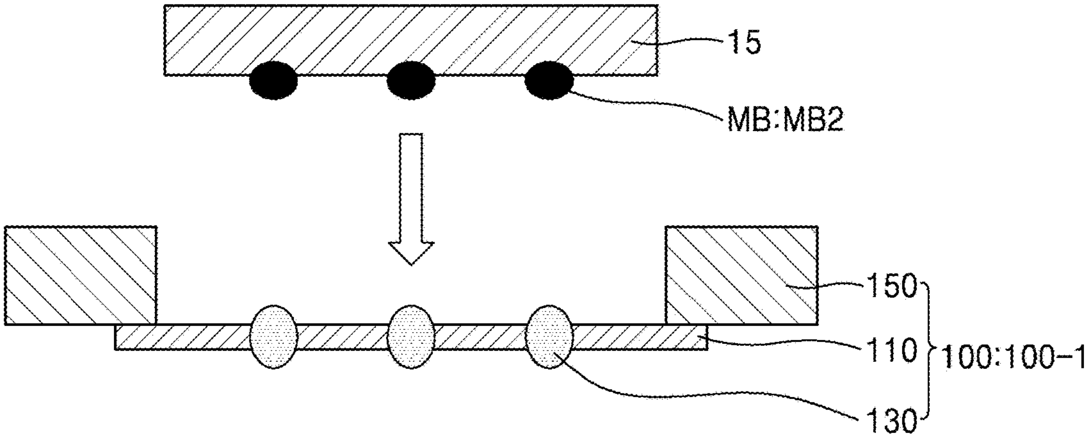
FIGS. 4 to 5 illustrate schematic diagrams showing how to test an electrical connection between a stacked semiconductor memory and an interposer by applying a semiconductor test device according to an embodiment of the present invention.
Figure 4:
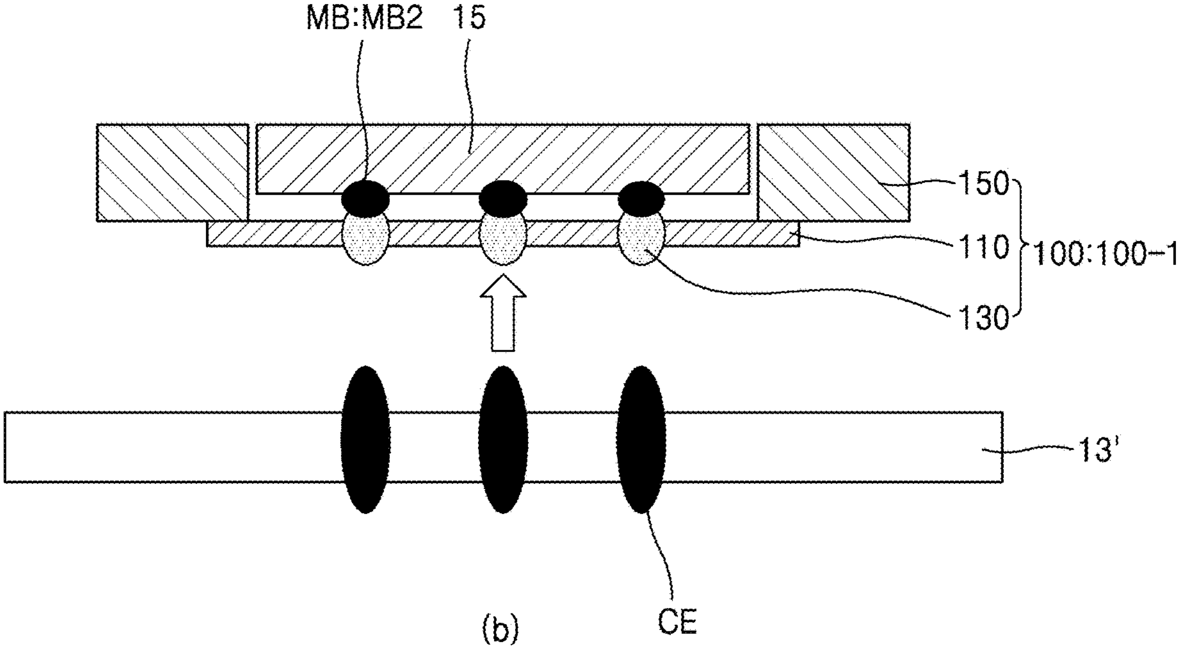
Figure 5:
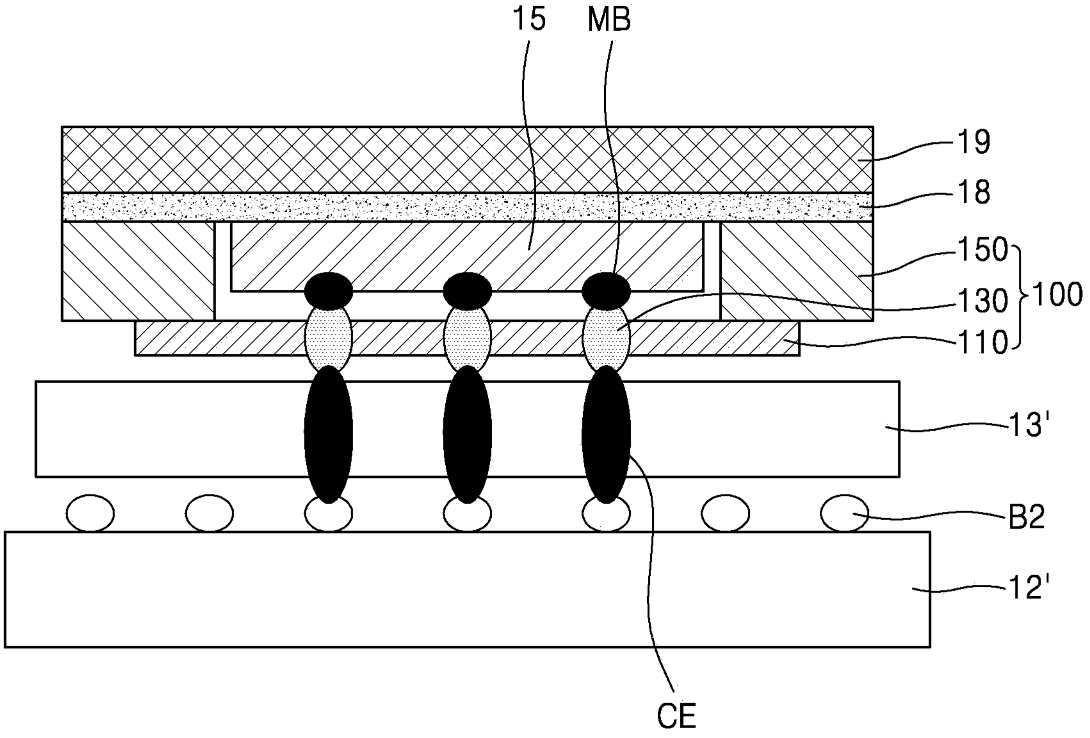

FIG. 3 illustrates a schematic diagram showing a semiconductor test device according to a first embodiment. FIGS. 4 to 5 illustrate schematic diagrams showing how to test an electrical connection between a stacked semiconductor memory and an interposer by applying a semiconductor test device according to an embodiment of the present invention.

Referring to FIGS. 3 to 5, a semiconductor test device 100 (100-1) according to an embodiment of the present invention may be interposed between a stacked semiconductor memory 15 and an interposer 13' and be used to test an electrical connection. Hereinafter, the above-mentioned second semiconductor package 15 will be described under the assumption that it is a stacked semiconductor memory (HBM). Meanwhile, in FIGS. 3 to 5, three electrical path portions 130 are shown for the sake of convenience in explanation, but it should be noted that the electrical path portions 130 may be formed to correspond to the number of lower micro bumps MB (MB2) of the stacked semiconductor memory.

Meanwhile, in the present invention, the semiconductor test device 100 is illustrated as being used between the stacked semiconductor memory 15 and the interposer 13' for convenience of explanation, but it is not necessarily limited to HBM, and may also be applied to other semiconductor memories, such as DRAM, if the semiconductor memory requires testing of electrical connection. Additionally, the semiconductor test device 100 may be interposed between the semiconductor memory and the interposer 13' or between semiconductor memories to test the electrical connection. Furthermore, the interposer 13' may be understood as a concept that includes a support substrate arranged to face the semiconductor memory and establish electrical connection therewith. In addition, the semiconductor test device 100 may be applied to semiconductor chips such as CPUs, GPUs, and APs, in addition to the semiconductor memory, to test electrical connections. The semiconductor test device 100 may also be applied between any two components among semiconductor chips, semiconductor memory, and interposers.

The semiconductor test device 100 (100-1) according to the first embodiment may include a membrane portion 110 (110-1) and a holder portion 150. The membrane portion 110 may include a plurality of aperture patterns P and an electrical connection path may be provided from the top to the bottom of each aperture pattern P. This electrical connection path may be provided through an electrical path portion 130 that includes a conductive material.

According to an embodiment, the membrane portion 110 may be made of an insulating material. The aperture patterns P formed on the membrane portion 110 may be in contact, in one-to-one correspondence, with the micro bumps MB (MB2) on the lower portion of the stacked semiconductor memory 15. Therefore, the membrane portion 110 should be able to accommodate the formation of a plurality of aperture patterns P at a level of several to several tens of micrometers. Additionally, since the temperature may rise due to electrical contact during testing, the membrane portion 110 may use a material with low thermal expansion and low thermal contraction due to temperature changes, that is, a material with a low coefficient of thermal expansion (CTE). Moreover, the membrane portion 110 may be made of a material that is durable, resistant to deformation in the X and Y directions, and flexible to reduce the risk of damaging the micro bumps MB (MB2). Considering these factors, the membrane portion 110 may use an insulating material such as polyimide, rubber, resin, Teflon, polymer, curable photoresist, inorganic insulator, or organic insulator.

The membrane portion 110 may have a plurality of aperture patterns P formed along the thickness direction. The plurality of aperture patterns P may be formed at regular pitches along the horizontal direction (XY plane direction). For example, the pitch between the aperture patterns P may range from several tens of micrometers, for example, approximately 10 to 150 μm, and the width W1 of the aperture pattern P may be less than this, and may be approximately 5 to 100 μm. Approximately tens of thousands of micro bumps MB2 are arranged on the lower portion of one stacked semiconductor memory 15, and the aperture patterns P may be formed to correspond to these micro bumps MB2. The area where approximately tens of thousands of aperture patterns P are clustered along the XY plane direction is referred to as a cell portion C. To form such aperture patterns P of a fine width W1 and at a fine pitch, the overall thickness of the membrane portion 110 must also be thin. For example, the membrane portion 110 may be provided in a thin film form with a thickness T1 of approximately 5 to 50 μm.

The holder portion 150 may be connected to the membrane portion 110 to securely support the membrane portion 110. The membrane portion 110 and the holder portion 150 may be connected to each other using adhesive means or through welding or the like. The holder portion 150 may have a frame-like shape with a hollow region R inside. The hollow region R may serve as a space to accommodate the stacked semiconductor memory 15 to be tested. Accordingly, the hollow region R has preferably a rectangular shape corresponding to the shape of the stacked semiconductor memory 15, but it is not limited thereto. For example, the size (horizontal area) of the hollow region R may correspond to the size of the stacked semiconductor memory 15, which is several millimeters to several tens of millimeters in width and height. In another example, the size of the hollow region R may correspond to the size of a stacked semiconductor memory including a plurality of cells/a plurality of dies, or the size of a silicon wafer, and it may be provided in a size larger than that. The area of the cell portion C may also correspond to the area of the aforementioned hollow region R.

The holder portion 150 may be made of a material with a low CTE to prevent thermal deformation. The holder portion 150 may use a material such as Invar, Super Invar, nickel-iron alloy, nickel-cobalt alloy, nickel-iron-cobalt alloy, quartz, or glass.

The membrane portion 110 may provide an electrical connection path from the top to the bottom of each aperture pattern P, and this electrical connection path may be formed through the electrical path portion 130 that includes a conductive material.

For example, the electrical path portion 130 may include a conductive material such as conductive rubber, metal powder composite, conductive metal, graphene, carbon nanotubes (CNT), quantum dot, or multilayer ceramic capacitor (MLCC).

The electrical path portion 130 may be filled in the aperture pattern P. To ensure smooth contact with the micro bump MB2 of the stacked semiconductor memory 15 and to prevent excessive stress on the micro bump MB2, the path portion 130 may include an elastic matrix made of an elastic material. The elastic matrix may be made of a material such as polyimide, rubber, resin, or polymer.

Additionally, the electrical path portion 130 must include a conductive material to provide an electrical connection path while maintaining elasticity. For example, the electrical path portion 130 may include a plurality of conductive particles, a plurality of conductive rods, a plurality of conductive wires, a plurality of conductive balls, or a plurality of conductive flakes dispersed within the elastic matrix. These particles, rods, wires, balls, or flakes may have a size on the scale of nanometers to micrometers, and they may be interconnected within the elastic matrix to form an electrical connection path from the top to the bottom of the electrical path portion 130.

Since each of the electrical path portions 130 is filled within its respective aperture pattern P so that they are spaced apart from each other, the electrical path portions 130 do not short-circuit each other. The electrical path portions 130 may be filled within the aperture patterns P to the same thickness as the membrane portion 110. Alternatively, the electrical path portion 130 may be filled thicker than the membrane portion 110, so that they protrude beyond the top/bottom surfaces of the membrane portion 110. In this case, if the electrical path portions 130 protrude excessively beyond the top/bottom surfaces of the membrane portion 110, the contact stability may decrease during the process of pressing against the micro bumps MB2. Therefore, the thickness of the electrical path portions 130 is preferably formed to be no more than 150% of the thickness T1 of the membrane portion 110. This allows the micro bumps MB2 on the lower portion of the stacked semiconductor memory 15 to make stable contact only with the electrical path portions 130.

As shown in (a) of FIG. 4, the stacked semiconductor memory 15 that needs to be tested may be provided. The stacked semiconductor memory 15 may have a plurality of micro bumps MB (MB2) formed on its lower portion. Subsequently, the stacked semiconductor memory 15 may be accommodated in the hollow region R provided by the holder portion 150 of the semiconductor test device 100 (100-1). The micro bumps MB may be respectively in contact with the electrical path portions 130 of the semiconductor test device 100.

Next, as shown in (b) of FIG. 4, a test interposer 13' may be prepared. The test interposer 13' may have connection electrodes CE, such as bumps and internal circuits, formed in the same way as in the interposer 13. When the semiconductor test device 100 accommodating the stacked semiconductor memory 15 is placed on the test interposer 13', a bottom of the electrical path portion 130 may make contact with the connection electrode CE.

Then, as shown in FIG. 5, the stacked semiconductor memory 15 may be pressed from above using a sponge pad 18 and a chuck 19. When the stacked semiconductor memory 15 applies stress to a lower portion, the elastic matrix of the electrical path portion 130 may be compressed, allowing electrical connection to the micro bump MB. As the electrical path portions 130 are slightly compressed due to their elasticity, all the electrical path portions 130 and all the micro bumps MB can make stable contact. When the electrical path portions 130 are compressed, the conductivity increases as the plurality of particles, rods, wires, balls, or flakes with conductivity within the electrical path portions 130 form new conductive paths, enabling the transmission of electrical signals from the top to the bottom of the electrical path portions 130. In this case, because the electrical path portions 130 possess elasticity, the stress applied to the micro bumps MB is minimized and thus damage to the micro bumps MB may be prevented. Since electrical connections can be made from the micro bumps MB through the electrical path portions 130 to the test interposer 13', it is possible to test the stacked semiconductor memory 15. Additionally, a test package substrate 12' may be further connected to a lower portion of the test interposer 13' to perform the test.

When the stress compressing the stacked semiconductor memory 15 is released, the elastic matrix of the electrical path portion 130 restores to its original shape, reducing conductivity and allowing the electrical connection to the micro bump MB to be disconnected. Here, the disconnection of the electrical connection may include terminating the test by releasing the contact between some electrical path portions 130 and some micro bumps MB.

Figure 6:
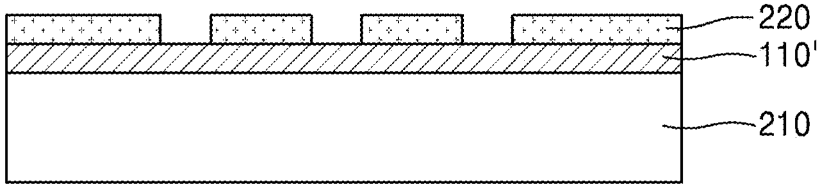
FIGS. 6 to 7 illustrate schematic diagrams showing a manufacturing process of a semiconductor test device according to an embodiment of the present invention.
Figure 6:
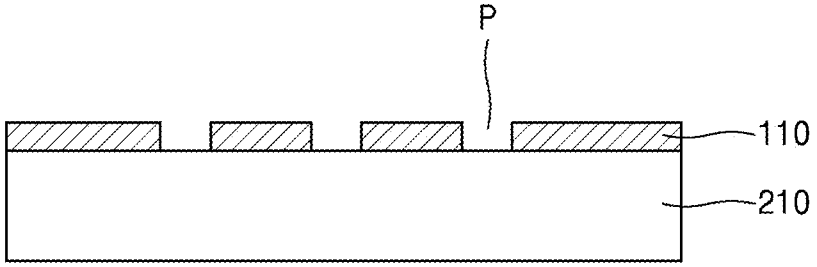
Figure 6:
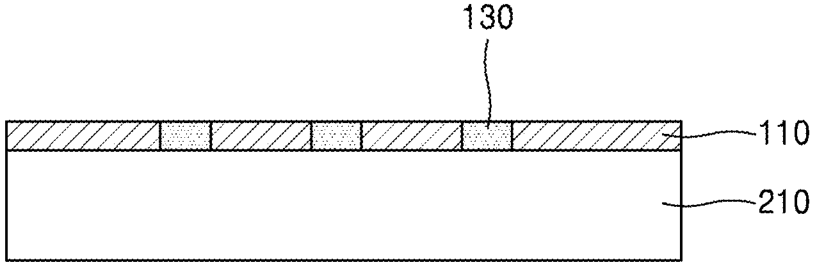
Figure 7:
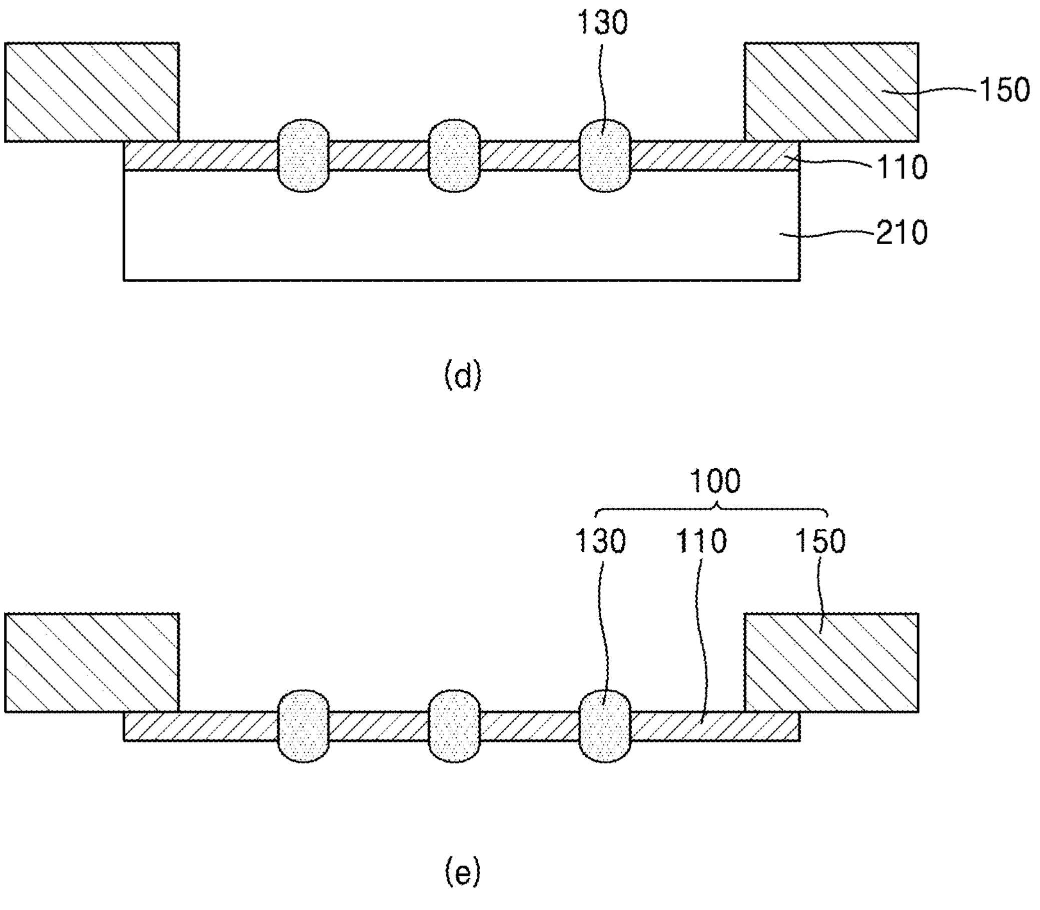

FIGS. 6 to 7 illustrate schematic diagrams showing a manufacturing process of a semiconductor test device according to an embodiment of the present invention.

Referring to (a) of FIG. 6, a support substrate 210 may be provided. The support substrate 210 may be made of a material such as glass, wafers, or quartz in a plate shape. Subsequently, a membrane portion 110' may be formed on the support substrate 210. Then, to form aperture patterns P in the membrane portion 110', a patterned etch-resistant pattern 220 may be formed on the membrane portion 110'. For example, the etch-resistant pattern 220 may be made of photoresist, oxide, nitride, or the like.

Next, referring to (b) of FIG. 6, the membrane portion 110' may be etched to form the aperture patterns P. Wet etching, dry etching, or scribing may be used. After forming the aperture patterns P, the etch-resistant pattern 220 may be removed, and cleaning may be performed.

Next, referring to (c) of FIG. 6, an electrical path portion 130 may be formed within the aperture pattern P. The electrical path portion 130 may be formed using various methods such as printing, deposition, sputtering, plating, or spraying without limitation. The electrical path portion 130 may be formed to be the same thickness as or thicker than the membrane portion 110.

Next, referring to (d) of FIG. 7, a holder portion 150 may be connected to the membrane portion 110. The holder portion 150 may be connected to an edge portion of the membrane portion 110, where the aperture pattern P is not formed, using adhesive means or by welding.

Next, referring to (e) of FIG. 7, the membrane portion 110 may be separated from the support substrate 210. Separation may be performed by applying heat, chemical treatment, ultrasound, or light irradiation to the interface between the membrane portion 110 and the support substrate 210. After the separation of the membrane portion 110 from the support substrate 210, the membrane portion 110 may be connected to the holder portion 150, and the manufacturing of a semiconductor test device 100 with the electrical path portion 130 formed in each aperture pattern P may be completed.

Figure 8:
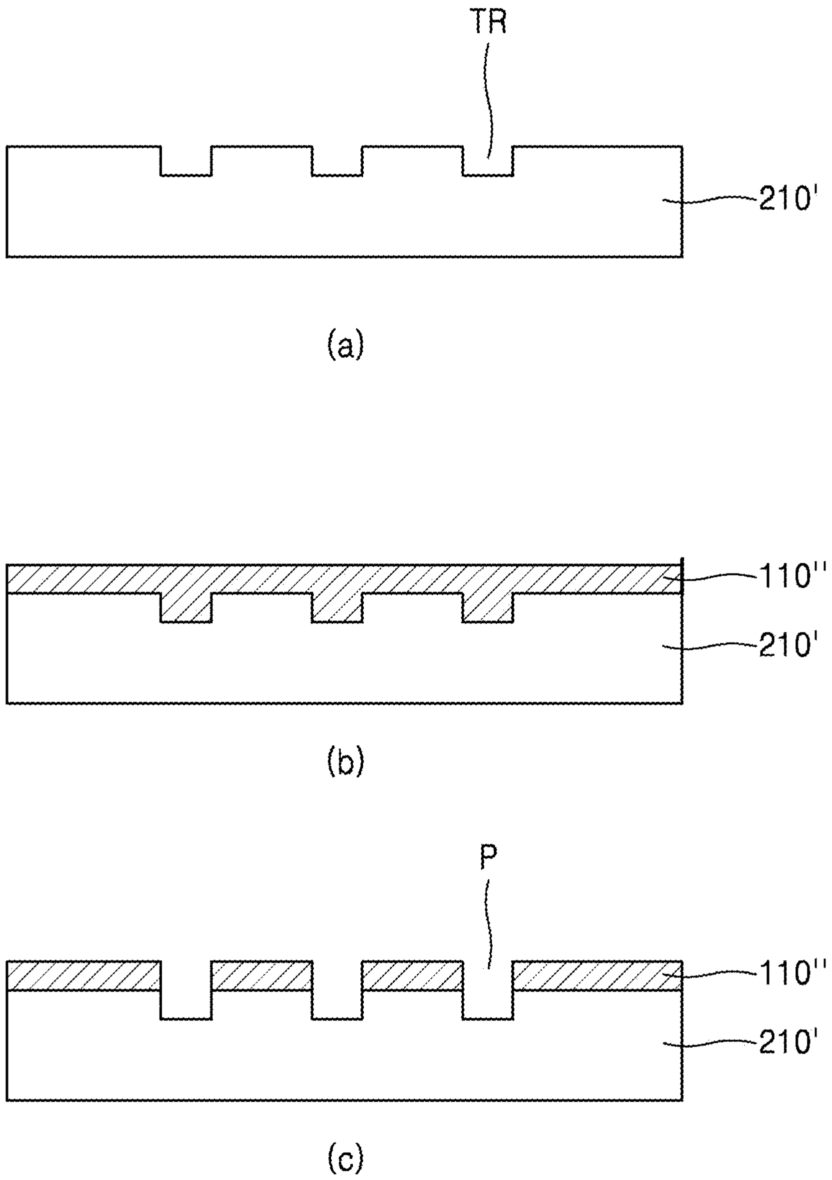
FIGS. 8 to 9 illustrate schematic diagrams showing a manufacturing process of a semiconductor test device according to another embodiment of the present invention.
Figure 9:
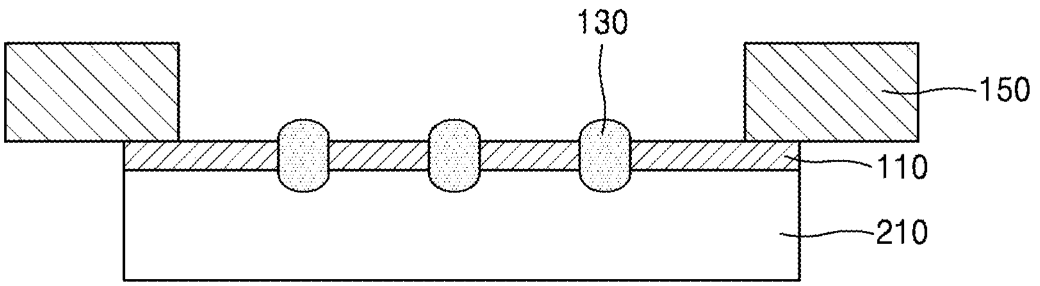
Figure 9:
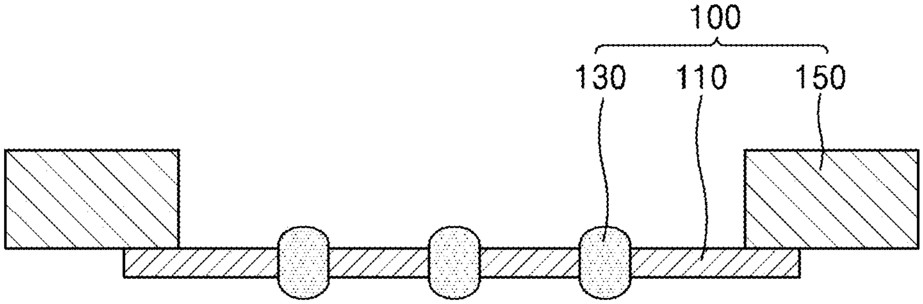

FIGS. 8 to 9 illustrate schematic diagrams showing a manufacturing process of a semiconductor test device according to another embodiment of the present invention.

Referring to (a) of FIG. 8, a support substrate 210' having a trench TR formed thereon may be provided. A position at which the trench TR is formed may correspond to the position where an aperture pattern P or an electrical path portion 130 is to be formed. The depth of the trench TR may correspond to the height at which the electrical path portion 130 will protrude above the membrane portion 110.

Next, referring to (b) of FIG. 8, a membrane portion 110" may be formed on the support substrate 210'. A part of the membrane portion 110" may be formed within the trench TR of the support substrate 210'.

Next, referring to (c) of FIG. 8, to form the aperture patterns P in the membrane portion 110", a patterned etch-resistant pattern (not shown) (see 220 in FIG. 6) may be formed on the membrane portion 110". Subsequently, the membrane portion 110" may be etched to form the aperture patterns P. Wet etching, dry etching, or scribing may be used. Alternatively, the aperture patterns P may also be formed in the membrane portion 110" by imprinting, where the membrane portion 110" is pressed with a mold, without the need to form an etch-resistant pattern.

Next, referring to (d) of FIG. 9, an electrical path portion 130 may be formed within the aperture pattern P. The electrical path portion 130 may be formed using various methods such as printing, deposition, sputtering, plating, or spraying without limitation. As the electrical path portion 130 is formed not only in the aperture pattern P but also in the trench TR, the electrical path portion 130 may be formed to be thicker than the membrane portion 110.

Subsequently, the holder portion 150 may be connected to the membrane portion 110. The connection of the holder portion 150 may also be performed before the formation of the electrical path portion 130.

Next, referring to (e) of FIG. 9, the membrane portion 110 may be separated from the support substrate 210', completing the manufacturing of the semiconductor test device 100.

Figure 10:
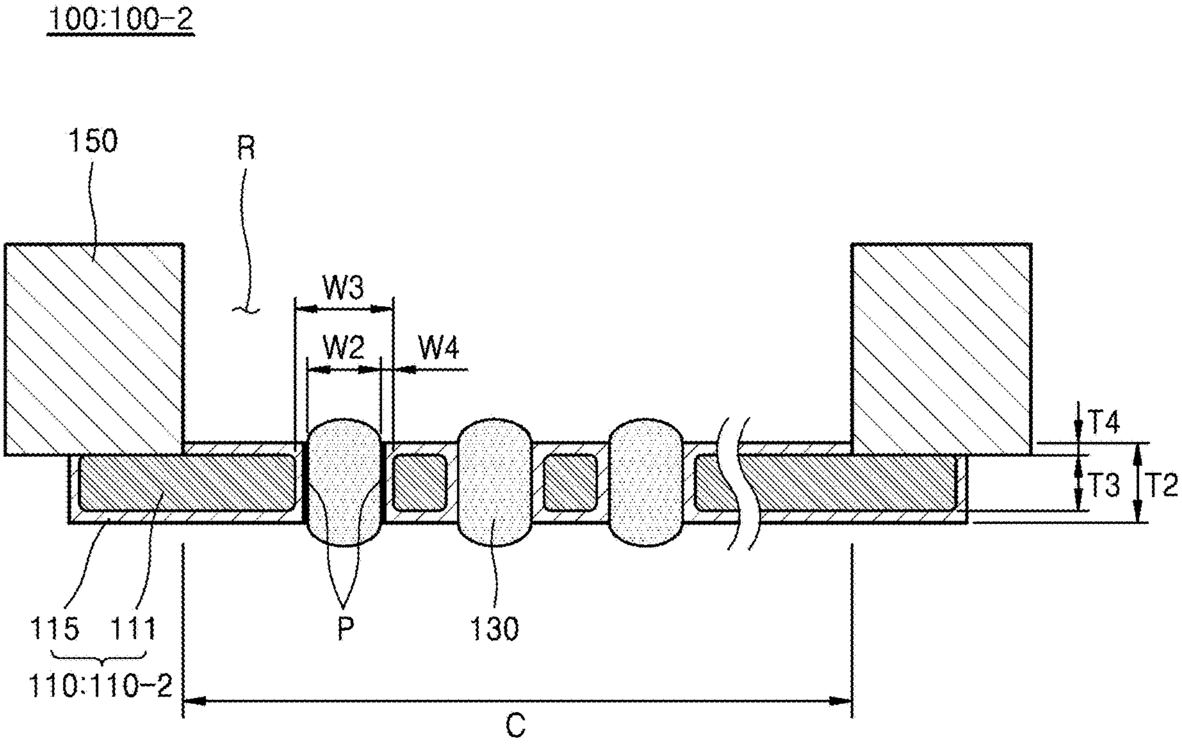
FIG. 10 illustrates a schematic diagram showing a semiconductor test device according to a second embodiment of the present invention.

FIG. 10 illustrates a schematic diagram showing a semiconductor test device according to a second embodiment. Hereinafter, the description of components that are the same as those in the semiconductor test device of the first embodiment described above with reference to FIGS. 3 to 5 will be omitted, and only the differences will be described.

Referring to FIG. 10, a semiconductor test device 100 (100-2) according to the second embodiment may include a membrane portion 110 (110-2) and a holder portion 150. The membrane portion 110 may include a plurality of aperture patterns P, and an electrical connection path may be provided from the top to the bottom of each aperture pattern P. This electrical connection path may be provided through an electrical path portion 130 that includes a conductive material.

According to an embodiment, the membrane portion 110 (110-2) may include a metal thin film portion 111 and an insulating layer portion 115. Each of the aperture patterns P formed in the metal thin film portion 111 may be in contact, in one-to-one correspondence, with micro bumps MB (MB2) on a lower portion of a stacked semiconductor memory 15.

The membrane portion 110 should be able to accommodate the formation of a plurality of aperture patterns P on the order of several to several tens of micrometers. Additionally, the membrane portion 110 may use a material with low thermal expansion and low thermal contraction due to temperature changes, that is, a material with a low CTE. Furthermore, the membrane portion 110 may be made of a material that is durable and resistant to deformation, especially in the X and Y directions. Considering these factors, the metal thin film portion 111 of the membrane portion 110 may be made of a material such as Invar, Super Invar, nickel-iron alloy, nickel-cobalt alloy, nickel-iron-cobalt alloy or nickel. Alternatively, the metal thin film portion 111 may include a metal material that can be electroformed and form silicide with a silicon component of the support 30' (or conductive substrate 30', see FIG. 26), which will be described below. The metal material may include nickel (Ni), cobalt (Co), titanium (Ti), chromium (Cr), tungsten (W), molybdenum (Mo), or combinations or alloys thereof. Alternatively, the metal thin film portion 111 may include a Super Invar material in a ternary or higher-order system containing Co.

The thickness T2 of the membrane portion 110, the pitch and width W3 of the aperture patterns P and the like may be formed to the same sizes as described above with reference to FIG. 3. However, the thickness of the insulating layer portion 115 formed on the surface of the metal thin film portion 111 may be further considered. The insulating layer portion 115 may be formed to have a thickness less than approximately 5 μm. Considering this factor, the thickness T2 of the membrane portion 110 is derived by taking into account the thickness T3 of the metal thin film portion 111 and the thickness T4 of the insulating layer portion 115. Additionally, the width W2 of the aperture pattern P of the membrane portion 110 may be derived by taking into consideration the width W3 of the aperture pattern of the metal thin film portion and the width W4 of the insulating layer portion 115.

Since the metal thin film portion 111 is made of a conductive material, there is a risk of short circuits when it comes into contact with the micro bump MB. Therefore, the surface of the metal thin film portion 111 may be coated with the insulating layer portion 115 to ensure that the surface of the membrane portion 110 exhibits insulating properties.

The formation process and materials of the electrical path portion 130 and the holder portion 150 are the same as those described above with reference to FIG. 3.

The semiconductor test device 100 (100-2) according to the second embodiment of the present invention has the advantage of a simplified manufacturing process since the basic frame of the membrane portion 110 can be composed of the metal thin film portion 111. It is easy to form the metal thin film portion 111 having fine aperture patterns P by applying processes such as photolithography and electroforming, and the process of coating the insulating layer portion 115 may also be performed easily.

Additionally, when the holder portion 150 is made from the same material as the metal thin film portion 111 or from a metal material, it has the advantage of higher adhesion, making it easier to connect each other, and it also facilitates welding.

In addition, since the membrane portion 110 (110-2) includes the metal thin film portion 111, there is an advantage in that the membrane portion 110 can be controlled by applying a magnetic force from the outside. For example, in the process of aligning the micro bumps MB of the stacked semiconductor memory 15 with the electrical path portions 130, as shown in FIG. 4, the membrane portion 110 (or the electrical path portions 130) may be controlled to make close contact with the micro bumps MB by applying a magnetic force without the need to apply physical stress, providing a unique effect. Alternatively, in the process of aligning the micro bumps MB of the stacked semiconductor memory 15 with the electrical path portions 130, a magnetic force may be applied at the same time as applying relatively less physical stress, minimizing damage to the micro bumps MB and enabling close contact with the membrane portion 110 (or the electrical path portions 130).

Meanwhile, when the holder portion 150 is made of a conductive material, connecting the holder portion 150 to a ground electrode may allow the metal thin film portion 111 to be grounded through the holder portion 150. This may prevent unintended current from passing through the metal thin film portion 111 and adversely affecting the testing of the stacked semiconductor memory 15.

Figure 11:
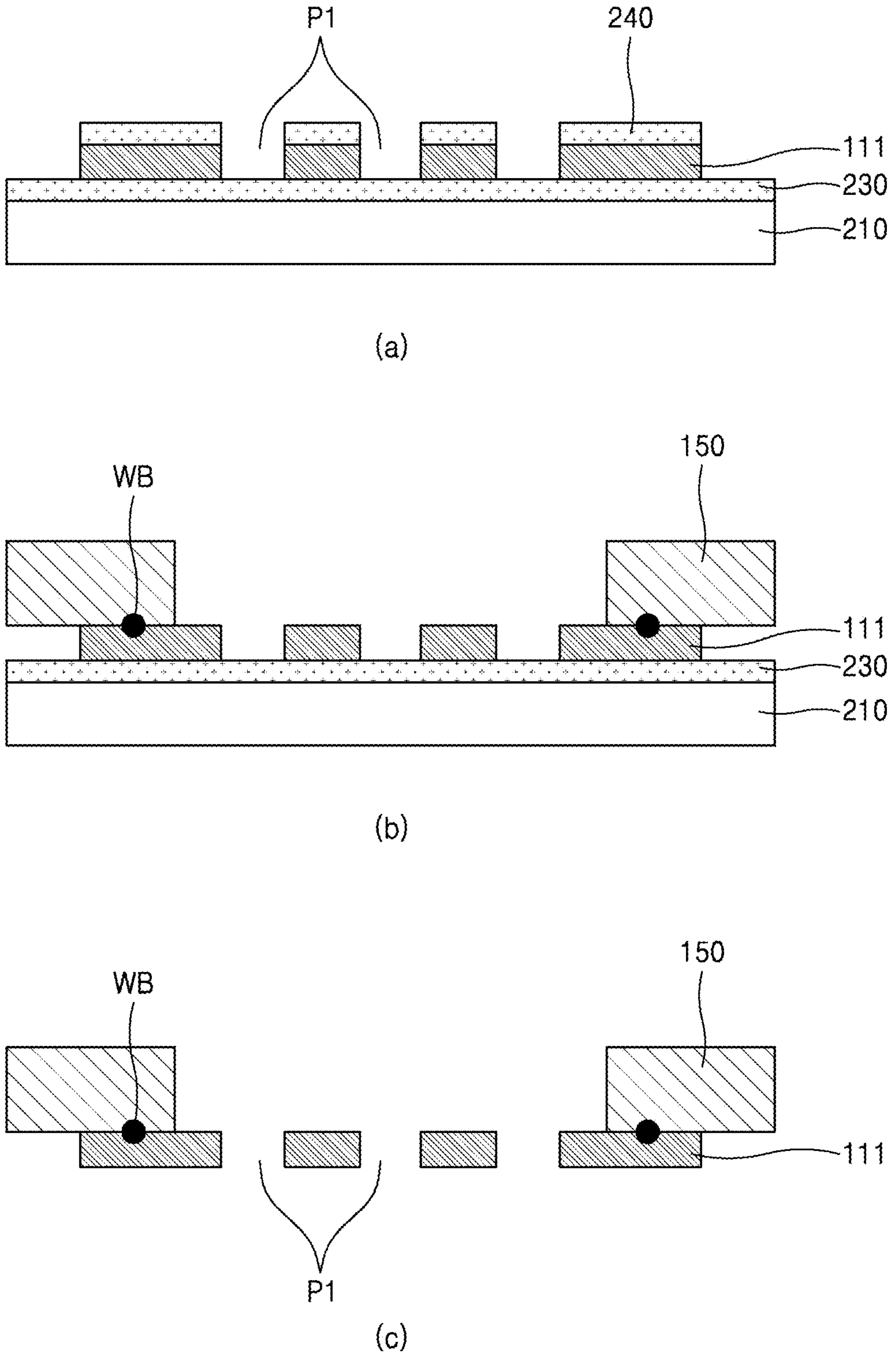
FIGS. 11 to 12 illustrate schematic diagrams showing a manufacturing process of a semiconductor test device according to still another embodiment of the present invention.
Figure 12:
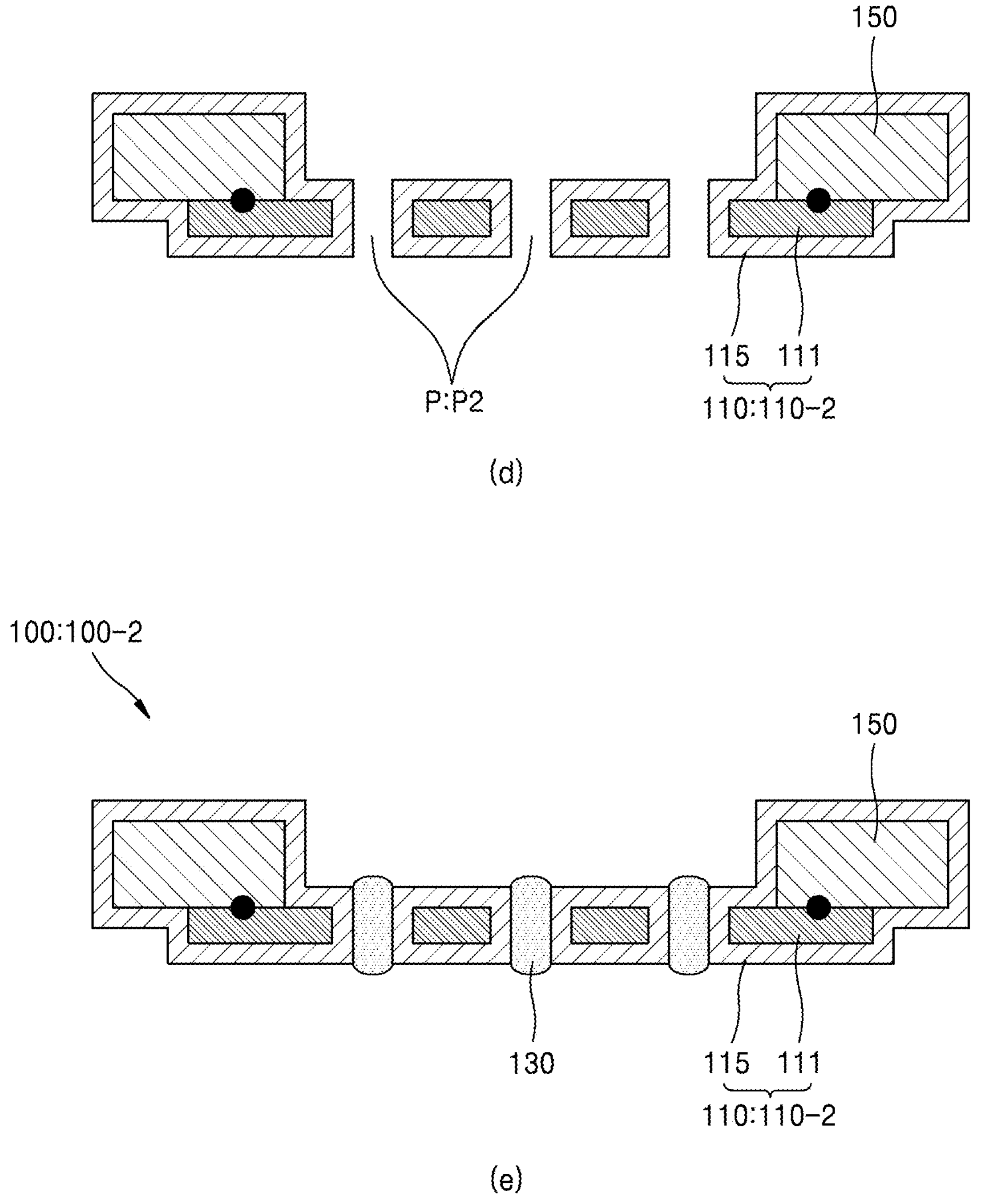

FIGS. 11 to 12 illustrate schematic diagrams showing a manufacturing process of a semiconductor test device according to still another embodiment of the present invention.

Referring to (a) of FIG. 11, a support substrate 210 may be prepared. The support substrate 210 may be made of a material such as glass, wafers, or quartz in a plate shape. Next, a temporary adhering portion 230 may be formed on the support substrate 210. The temporary adhering portion 230 may be made of a material that provides temporary adhesion and may be removed and cleaned afterward, such as dry film resist or liquid wax. Subsequently, a metal sheet may be adhered onto the temporary adhering portion 230. Afterward, a patterned etch-resistant pattern 240 may be formed on the metal sheet, and etching may be performed through a pattern of the etch-resistant pattern 240. Aperture patterns P1 may be formed on the metal sheet through etching, thereby fabricating the metal thin film portion 111.

Next, referring to (b) of FIG. 11, a holder portion 150 of the metal thin film portion 111 may be connected. The holder portion 150 may be connected to an edge portion of the membrane portion 110, where the aperture pattern P is not formed, using adhesive means or by welding. If welding is performed, a weld bead WB is formed, and the metal thin film portion 111 and the holder portion 150 may be integrally connected.

Next, referring to (c) of FIG. 11, the metal thin film portion 111 may be separated from the support substrate 210. Separation may be performed by applying heat, chemical treatment, ultrasound, or light irradiation to the temporary adhering portion 230 between the membrane portion 110 and the support substrate 210.

Next, referring to (d) of FIG. 12, an insulating layer portion 115 may be coated on the surface of the connected structure of the metal thin film portion 111 and the holder portion 150. The insulating layer portion 115 may be made of an insulating material such as polyimide, rubber, resin, Teflon, polymer, curable photoresist, inorganic insulator, or organic insulator, which is used to form the membrane portion 110 described above with reference to FIG. 3. The insulating layer portion 115 is not necessarily coated on the entire surface of the holder portion 150 as long as it is coated on the surface of the metal thin film portion 111.

The insulating layer portion 115 may be coated on the aperture patterns P1 of the metal thin film portion 111, thereby finalizing the aperture patterns P (P2) of the membrane portion 110 (110-2).

Next, referring to (e) of FIG. 12, an electrical path portion 130 may be formed within the aperture pattern P (P2). The electrical path portion 130 may be formed using various methods such as printing, deposition, sputtering, plating, or spraying without limitation. The electrical path portion 130 may be formed to be the same thickness as or thicker than the membrane portion 110. Through this process, the manufacturing of the semiconductor test device 100 (100-2), in which the membrane portion 110 (110-2) with the insulating layer portion 115 coated on the surface of the metal thin film portion 111 is connected to the holder portion 150 and the electrical path portions 130 are formed in the aperture patterns P, may be completed.

Figure 13:
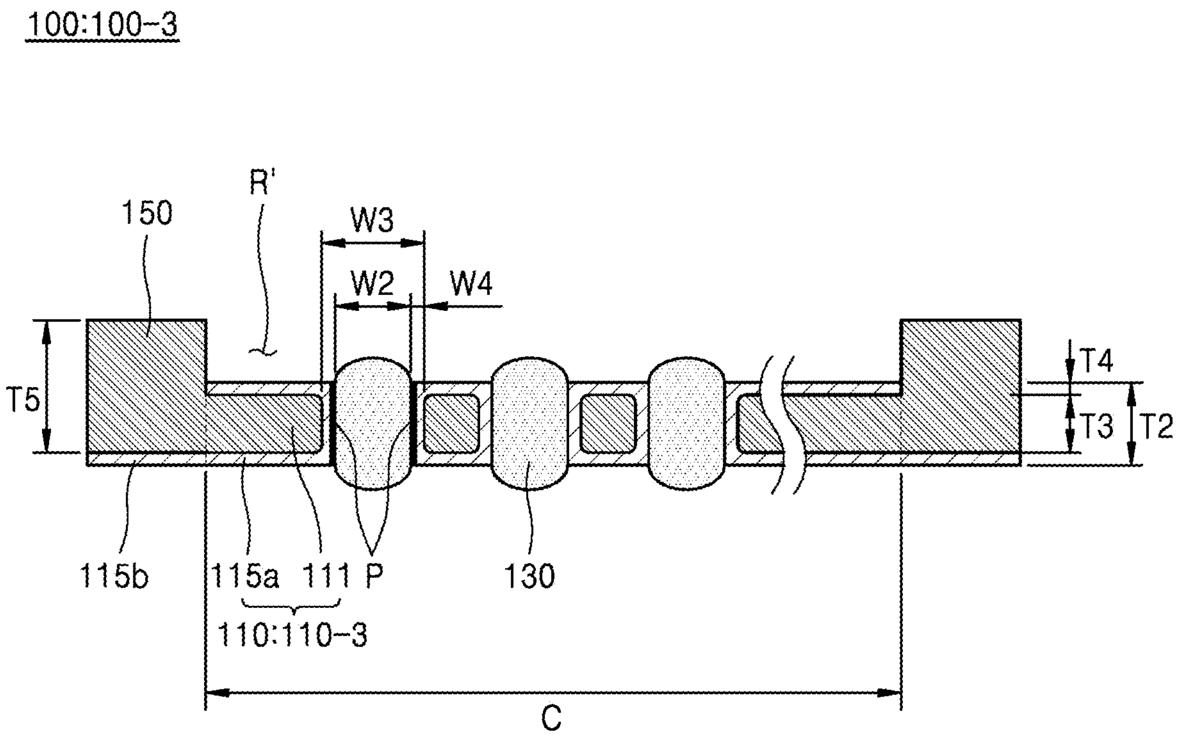
FIG. 13 illustrates a schematic diagram showing a semiconductor test device according to a third embodiment of the present invention.

FIG. 13 illustrates a schematic diagram showing a semiconductor test device according to a third embodiment of the present invention. Hereinafter, the description of components that are the same as those in the semiconductor test devices 100-1 and 100-2 of the first and second embodiments described above with reference to FIGS. 3 to 5 and FIG. 10 will be omitted, and only the differences will be described.

Referring to FIG. 13, a semiconductor test device 100 (100-3) according to the third embodiment may include a membrane portion 110 (110-3) and a holder portion 150. The membrane portion 110 may include a plurality of aperture patterns P, and an electrical connection path may be provided from the top to the bottom of each aperture pattern P. This electrical connection path may be provided through an electrical path portion 130 that includes a conductive material.

According to an embodiment, the membrane portion 110 (110-3) may include a metal thin film portion 111 and an insulating layer portion 115*a*. Each of the aperture patterns P formed in the metal thin film portion 111 may be in contact, in one-to-one correspondence, with micro bumps MB (MB2) on a lower portion of a stacked semiconductor memory 15.

The membrane portion 110 should be able to accommodate the formation of a plurality of aperture patterns P at a level of several to several tens of micrometers. Additionally, the membrane portion 110 may use a material with low thermal expansion and low thermal contraction due to temperature changes, that is, a material with a low CTE. Furthermore, the membrane portion 110 may be made of a material that is durable and resistant to deformation, especially in the X and Y directions. Considering these factors, the metal thin film portion 111 of the membrane portion 110 may be made of a material such as Invar, Super Invar, nickel-iron alloy, nickel-cobalt alloy, nickel-iron-cobalt alloy, or nickel. Alternatively, the metal thin film portion 111 may include a metal material that can be electroformed and form silicide with a silicon component of the support 30' (or conductive substrate 30', see FIG. 26), which will be described below. The metal material may include nickel (Ni), cobalt (Co), titanium (Ti), chromium (Cr), tungsten (W), molybdenum (Mo), or combinations or alloys thereof. Alternatively, the metal thin film portion 111 may include a Super Invar material in a ternary or higher-order system containing Co.

The thickness T2 of the membrane portion 110, the pitch and width W3 of the aperture patterns P, and the like may be formed to the same sizes as described above with reference to FIG. 10. The thickness T2 of the membrane portion 115 is derived by taking into account the thickness T3 of the metal thin film portion 110 and the thickness T4 of the insulating layer portion 111. Additionally, the width W2 of the aperture pattern P of the membrane portion 110 may be derived by taking into consideration the width W3 of the aperture pattern of the metal thin film portion and the width W4 of the insulating layer portion 115.

Since the metal thin film portion 111 is made of a conductive material, there is a risk of short circuits when it comes into contact with the micro bump MB. Therefore, the surface of the metal thin film portion 111 may be coated with the insulating layer portion 115 (115*a*) to ensure that the surface of the membrane portion 110 exhibits insulating properties. The insulating layer portion 115 (115*b*) may also be formed on the surface of the holder portion 150, but it is not necessarily formed on the surface of the holder portion 150 if the purpose is to insulate the holder portion 150 without making contact with the micro bumps MB. In this specification, it is assumed that the insulating layer portion 115 (115*b*) is formed at least on the lower surface of the holder portion 150 to enhance insulation from a lower interposer 13' (see FIG. 5).

The formation process and material of the electrical path portion 130 are the same as those described above with reference to FIG. 3.

The semiconductor test device 100 (100-3) according to the third embodiment is characterized by the holder portion 150 being integrally connected to the metal thin film portion 111. Here, "integrally connected" means that the metal thin film portion 111 and the holder portion 150 are not connected through adhesive means but are understood to be connected as a single body made from the same material. The metal thin film portion 111 and the holder portion 150 can be understood as specific portions of the metal sheet 105, which will be described below with reference to FIG. 13, where a certain part is removed, with one part being referred to as the metal thin film portion 111 and the remaining part as the holder portion 150.

Since the metal thin film portion 111 and the holder portion 150 are derived from the same raw material, they may be made of the same metal material. The metal thin film portion 111 and the holder portion 150 may be made from a material with a low CTE to prevent thermal deformation, such as Invar, Super Invar, nickel-iron alloy, nickel-cobalt alloy, or nickel-iron-cobalt alloy.

For example, the thickness T5 of the holder portion 150 may correspond to the thickness of the raw material, the metal sheet 210, ranging from 150 μm to 1,000 μm. The membrane portion 110 (110-3) may be derived by subtracting the thickness of a hollow region R' from the holder portion 150. For example, the thickness T2 of the membrane portion 110 may be approximately 5 μm to 50 μm.

The semiconductor test device 100 (100-3) according to the third embodiment of the present invention has the advantage of a simplified manufacturing process since the basic frame of the membrane portion 110 (110-3) can be composed of the metal thin film portion 111. Moreover, because the metal thin film portion 111 and the holder portion 150 can be simultaneously formed from a single raw material through a simple process without the need for a separate process for connecting them, the manufacturing process becomes even simpler. It is easy to form the holder portion 150 having the hollow region R' and the metal thin film portion 111 having fine aperture patterns P by applying processes such as photolithography and electroforming, and the process of coating the insulating layer portion 115 may also be performed easily.

Additionally, since the metal thin film portion 111 and the holder portion 150 are integrally formed from the same metal material, there is a significant advantage in that the likelihood of the metal thin film portion 111 and the holder portion 150 misaligning or deforming is extremely low.

Furthermore, as the membrane portion 110 (110-3) includes the metal thin film portion 111, it has the same advantage described above with reference to FIG. 10, where the membrane portion 110 can be controlled by applying a magnetic force from the outside.

Meanwhile, since the holder portion 150 is made of a conductive material, the metal thin film portion 111 may be grounded through the holder portion 150 by connecting the holder portion 150 to a ground electrode. The metal thin film portion 111 may be directly connected to a ground electrode for grounding. This may prevent unintended current from passing through the metal thin film portion 111 and adversely affecting the testing of the stacked semiconductor memory 15. It also minimizes the impact on adjacent micro bumps MB due to induced current, leakage current, or crosstalk in the metal thin film portion 111. Of course, the insulating layer portion 115 may be coated over all surfaces of the metal thin film portion 111 and the holder portion 150 to implement insulation in areas other than the electrical path portion 130.

Figure 14:
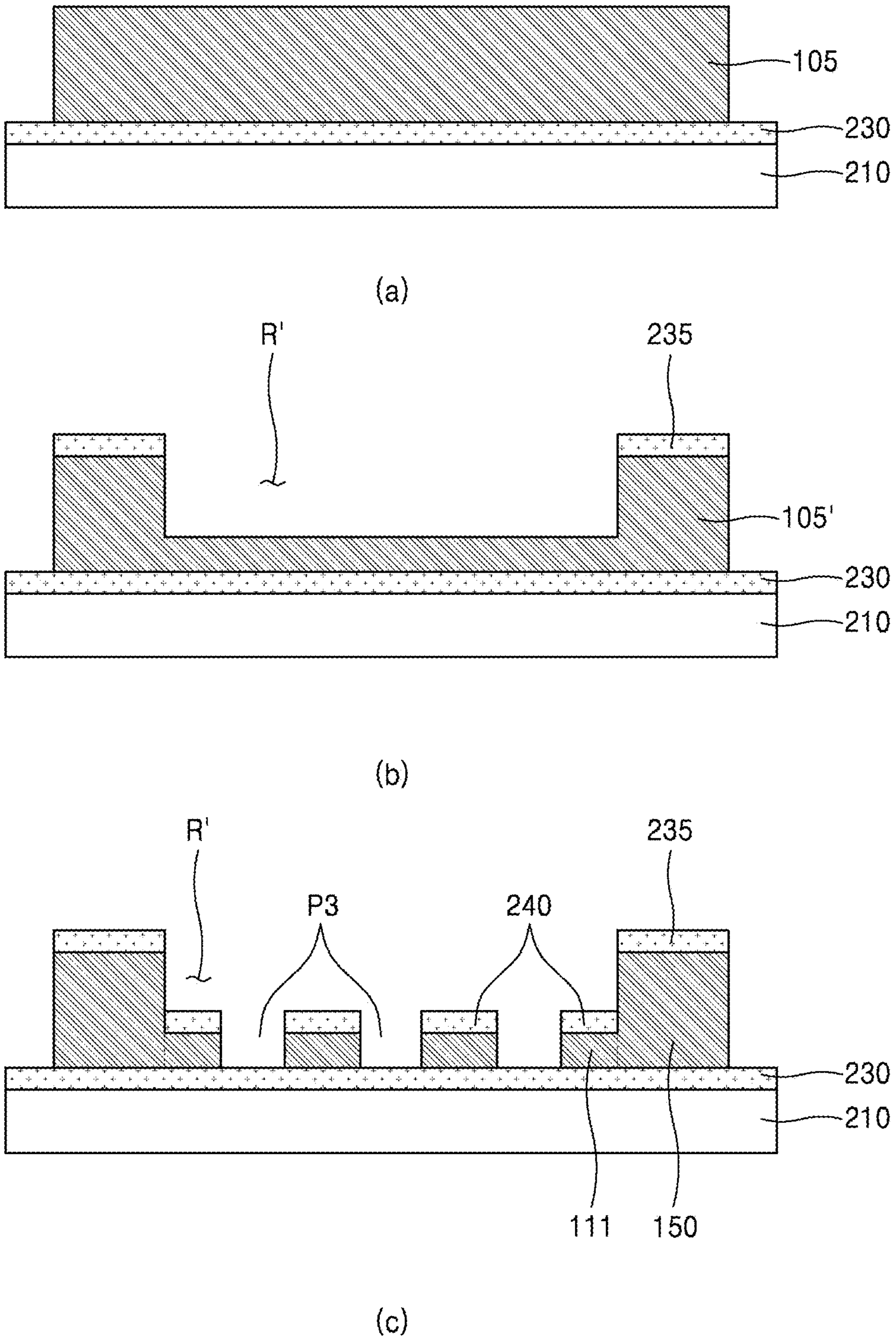
FIGS. 14 to 15 illustrate schematic diagrams showing a manufacturing process of the semiconductor test device according to the third embodiment of the present invention.
Figure 15:
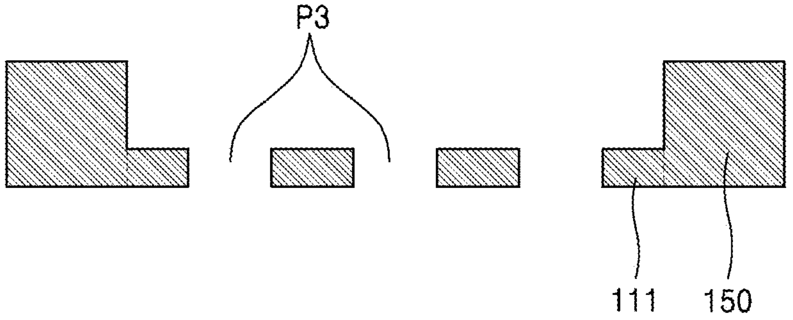
Figure 15:
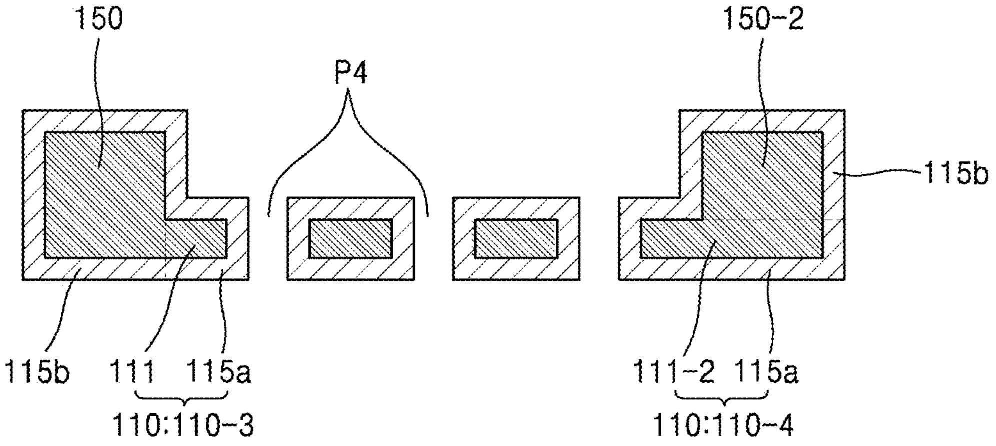
Figure 15:
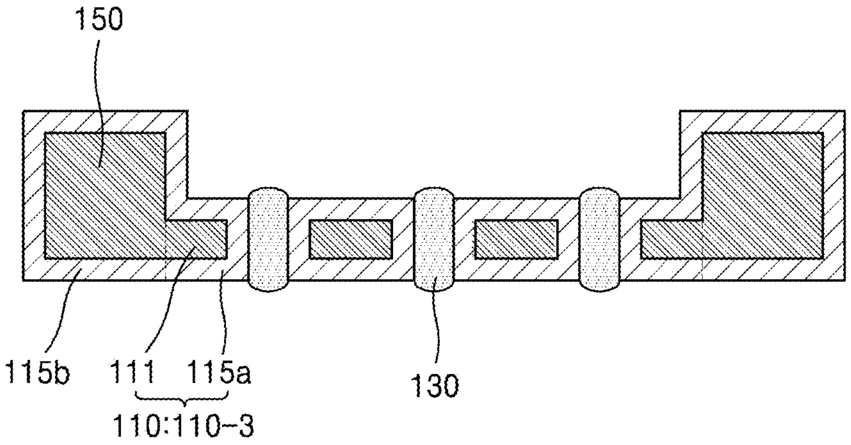

FIGS. 14 to 15 illustrate schematic diagrams showing a manufacturing process of the semiconductor test device according to the third embodiment of the present invention. Hereinafter, the description of components that are the same as those in the semiconductor test device of the second embodiment described above with reference to FIGS. 11 to 12 will be omitted, and only the differences will be described.

Referring to (a) of FIG. 14, a support substrate 210 may be prepared. Next, a temporary adhering portion 230 may be formed on the support substrate 210. Subsequently, a metal sheet 105 may be adhered onto the temporary adhering portion 230.

Next, referring to (b) of FIG. 14, the thickness of the upper surface of the metal sheet 105 may be reduced. Methods such as touch polishing, dry etching, wet etching, and the like may be used without limitation for the thickness reduction. For example, an etch-resistant pattern 235 may be formed on the upper surface of the metal sheet 105 except for the portion where a cell portion C will be formed and then etching may be performed on an exposed part of the metal sheet 105 to reduce its thickness. As a result of the thickness reduction in the central part of the metal sheet 105 where the cell portion C will be formed, a hollow region R' may be created.

Next, referring to (c) of FIG. 14, a patterned etch-resistant pattern 240 may be formed on the hollow region R' of the metal sheet 105', and etching may be performed through a pattern of the etch-resistant pattern 240. Aperture patterns P3 may be formed by etching the exposed portions of the metal sheet 105' between the patterns of the etch-resistant pattern 240, thereby fabricating the metal thin film portion 111.

The thin portion with the aperture patterns P3 formed may be provided as the metal thin film portion 111, while the thicker portion that is integrally connected to the edge of the metal thin film portion 111 may be provided as the holder portion 150.

Next, referring to (d) of FIG. 15, the metal thin film portion 111 and the holder portion 150 may be separated from the support substrate 210. Separation may be performed by applying heat, chemical treatment, ultrasound, or light irradiation to the temporary adhering portion 230 between the membrane portion 110 and the support substrate 210. Cleaning of the etch-resistant patterns 235 and 240 may also be performed.

Since the thickness T5 of the holder portion 150 is thicker than the thickness T3 of the metal thin film portion 111, the holder portion 150 has higher rigidity and may support the metal thin film portion 111 in both the vertical and lateral directions. In addition, the metal thin film portion 111 is connected to the holder portion 150 along its entire perimeter. As a result, tensile force may be uniformly transmitted to the entire perimeter of the metal thin film portion 111 without the need to apply tensile force outward along the entire edge of the holder portion 150. In other words, even if tensile force is applied to specific points of the holder portion 150, the tensile force does not act solely at those specific points on the metal thin film portion 111 but is instead uniformly distributed along the perimeter of the metal thin film portion 111 surrounding those points. Ultimately, this provides the advantage of allowing the metal thin film portion 111 to be evenly stretched taut by controlling only the holder portion 150 to achieve a uniform and fine distribution of tensile force along the perimeter of the metal thin film portion 111.

Next, referring to (e) of FIG. 15, the insulating layer portion 115 (115*a* and 115*b*) may be coated on the surface of the connected structure of the metal thin film portion 111 and the holder portion 150. The insulating layer portion 115 may be made of an insulating material such as polyimide, rubber, resin, Teflon, polymer, curable photoresist, inorganic insulator, or organic insulator, which is used to form the membrane portion 110 described above with reference to FIG. 3. The insulating layer portion 115 is not necessarily coated on the entire surface of the holder portion 150 as long as it is coated on the surface of the metal thin film portion 111.

Meanwhile, the dotted-line area on the right side of (e) of FIG. 15 delineates a membrane portion 110 (110-4) according to another embodiment. Referring to the dotted-line area, the membrane portion 110 (110-4) may be configured with a metal thin film portion 111-2 and an insulating layer 115*a* on the lower portion of the holder portion 150-2, rather than the side of the holder portion 150. The holder portion 150-2 may be integrally connected to the membrane portion 110-4, and the insulating layer 115*a* may be coated on the surface of the metal thin film portion 111-2.

The insulating layer portion 115 may be coated on the aperture patterns P3 of the metal thin film portion 111, thereby finalizing the aperture patterns P (P4) of the membrane portion 110 (110-3).

Next, referring to (f) of FIG. 15, an electrical path portion 130 may be formed within the aperture pattern P (P4). Through this process, the manufacturing of the semiconductor test device 100 (100-3), in which the metal thin film part 111 and the holder portion 150 are integrally connected as a single body made from the same material, may be completed.

Figure 16:
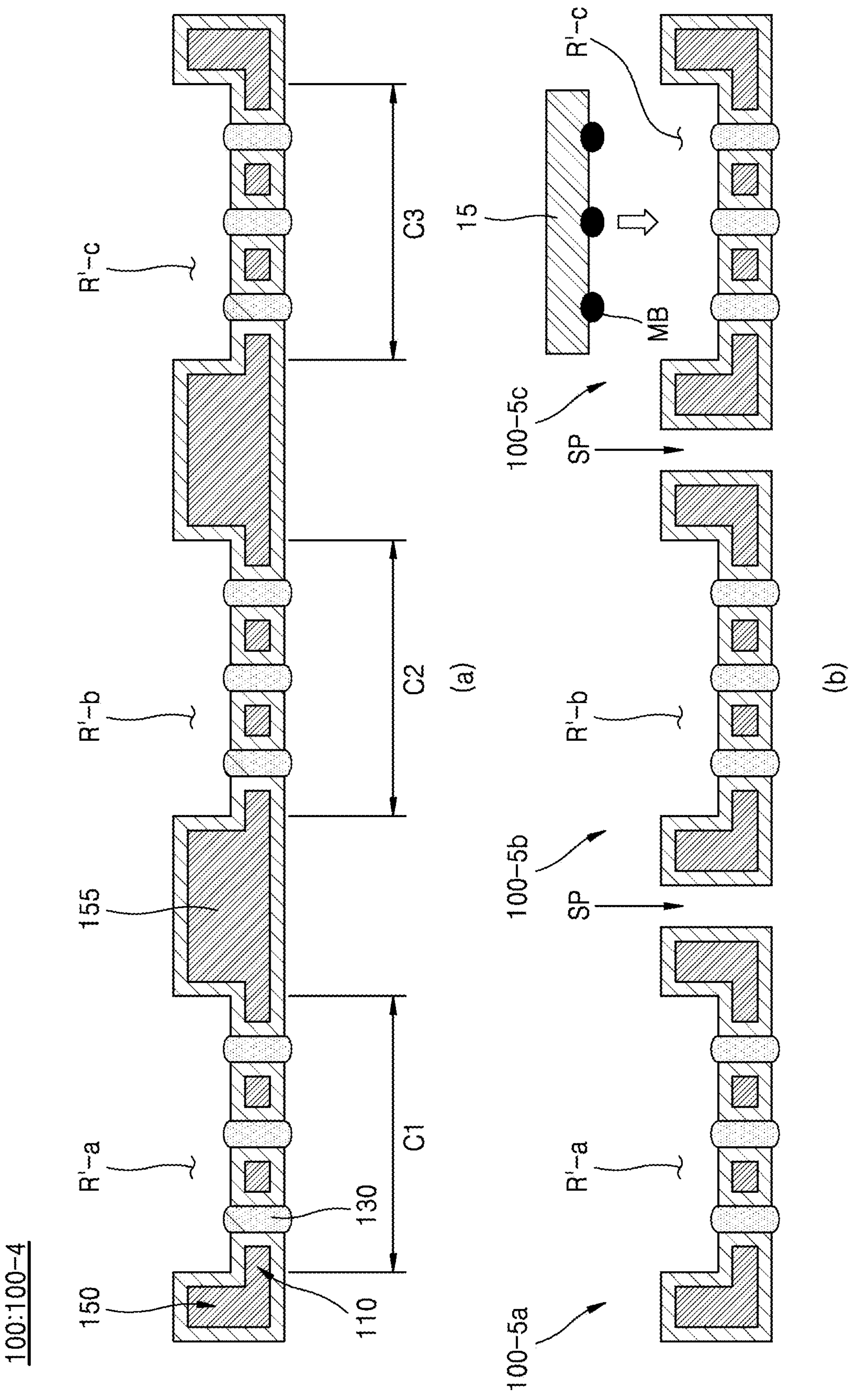
FIGS. 16 to 17 illustrate schematic diagrams showing the forms of semiconductor test devices according to fourth to sixth embodiments of the present invention.
Figure 17:
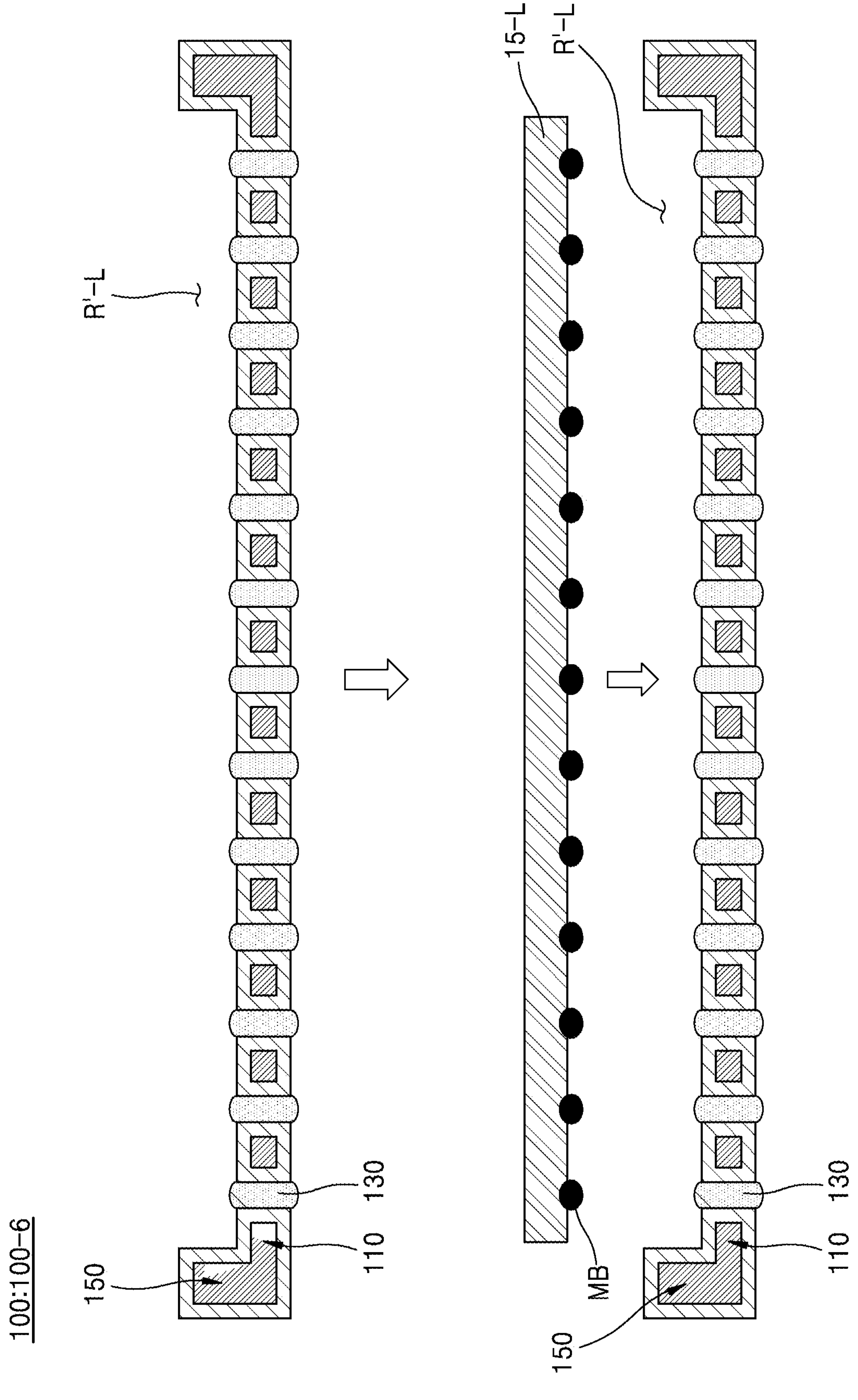

FIGS. 16 and 17 illustrate schematic diagrams showing the forms of semiconductor test devices 100 (100-4 to 100-6) according to fourth to sixth embodiments of the present invention.

Referring to (a) of FIG. 16, a semiconductor test device 100 (100-4) may provide a plurality of hollow regions R (R'-a, R'-b, and R'-c) (or a plurality cell portions C1, C2, and C3). The plurality of hollow regions R may be arranged in the X-axis and Y-axis directions on the horizontal plane.

The size (horizontal area) of each hollow region R' (R'-a, R'-b, and R'-c) may correspond to the size of a single stacked semiconductor memory 15, which is several millimeters to several tens of millimeters in width and height. In addition to a holder portion 150 being disposed at the edge of the semiconductor test device 100 (100-4) to partition each hollow region R', grid portions 155 with a thickness corresponding to the holder portion 150 may be formed in the central part of the semiconductor test device 100 (100-4), dividing the hollow region R' into multiple sections. As a result, the semiconductor test device 100 (100-4) may test multiple stacked semiconductor memories 15 simultaneously.

In another example, referring to (b) of FIG. 16, cutting SP may be performed on the semiconductor test device 100 (100-4) shown in (a) of FIG. 16. Through this cutting SP, the semiconductor test device 100 (100-4) may be divided into multiple semiconductor test devices 100 (100-5*a*, 100-5*b*, and 100-5*c*). Each of the semiconductor test devices 100 (100-5*a*, 100-5*b*, and 100-5*c*) may be used to test a stacked semiconductor memory 15. Therefore, the present invention has the advantage of enabling the mass production of multiple semiconductor test devices 100 (100-5*a*, 100-5*b*, and 100-5*c*).

In another example, referring to FIG. 17, the size (horizontal area) of a hollow region R' (R'-L) of a semiconductor test device 100 (100-6) may have an area corresponding to a stacked semiconductor memory 15-L that includes a plurality of cells/a plurality of dies. Alternatively, the size of the hollow region R' (R'-L) may correspond to the size of a silicon wafer or be larger than that. Therefore, the present invention has the advantage of providing a semiconductor test device 100 (100-6) capable of performing tests for stacked semiconductor memories of various sizes.

Figure 18:
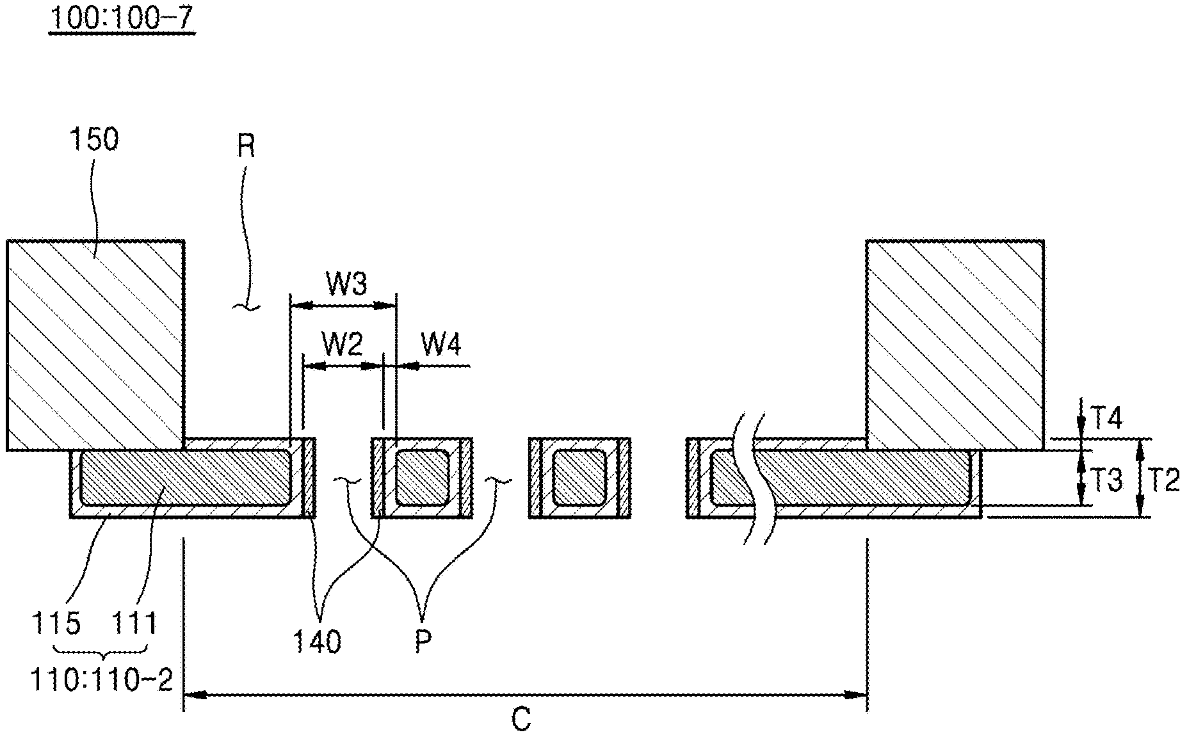
FIG. 18 illustrates a schematic diagram showing a semiconductor test device according to a seventh embodiment of the present invention.
Figure 19:
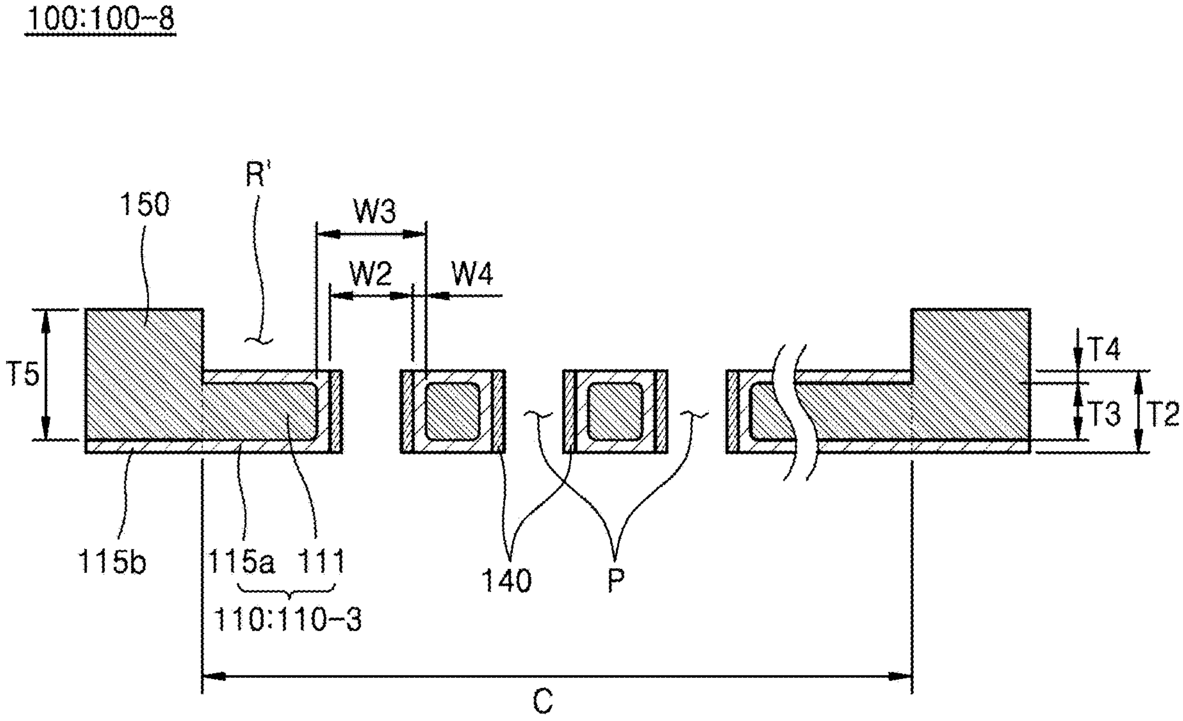
FIG. 19 illustrates a schematic diagram showing a semiconductor test device according to an eighth embodiment of the present invention.

FIG. 18 illustrates a schematic diagram showing a semiconductor test device according to a seventh embodiment of the present invention. FIG. 19 illustrates a schematic diagram showing a semiconductor test device according to an eighth embodiment of the present invention. Hereinafter, the description of components that are the same as those in the semiconductor test devices 100-1, 100-2, and 100-3 of the first, second, and third embodiments described above with reference to FIGS. 3 to 5, FIG. 10, and FIG. 13 will be omitted, and only the differences will be described.

Referring to FIG. 18, a semiconductor test device 100 (100-7) according to the seventh embodiment may include a membrane portion 110 (110-2) and a holder portion 150. The membrane portion 110 may include a plurality of aperture patterns P, and an electrical connection path may be provided from the top to the bottom of each aperture pattern P. This electrical connection path may be provided through a conductive thin film layer 140 formed on the side surfaces of the aperture pattern P.

According to an embodiment, the membrane portion 110 (110-2) may include a metal thin film portion 111 and an insulating layer portion 115. Each of the aperture patterns P formed in the metal thin film portion 111 may correspond one-to-one to micro bumps MB (MB2) on the lower portion of the stacked semiconductor memory 15. The conductive thin film layer 140 formed on the insulating layer portion 115 within the aperture pattern P (or on the side of the aperture pattern P) may make contact with the micro bump MB. The material, size, and the like of the membrane portion 110 may be the same as those of the membrane portion 110 described above with reference to FIG. 10.

The semiconductor test device 100 (100-7) according to the seventh embodiment is characterized by including the conductive thin film layer 140 formed on the side surfaces of the aperture pattern P, instead of the electrical path portion 130 filled in the aperture pattern P. The conductive thin film layer 140 may be formed entirely along the side of the aperture pattern P and may provide electrical connection from the top to the bottom of the aperture pattern P.

The conductive thin film layer 140 may include a conductive material. Preferably, the conductive thin film layer 140 may include a material with excellent conductivity and low resistance, such as Cu, Ag, Au, Pt, Sn or Pd. The conductive thin film layer 140 is formed by deposition, sputtering, or similar processes, and is preferably formed as a thin film of approximately 1 nm to 1 μm thick, so as not to affect the width of the aperture pattern P.

Referring to FIG. 19, a semiconductor test device 100 (100-8) according to the eighth embodiment may include a membrane portion 110 (110-3) and a holder portion 150. The membrane portion 110 may include a plurality of aperture patterns P, and an electrical connection path may be provided from the top to the bottom of each aperture pattern P. This electrical connection path may be provided through a conductive thin film layer 140 formed on the side surfaces of the aperture pattern P.

According to an embodiment, the membrane portion 110 (110-3) may include a metal thin film portion 111 and an insulating layer portion 115*a*.

The semiconductor test device 100 (100-8) according to the eighth embodiment may have the holder portion 150 integrally connected to the metal thin film portion 111. Here, "integrally connected" means that the metal thin film portion 111 and the holder portion 150 are not connected through adhesive means but are understood to be connected as a single body made from the same material.

Additionally, similar to the seventh embodiment, the semiconductor test device 100 (100-8) according to the eighth embodiment is characterized by including a conductive thin film layer 140 formed on the side surfaces of the aperture pattern P instead of the electrical path portion 130 filled in the aperture pattern P. The conductive thin film layer 140 may be formed entirely along the side of the aperture pattern P and may provide electrical connection from the top to the bottom of the aperture pattern P.

Meanwhile, similar to the first embodiment described above with reference to FIG. 3, an embodiment may also be provided in which a membrane portion 110 (110-1) and a holder portion 150 are included and a conductive thin film layer 140 is formed on the side surface of each aperture pattern P formed in the insulating membrane portion 110 (110-1).

Figure 20:
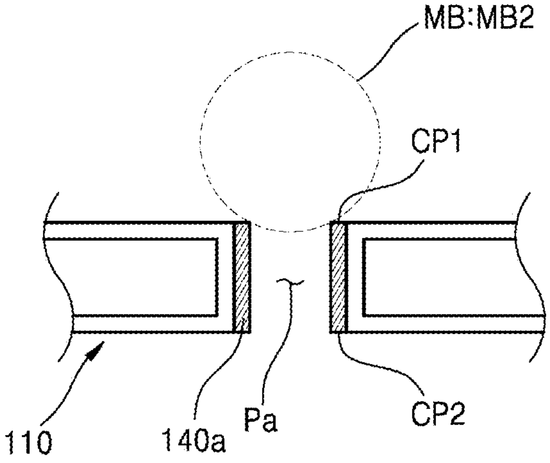
FIGS. 20 and 21 illustrate schematic side cross-sectional views showing the forms of aperture patterns and conductive thin film layers according to various embodiments of the present invention.
Figure 20:
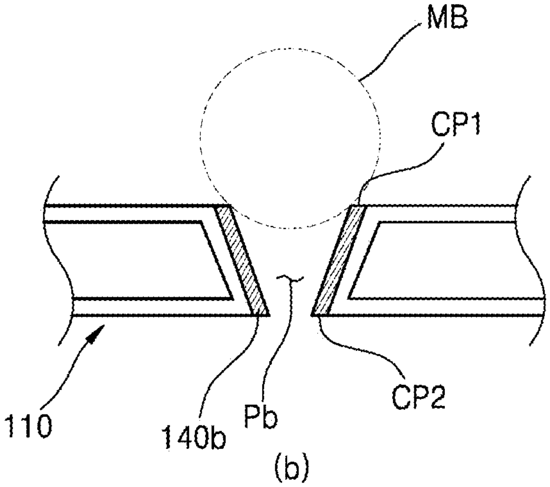
Figure 20:
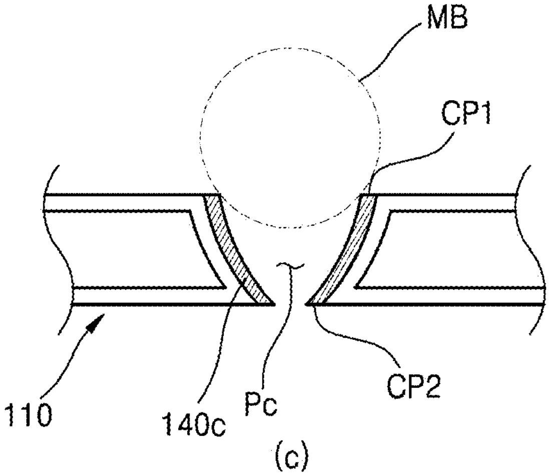
Figure 21:
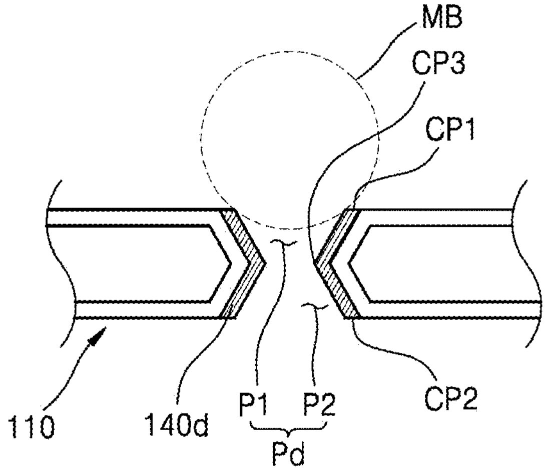
Figure 21:
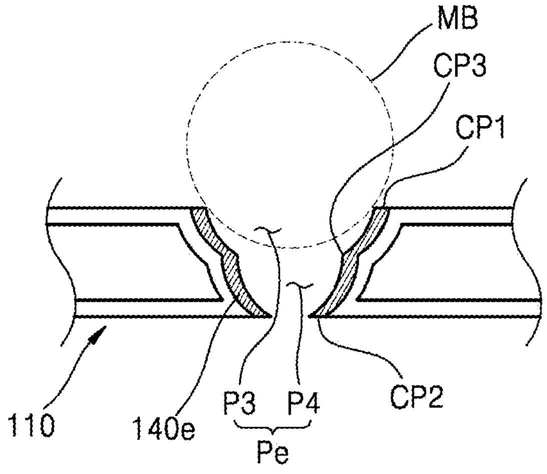
Figure 21:
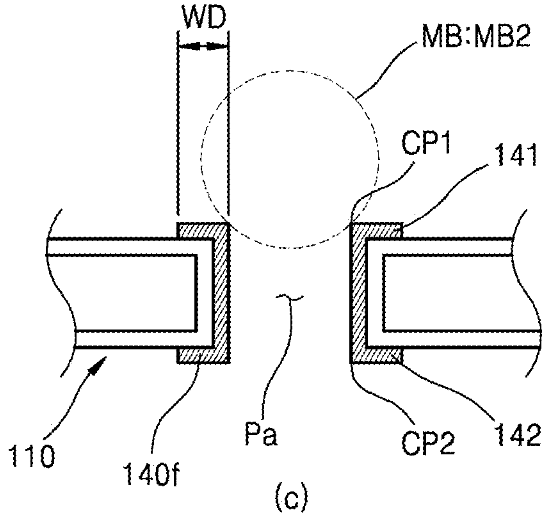

FIGS. 20 and 21 illustrate schematic side cross-sectional views showing the forms of aperture patterns and conductive thin film layers according to various embodiments of the present invention.

Referring to FIGS. 20 and 21, various forms of aperture patterns P (Pa to Pe) and conductive thin film layers 140*a* to 140*f* that can make contact with micro bumps MB (MB2) on the lower portion of a stacked semiconductor memory 15 may be proposed.

Referring to (a) of FIG. 20, a vertical aperture pattern Pa and a conductive thin film layer 140*a* formed on its side may be provided. Since the conductive thin film layer 140*a* may also be formed in a vertical direction, the width of the aperture pattern Pa extending from an upper edge CP1 to a lower edge CP2 may remain constant. The micro bump MB (MB2) may be in contact with the upper edge CP1.

Referring to (b) and (c) of FIG. 20, overall reverse taper-shaped aperture patterns Pb and Pc and conductive thin film layers 140*b* and 140*c* formed on their sides may be provided. In (c) of FIG. 20, for example, as a result of isotropic etching such as wet etching, the side of the aperture pattern Pc may exhibit a concave curvature. The conductive thin film layers 140*b* and 140*c* are formed such that the width of the aperture patterns Pb and Pc decreases from the upper edge CP1 to the lower edge CP2. The micro bump MB may be in contact with the upper edge CP1. In this process, at least part of the approximately spherical-shaped micro bump MB may be accommodated within the reverse taper-shaped aperture patterns Pb and Pc. The micro bump MB may be guided along the side surfaces of the aperture patterns Pb and Pc and come into contact with the conductive thin film layers 140*b* and 140*c*. As a result, there is an effect of providing stable contact with a plurality of micro bumps MB. In addition, regardless of the diameter of the micro bumps MB, a portion may be accommodated within the aperture patterns Pb and Pc, guiding contact with the conductive thin film layers 140*b* and 140*c*.

Referring to (a) of FIG. 21, the width of the aperture pattern Pd decreases from the upper edge CP1 to a middle edge CP3 and then increases from the middle edge CP3 to the lower edge CP2. (a) of FIG. 21 may be the result of, for example, performing wet etching on each of the upper and lower surfaces, allowing an upper pattern P1 and a lower pattern P2 to communicate with each other to form the aperture pattern Pd. The micro bump MB may be guided along a side reverse tapered from the upper edge CP1 to the middle edge CP3 of the aperture pattern Pd and make contact with the conductive thin film layer 140*d*. Additionally, there is the advantage that the connection electrode CE of the test interposer 13' (see (b) of FIG. 4) or other elements may be guided from the lower part of the aperture pattern Pd along the side tapered from the lower edge CP2 to the middle edge CP3 and make contact with the conductive thin film layer 140*d*.

Referring to (b) of FIG. 21, an aperture pattern Pe with an overall reverse-taper shape is provided, wherein the aperture pattern Pe has a two-step concave curvature shape from the upper edge CP1 to the middle edge CP3, and from the middle edge CP3 to the lower edge CP2. (b) of FIG. 21 may be the result of, for example, performing a first wet etching on the upper surface to form an upper pattern P3, followed by a second wet etching on the same upper surface to form a lower pattern P4, which then communicates with the upper pattern P3 to form the aperture pattern Pe. Similar to (b) and (c) of FIG. 20, at least part of the approximately spherical-shaped micro bump MB may be accommodated within the reverse-tapered aperture pattern Pe, allowing stable contact with a conductive thin film layer 140*e*.

Referring to (c) of FIG. 21, in addition to the formation of a conductive thin film layer 140*f* on the side of the aperture pattern Pa, additional conductive thin film layers 141 and 142 may be further formed around the upper and lower parts of the aperture pattern Pa. Specifically, the conductive thin film layers 141 and 142 may be formed horizontally on the upper surface of the membrane portion 110 from the upper edge CP1 of the aperture pattern Pa and on the lower surface of the membrane portion 110 from the lower edge CP2. The width WP of the conductive thin film layers 141 and 142 formed in the horizontal direction is preferably within a range that does not affect neighboring aperture patterns Pa. For example, the width WP of the conductive thin film layers 141 and 142 formed in the horizontal direction may be 50% or less (greater than 0) of the width of the aperture pattern Pa.

Since not only the conductive thin film layer 140*f* formed on the side surfaces of the aperture pattern Pa but also the additional conductive thin film layers 141 and 142 formed horizontally on the upper and lower surfaces of the membrane 110 are included, the contact stability with the micro bump MB can be improved. This is particularly effective in enhancing the contact stability with various types of micro bumps MB, in addition to spherical-shaped micro bumps MB.

Figure 22:
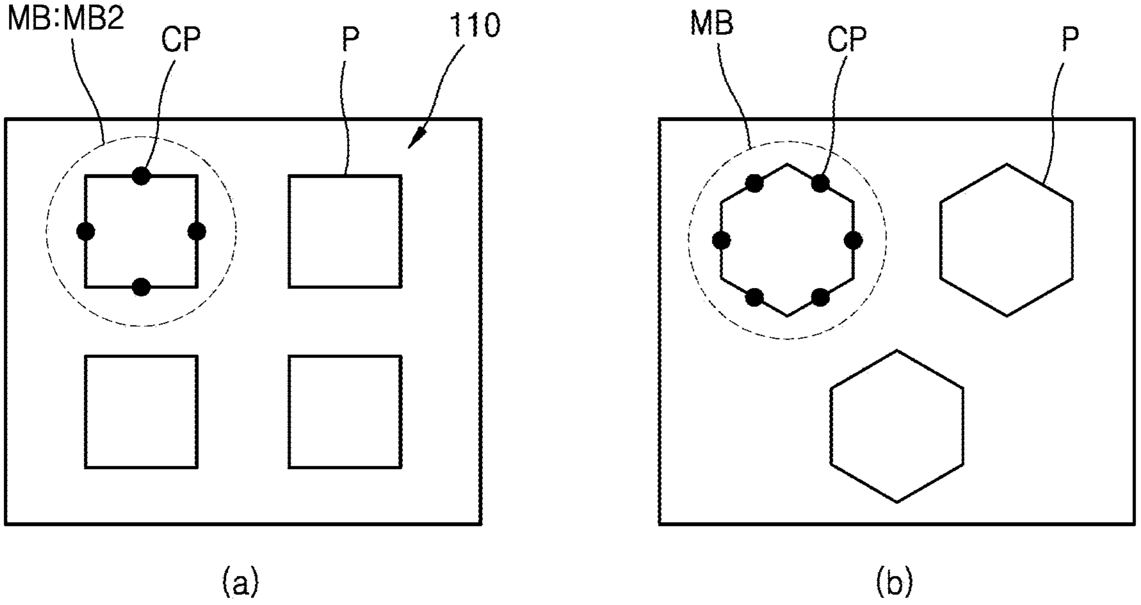
FIG. 22 illustrates a schematic plan view showing contact forms between aperture patterns and micro bumps according to various embodiments of the present invention.

FIG. 22 illustrates a schematic plan view showing contact forms between aperture patterns and micro bumps according to various embodiments of the present invention.

When viewed from a planar direction (upper surface direction), the shape of an aperture pattern P may be rectangular, hexagonal, polygonal, or other shapes. Taking a spherical-shaped micro bump MB as an example, in a rectangular aperture pattern P as shown in (a) of FIG. 22, there are approximately four contact points CP, and in a hexagonal aperture pattern P as shown in (b) of FIG. 22, there are approximately six contact points CP. Because a conductive thin film layer 140 is formed along the edge of the aperture pattern P, an electrical connection path may be established to the bottom of the aperture pattern P along the contact points CP. Even if slight misalignment occurs, as long as a contact point CP is formed at least at one location, an electrical connection can be made, which is advantageous for forming a stable electrical connection path.

Figure 23:
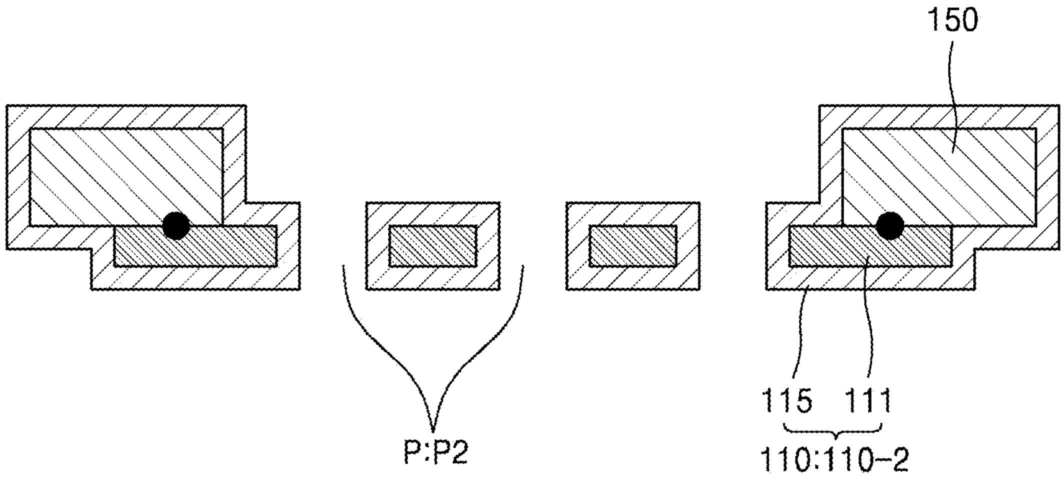
FIG. 23 illustrates schematic diagrams showing a manufacturing process of the semiconductor test device according to the seventh embodiment of the present invention.
Figure 23:
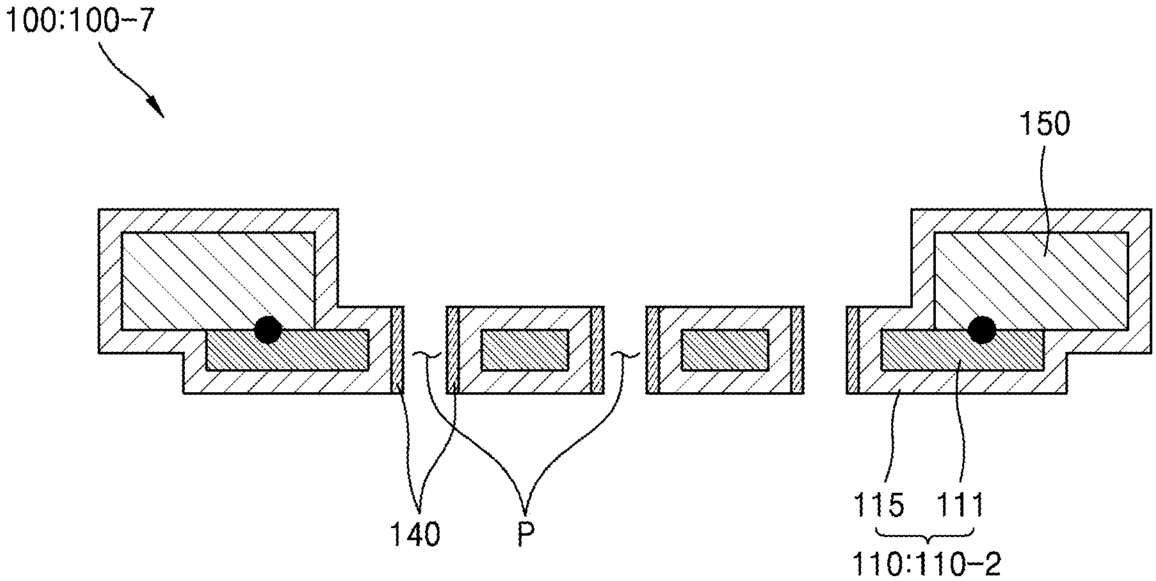

FIG. 23 illustrates schematic diagrams showing a manufacturing process of the semiconductor test device according to the seventh embodiment of the present invention. The description of components that are the same as those in the semiconductor test device of the second embodiment described above with reference to FIGS. 11 to 12 will be omitted, and only the differences will be described.

By performing the same processes as described in (a) to (c) of FIG. 11, a connected structure of a metal thin film portion 111 and a holder portion 150 may be prepared. Next, referring to (d) of FIG. 23, an insulating layer portion 115 may be coated on the surface of the connected structure of the metal thin film portion 111 and the holder portion 150. The insulating layer portion 115 may be coated on the aperture patterns P1 of the metal thin film portion 111, thereby finalizing the aperture patterns P (P2) of the membrane portion 110 (110-2).

Next, referring to (e) of FIG. 23, a conductive thin film layer 140 may be formed on the side surfaces of the aperture pattern P (P2). The conductive thin film layer 140 may include a material with excellent conductivity and low resistance, such as Cu, Ag, Au, Pt, Sn or Pd. For example, a conductive thin film layer 140 made of Cu or Sn may be formed through sputtering, while a conductive thin film layer 140 made of Ag, Au, Pt, Sn or Pd may be formed through thermal evaporation. Additionally, methods such as printing, plating, or spraying may also be used. The thickness of the conductive thin film layer 140 may be formed to be approximately 1 μm or less. The formation of the conductive thin film layer 140 has little to no effect on the width of the aperture pattern P.

Through this process, the manufacturing of the semiconductor test device 100 (100-7), in which the membrane portion 110 (110-2) with the insulating layer portion 115 coated on the surface of the metal thin film portion 111 is connected to the holder portion 150 and the conductive thin film layer 140 is formed in the aperture pattern P, may be completed.

Meanwhile, the semiconductor test device 100 (100-8) according to the eighth embodiment shown in FIG. 19 may also be manufactured by performing the processes described in (a) of FIG. 14 to (e) of FIG. 15 and then additionally forming the conductive thin film layer 140 on the side surfaces of the aperture pattern P.

Figure 24:
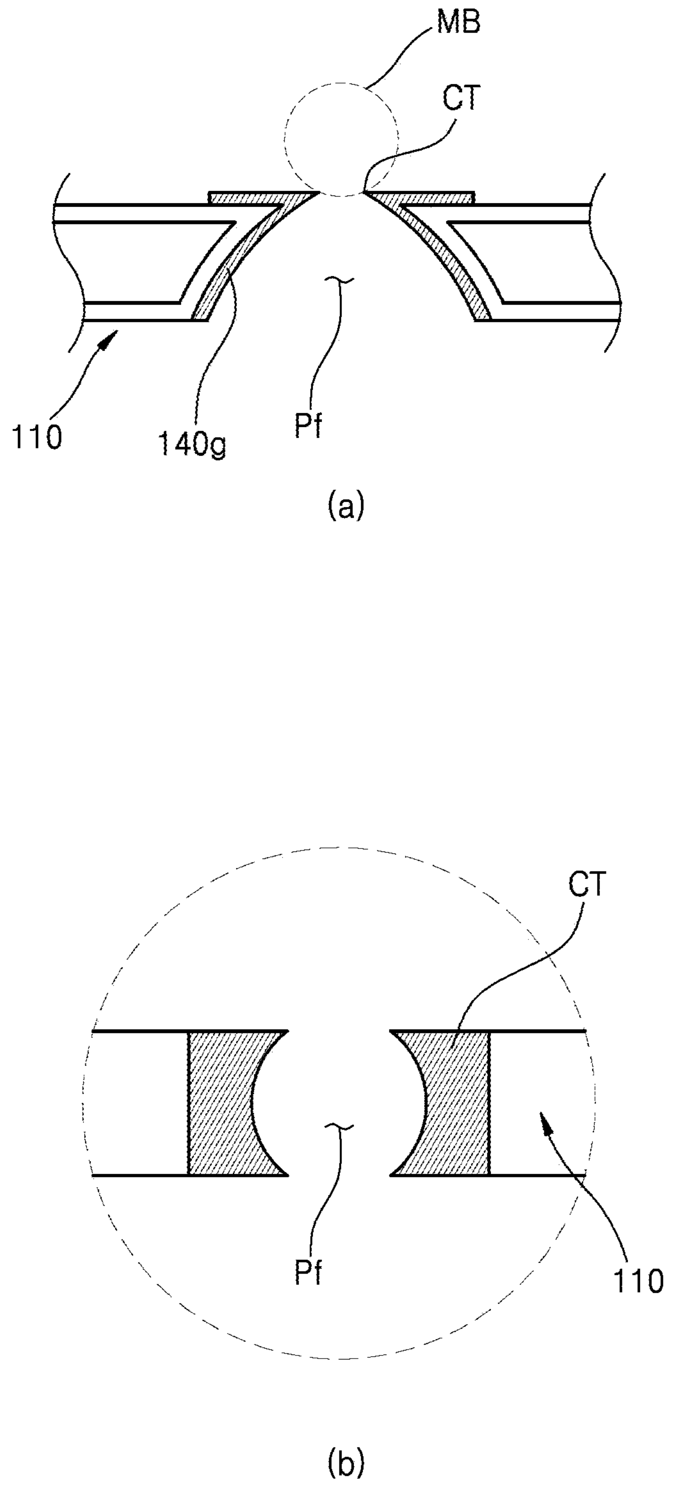
FIG. 24 illustrates (a) a schematic cross-sectional side view and (b) a schematic plan view showing a conductive cantilever portion protruding inward from an aperture pattern according to an embodiment of the present invention.

FIG. 24 illustrates (a) a schematic cross-sectional side view and (b) a schematic plan view showing a conductive cantilever portion protruding inward from an aperture pattern according to an embodiment of the present invention.

Referring to FIG. 24, a conductive thin film layer 140*g* may further include a conductive cantilever portion CT protruding inward from an aperture pattern P (Pf). The conductive cantilever portion CT may protrude in a cantilever shape. The conductive cantilever portion CT may be integrally formed at the same time as the conductive thin film layer 140*g* or through an additional process. The conductive cantilever portion CT may be thinner than the thickness of the membrane portion and protrude from the aperture pattern P, allowing for elastic contact with a micro bump MB. For example, as shown in (b) of FIG. 24, the conductive cantilever portion CT may provide a rounded shape to the aperture pattern P (Pf), allowing the surface of the micro bump MB to naturally rest on the conductive cantilever portion CT.

Figure 25:
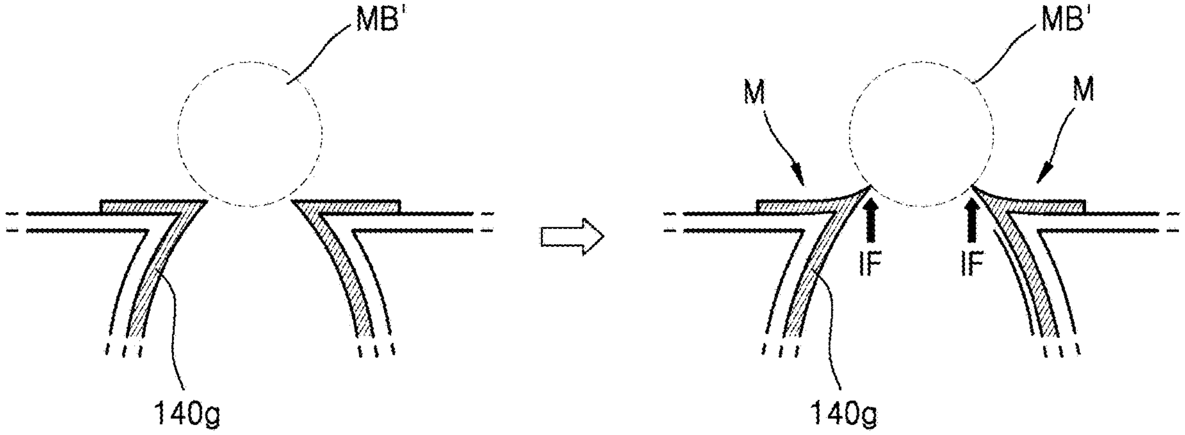
FIG. 25 illustrates a schematic diagram showing a form of controlling a conductive cantilever portion by applying an external magnetic force, according to an embodiment of the present invention.

FIG. 25 illustrates a schematic diagram showing a form of controlling a conductive cantilever portion by applying an external magnetic force, according to an embodiment of the present invention.

Referring to the left view in FIG. 25, an alignment error or height difference error of a specific micro bump MB' among a plurality of micro bumps MB may result in it failing to make contact with the conductive thin film layer 140*g*. In this case, the shape of the cantilever portion CT may be controlled by applying an external magnetic force M.

Referring to the right view in FIG. 25, when a magnetic force M is applied from the outside, a force IF that attracts the cantilever portion CT may be applied. Accordingly, the cantilever portion CT may make contact with the micro bump MB', forming an electrical connection. Additionally, the contact force may be adjusted by bending the cantilever portion CT upward or downward depending on the application of the magnetic force M. For example, if a gap is created due to a height difference between neighboring micro bumps, the cantilever portion CT may be controlled to bend upward, while if the micro bump deforms by approximately 10% to 15% upon contact, the cantilever portion CT may be controlled to bend downward.

FIGS. 26 to 33 illustrate schematic diagrams showing a manufacturing process of a semiconductor test device according to a ninth embodiment of the present invention.

The metal thin film portion 111 may be formed using a thin-film formation method, such as rolling process or electroforming process. In the following description, with reference to FIGS. 26 to 33, a method for forming the metal thin film portion 111 of the membrane portion 110 (110-8) using electroforming will be described. Meanwhile, although FIGS. 26 to 33 illustrate a semiconductor test device 100 (100-9) that includes a plurality of cell portions C, it should be noted that the same manufacturing process may be used to produce a device that includes a single cell portion C.

Figure 26:
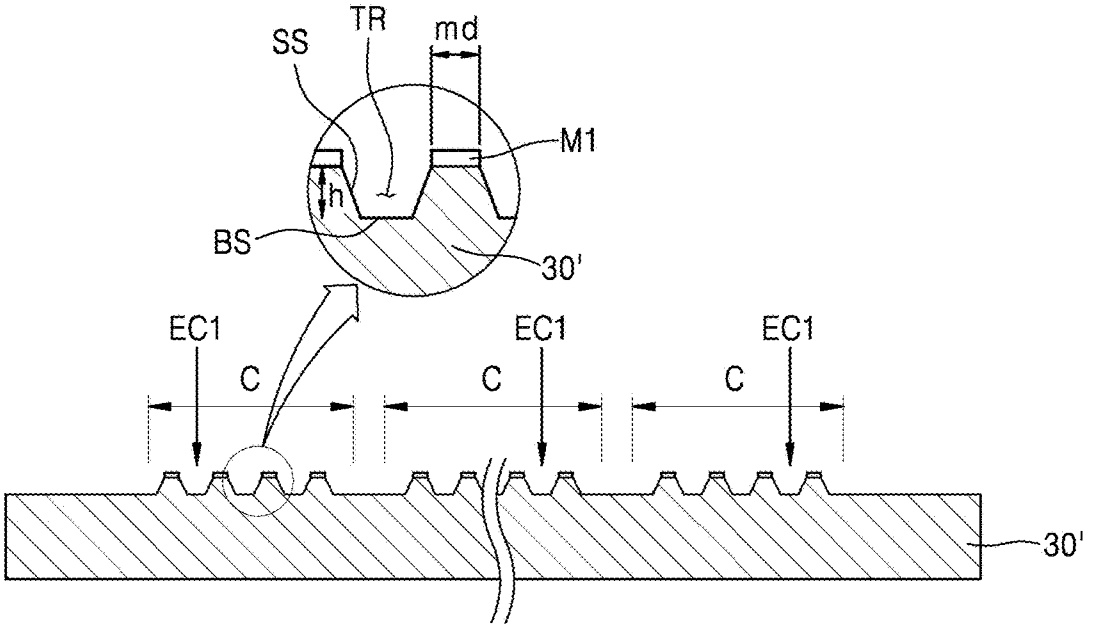
FIGS. 26 to 33 illustrate schematic diagrams showing a manufacturing process of a semiconductor test device according to a ninth embodiment of the present invention.

Referring to FIG. 26, a support 30' is prepared. The support 30' may be made of a conductive material to enable electroforming. To achieve both conductivity and low resistance, the support 30' (or a conductive substrate 30') may be highly doped at a concentration higher than or equal to $10^{19}$ $cm^{-3}$. The doping may be performed over the entire support 30' or on only the surface of the support 30'. According to one embodiment, the surface resistance of the support 30' may be $5\times10^{-4}$ to $1\times10^{-2}$ ohm·cm. The support 30' may be used as a cathode electrode during electroforming.

Unlike metals with a metal oxide on the surface and polycrystalline silicon with grain boundaries, doped monocrystalline silicon, being free of defects, allows for the uniform formation of an electric field across the entire surface during electroforming, which results in a uniform plated film (or a metal thin film portion 111). As the metal thin film portion 111 prepared with the uniform plated film does not require additional processes for removing or addressing defects, costs for process may be reduced and the productivity may be improved.

Then, a patterned insulating portion M1 may be formed on one surface of the support 30'. The insulating portion M1 is a part formed to protrude (embossed) from one surface of the support 30', and may have insulation properties to prevent the formation of the plated film (or the metal thin film portion 111). Accordingly, the insulating portion M1 may be made of at least one of a photoresist material, a silicon oxide material, or a silicon nitride material. The insulating portion M1 may be formed by forming a silicon oxide or a silicon nitride on the support 30' using deposition or the like, and thermal oxidation or thermal nitridation methods may be used by employing the support 30' as a base. A photoresist may be formed using a printing method or the like.

The width md of the insulating portion M1 may correspond to the upper width of the aperture pattern P. The upper width of the aperture pattern P may correspond to the minimum width required for the micro bump MB or the connection electrode CE to make contact. The width md of the insulating portion M1 may be formed at a level of several to several tens of micrometers to correspond to the width of the aperture pattern P. Meanwhile, as will be described below, since a trench portion TR is formed in the support 30', the insulating portion M1 may be formed with a thin thickness within the range required to form the trench portion TR. Considering that the trench portion TR corresponds to the thickness of the metal thin film portion 111 (approximately 5 to 50 μm), the insulating portion M1 may be formed to be as thin as approximately 0.5 to 5 μm. Therefore, there is an advantage in that the insulating portion M1 is easy to form and material usage can be reduced.

Then, the support 30' may be subjected to etching EC1. The etching EC1 may be performed on a first surface (or upper surface) of the support 30' exposed between patterns of the insulating portion M1. Dry etching or wet etching may be used for etching EC1. Wet etching has isotropic etching characteristics, while dry etching has isotropic etching characteristics and allows precise etching to a desired width. Alternatively, laser etching using femtosecond laser, picosecond laser, or the like may be used for precise etching. In the case of laser etching, the process of forming the insulating portion M1 may be omitted.

A trench portion TR recessed into the first surface (or upper surface) of the support 30' may be formed by etching EC1. A depth h of the trench portion TR may approximately correspond to the thickness of the metal thin film portion 111 to be formed. For example, the depth h of the trench portion TR may be approximately 5 to 50 μm.

A plurality of trench portions TR may be formed by patterning. On the support 30' corresponding to the cell portion C, the trench portion TR may be formed to inversely correspond to the aperture pattern P. In other words, the area where the trench portion TR is not formed in the cell portion C may later become the aperture pattern P.

The trench portion TR may include a bottom surface BS and side surfaces SS. The side surfaces SS may be formed to be inclined either vertically or at a predetermined angle. When using wet etching EC1, which has isotropic etching characteristics, the side surfaces SS may be formed to be inclined at a predetermined angle. In other words, the side surfaces SS of the trench portion TR may be tapered. By taking into account the crystal orientation of the monocrystalline silicon material of the support 30' during etching, it is possible to implement the taper angle of the trench portion TR to correspond to the etching direction.

Figure 27:
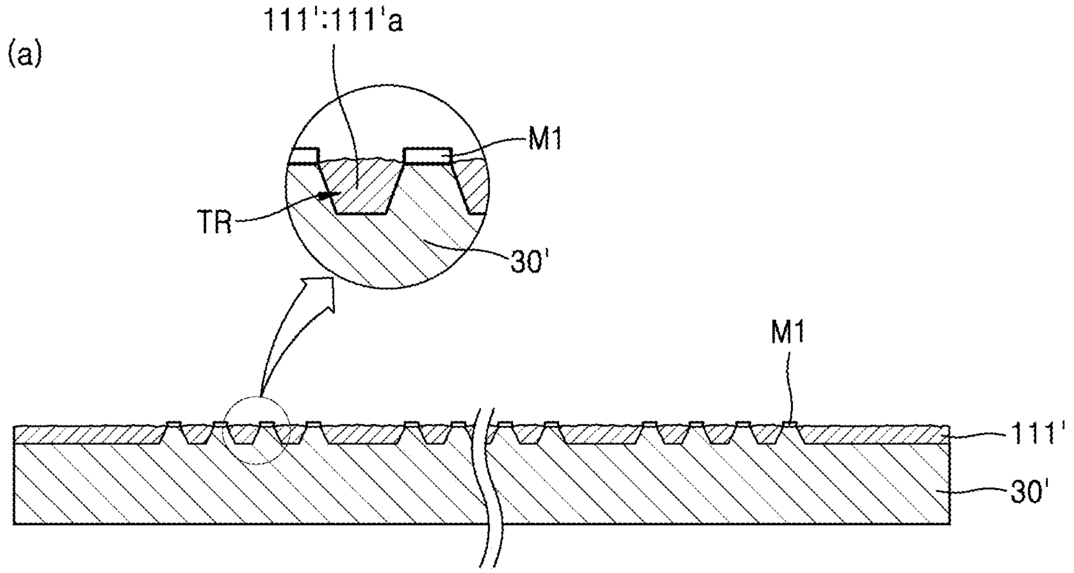
Figure 27:
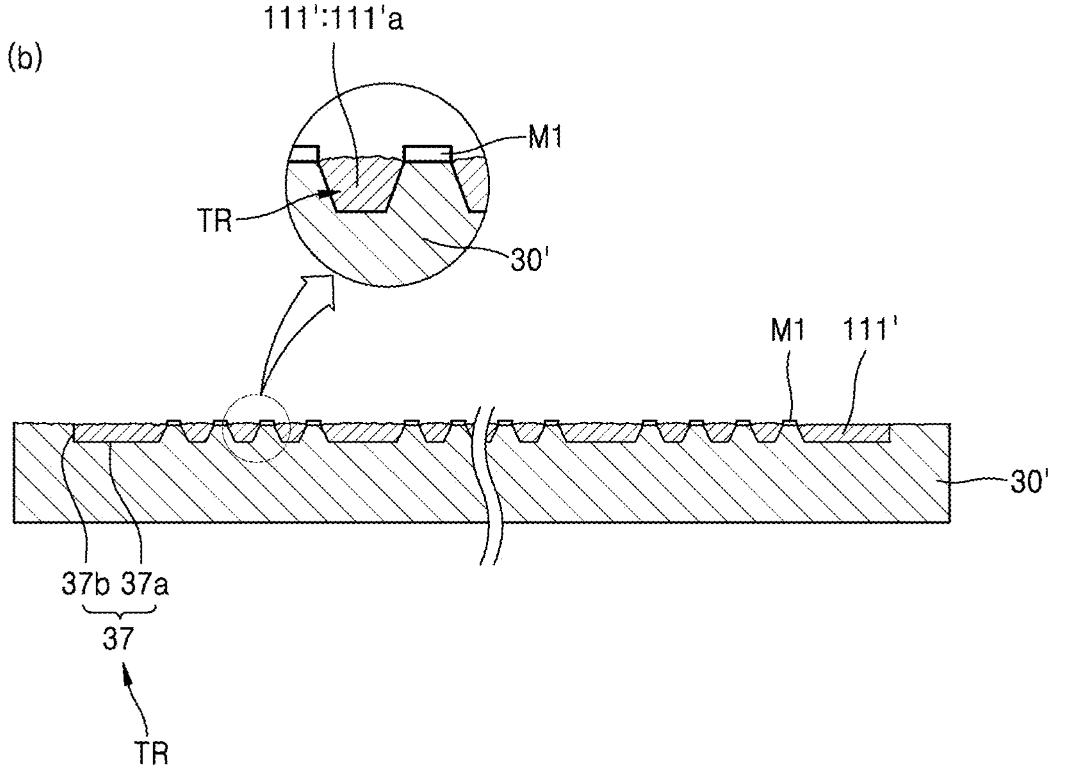

Then, referring to (a) of FIG. 27, a metal thin film portion 111' (111'_a_) may be formed by performing electroforming on the support 30'. The support 30' is used as a cathode body and an anode body (not shown) facing the support 30' is prepared. The anode body may be immersed in a plating solution (not shown), and the support 30' may be partially or entirely immersed in the plating solution. As the insulating portion M1 has the insulating properties, a plated film may not be formed in a region that corresponds to the insulating portion M1. In particular, the plated film may be formed in the trench portion TR to create the metal thin film portion 111'. The thickness of the metal thin film portion 111' may be controlled to fill the trench portion TR without exceeding the height of the insulating portion M1. In other words, electroforming may be performed such that an upper end of the metal thin film portion 111' is positioned higher than the first surface (or upper surface) of the support 30' and lower than an upper end of the insulating portion M1.

Meanwhile, the composition may be controlled to allow the metal thin film portion 111' to have a CTE similar to that of the silicon material of the support 30'. After the manufacturing process, the support 30' may be provided as a holder portion 150 made of silicon material, and the metal thin film portion 111 needs to have a CTE similar to that of the holder portion 150 (30) to prevent sagging on the holder portion 150 (30). Additionally, this may minimize variations in alignment errors of the cell portions C and the aperture patterns P on the holder portion 150 (30).

Taking this into account, the composition of the metal thin film portion 111' may be controlled such that the CTE of the support 30' made of silicon material and the CTE of the metal thin film portion 111' after heat treatment H, which will be described below, become approximately $(3.5\pm1)\times10^{-6}/°$ C. Even when the metal thin film portion 111' is made of Invar material, varying the composition ratios of Fe and Ni during electroforming may enable precise control of the CTE to closely match that of the support 30' made of silicon material. Alternatively, the CTE of the metal thin film portion 111' may be controlled to be smaller or greater than that of the support 30' so that the metal thin film portion 111' can be tightly connected onto the support 30' depending on process temperature conditions.

Also, the metal thin film portion 111' formed by electroforming needs to be well adhered to the support 30' without peeling off during the subsequent processes, such as heat treatment H, etching EC2, and the like, which will be described below. To this end, various approaches may be considered.

In one approach, a native oxide of the support 30' on which electroforming is to be performed may be controlled. An oxide may be formed on the surface of the support 30' made of a silicon wafer material. On the surface with such an oxide, a uniform electric field may not be generated, and hence the plated film (metal thin film portion 111') may not be uniformly produced, and the adhesion between the produced plated film (metal thin film portion 111') and the support 30' may be low. Therefore, a process of removing the native oxide is preferably followed by an electroforming process.

In another approach, another film may be further formed to mediate adhesion between the plated film (metal thin film portion 111') and the support 30'. In addition to a barrier film, which will be described below, a film or a combination of films providing adhesion to both surfaces of the film may be used.

In still another approach, the surface of the support 30' may be pre-treated before electroforming. Through physical treatment or chemical treatment, the plated film (metal thin film portion 111') produced in the electroforming process may be formed on the support 30' with stronger adhesion. In addition, by controlling the plating method in the electroforming process, the plated film (metal thin film portion 111') may be formed on the support 30' with stronger adhesion.

Meanwhile, referring to (b) of FIG. 27, the trench portion TR may have a recessed trench shape with side surfaces SS on both sides (see FIG. 26), and it may also have a recessed stepped shape with only one side surface SS. In (b) of FIG. 27, a trench portion TR in the form of a step 37 having a bottom surface 37*a* and one side surface 37*b* is also shown. Accordingly, the metal thin film portion 111' may be formed by electroplating within the space of the step 37 at the edge portion of the support 30'.

Figure 28:
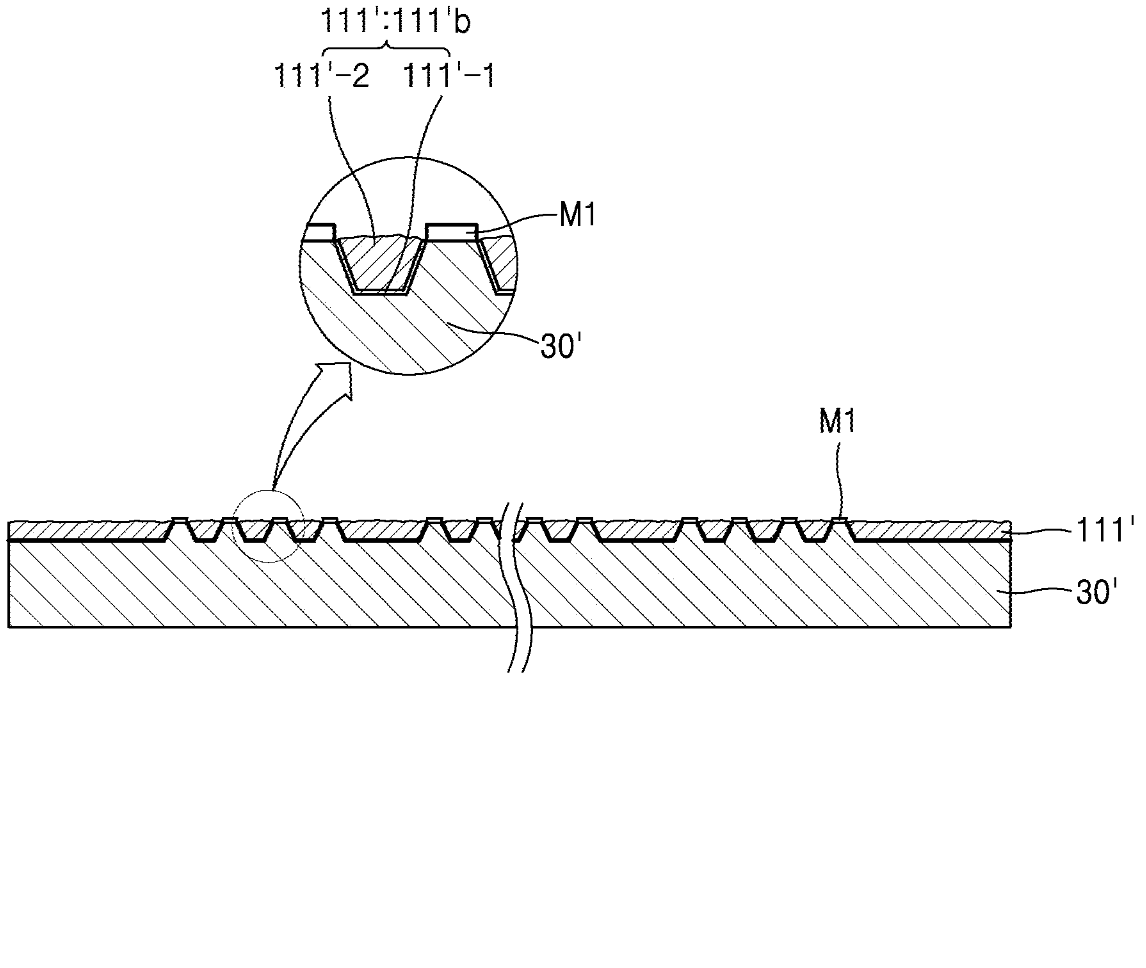

Meanwhile, referring to FIG. 28, the metal thin film portion 111' (111'*b*) may be configured as a laminate with two or more plated layers such that the metal thin film portion 111'*b* has a CTE similar to that of the silicon material of the support 30'. In this case, a first metal thin film portion 111'-1 may be formed of a metal material capable of forming silicide with the support 30'. The first metal thin film portion 111'-1 may be formed of a material, such as Ni, Co, Ti, Cr, W, Mo, or the like, which exhibits high adhesion to the support 30' when produced by electroforming. A second metal thin film portion 111'-2 may be made of a material, such as Invar, Super Invar, or the like, which exhibits a low CTE when produced by electroforming. As the first and second metal thin film portions 111'-1 and 111'-2 have different CTEs, the CTE of the metal thin film portion 111' may be controlled by adjusting the thickness ratio of the first and second mask metal thin film portions 111'-1 and 111'-2. The thickness ratio of the first and second metal thin film portions 111'-1 and 111'-2 may be controlled by adjusting the electroforming duration.

Additionally, during electroforming, the current density may be adjusted such that the metal thin film portion 111' (111'*b*) is composed of two or more layers with different compositions. For instance, the metal thin film portion 111'*b* may include a first metal thin film portion 111'-1, which is either a pure Ni layer or a Ni-rich alloy layer, and a second metal thin film portion 111'-2, which is an Invar alloy layer. First, by applying a first current density, the first metal thin film portion 111'-1, which is a pure Ni layer or an alloy layer with Ni content greater than 60 wt %, may be formed on at least a portion of the bottom surface BS and side surfaces SS of the trench portion TR. Subsequently, by applying a second current density different from the first current density, the second metal thin film portion 111'-2, which is a Fe—Ni alloy layer (Invar layer) with Ni content of 36 wt % to 42 wt % may be formed on the first metal thin film portion 111'-1. The second current density may be a value less than the first current density. For example, when the first current density is applied in an electroforming solution environment capable of forming Fe—Ni alloy, a Ni-rich layer may be plated, and changing to the second current density may result in the deposition of a layer with an increased proportion of Fe.

However, the first metal thin film portion 111'-1 needs to have a thinner thickness than the second metal thin film portion 111'-2. In order to match the low CTE of the second metal thin film portion 111'-2, it is preferable to form the first metal thin film portion 111'-1 only to the extent necessary to ensure adhesion to the support 30'. Taking this into consideration, the thickness of the first metal thin film portion 111'-1 is preferably 2% to 20% of the thickness of the second metal thin film portion 111'-2.

The Ni in the first metal thin film portion 111'-1 is advantageous for forming silicide through heat treatment at relatively low temperatures compared to Invar. Additionally, since the adhesion between Ni in the first metal thin film portion 111'-1 and Invar is good, the first metal thin film portion 111'-1 may mediate adhesion between the support 30' of silicon material and the second metal thin film portion 111'-2. Utilizing a Ni-rich first metal thin film portion 111'-1 allows the formation of a connection portion 40 through heat treatment H (see FIG. 29) at temperatures below 400° C.

For another example, the metal thin film portion 111'*b* may be configured with pure Ni layers or Ni-rich alloy layers included in the lower and upper layers, while incorporating an Invar alloy layer as an intermediate layer. In this case, during the electroforming process, an alloy layer with pure Ni or Ni content greater than 60 wt % may be formed as a lower layer (the first metal thin film portion) on at least a portion of the bottom surface BS and side surfaces SS of the trench portion TR by applying the first current density. Subsequently, by applying the second current density different from the first current density, a Fe—Ni alloy layer (Invar layer) with Ni content of 36 wt % to 42 wt % may be formed as an intermediate layer (the second metal thin film portion). Then, by applying the first current density (or third current density) that is different from the second current density, an alloy layer with pure Ni or Ni content greater than 60 wt % may be formed as an upper layer (third metal thin film portion). The second current density may be a value less than the first current density (or the third current density). The thickness of the third metal thin film portion may correspond to the thickness of the first metal thin film portion.

In this case, the upper layer, which is an alloy layer with pure Ni or Ni content greater than 60 wt %, contains more Ni than the Fe—Ni alloy layer (Invar layer) containing Fe, and thus can reduce the degree of oxidation during the subsequent heat treatment H process. Additionally, there is an advantage in protecting the intermediate layer as the upper layer is removed first during the subsequent planarization PS process.

Meanwhile, before electroforming of the metal thin film portion 111' (111'*a* and 111'*b*) shown in FIGS. 27 and 28, an auxiliary connection portion (not shown) may be further formed on at least a portion of the trench portion TR. For example, when the support 30' is a silicon wafer, the adhesion is higher when the metal thin film portion 111, made of a material such as Invar or Super Invar, is adhered to the support 30' through the auxiliary connection portion made of Ni, Cu, or the like, compared to direct adhesion of the metal thin film portion 111 to the support 30'. Taking this into account, the auxiliary connection portion may include at least one of Ni, Cu, Ti, Au, Ag, Al, Sn, In, Bi, Zn, Sb, Ge, or Cd. If the material of the auxiliary connection portion makes electroforming difficult, it may be formed using methods such as sputtering or brazing. The auxiliary connection portion may be formed of a material such as Ni, Cu, Ti, Au, Ag, or Al that exhibits high adhesion to the support 30' when produced through electroforming. Alternatively, when formed by sputtering or brazing, the auxiliary connection portion may be composed of a material such as Sn, In, Bi, Zn, Sb, Ge, Cd, or the like that exhibits high adhesion to the support 30'. The auxiliary connection portion may be thinly formed to have a thickness of 0.01 μm to 0.2 μm.

Figure 29:
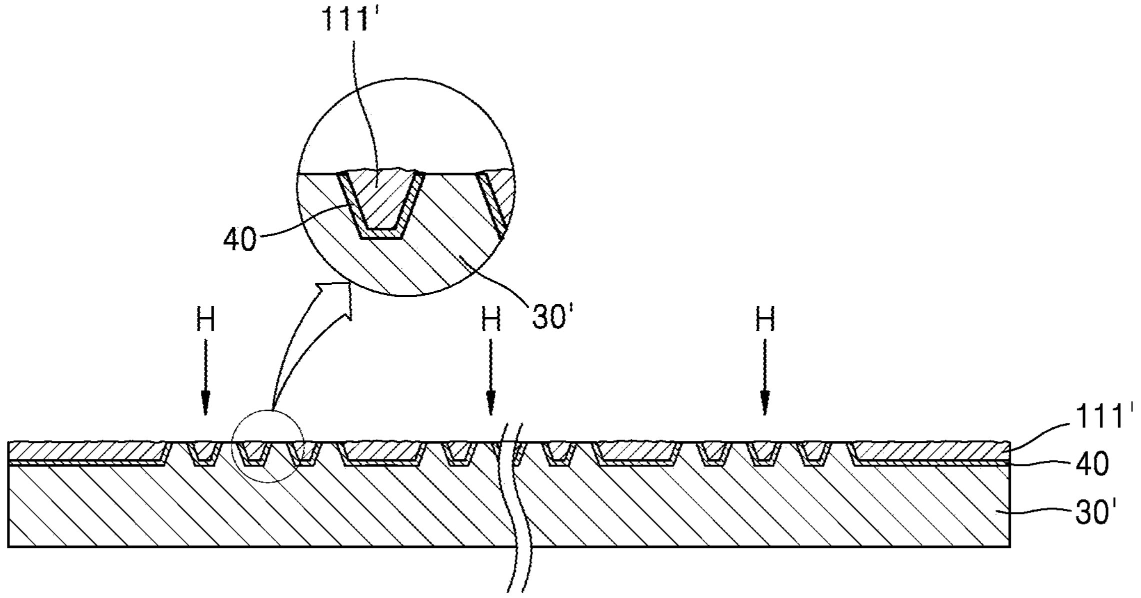

Then, referring to FIG. 29, heat treatment H may be performed on the metal thin film portion 111' and the support 30'. A process of removing the insulating portion M1 may be performed before and/or after heat treatment H. The heat treatment may be performed at a temperature of 100° C. to 800° C. For example, when the metal thin film portion 111' is directly formed on the support 30', as shown in FIG. 27, heat treatment may be carried out at temperatures ranging from 300° C. to 800° C. For another example, when the first metal thin film portion 111'-1 is formed between the second metal thin film portion 111'-2 and the support 30', as shown in FIG. 28, heat treatment H may be performed at temperatures ranging from approximately 100° C. to 800° C., preferably in the low-temperature range of approximately 100° C. to 400° C. During the heat treatment H process, a predetermined pressure may be applied to perform the heat treatment with less heat.

Generally, compared to an Invar thin plate produced by rolling, the Invar thin plate produced by electroforming has a higher CTE. Therefore, performing heat treatment on the Invar thin plate may reduce the CTE. However, there may be slight deformation in the Invar thin plate during this heat treatment process. If heat treatment is performed only on the metal thin film portion 111 that exists separately, slight deformation may occur in the aperture patterns P. Therefore, performing heat treatment H while the support 30' and the metal thin film portion 111' are adhered to each other has the advantage of preventing the shape of the aperture patterns P from being slightly deformed due to the heat treatment.

In addition, the present invention involves the form in which the metal thin film portion 111' is precisely accommodated in the recessed trench portion TR of the support 30'. When heat treatment H is performed in this state, a unique effect is achieved in which the side surfaces SS and the bottom surface BS of the trench portion TR can prevent the metal thin film portion 111' from deforming in the horizontal direction. Also, in the present invention, since the metal thin film portion 111' is accommodated in the trench portion TR, the contact area between the support 30' and the metal thin film portion 111' is further increased, which provides an advantage in facilitating the formation of the connection portion 40 through heat treatment H.

On the other hand, the Invar thin plate, produced by electroforming, and the silicon wafer have almost the same CTEs, approximately 3 to 4 ppi. Thus, even with the heat treatment H, the metal thin film portion 111' and the support 30' have the same or similar degree of thermal expansion, preventing misalignment due to thermal expansion and avoiding subtle deformations in the aperture patterns P.

Moreover, the present invention is characterized by the connection of the metal thin film portion 111' and the support 30' through the heat treatment H. During the heat treatment H process, the connection portion 40 may be formed between the metal thin film portion 111' and the support 30'. The connection portion 40 may be provided as an intermetallic compound resulting from the combination of the components of the metal thin film portion 111' and the support 30'. As the Fe and Ni components of the metal thin film portion 111' and the Si component of the support 30' are combined, the connection portion 40 may be provided as a silicide containing Ni and Si, containing Fe, Ni, and Si, or containing Fe and Ni. The bonding strength of the intermetallic compound allows the metal thin film portion 111' and the support 30 to be connected to each other through the connection portion 40.

Additionally, according to an embodiment, the heat treatment H process may be carried out in multiple steps. As a 2-step heat treatment, $Ni_2Si$ may be formed in the low-temperature range (approximately 250° C. to 350° C.) to adhere the metal thin film portion 111 to the support 30', followed by gradually raising the temperature to the high-temperature range (approximately 450° C. to 650° C.) to perform the heat treatment. In the case of an Invar metal thin film portion produced by electroforming, due to its microcrystalline and/or amorphous structure, a rapid increase in temperature during heat treatment may lead to the detachment or separation of the Invar metal thin film portion from the silicon wafer support 30' due to volume contraction. Therefore, it is preferable to perform heat treatment by gradually raising the temperature to high temperature after attaching the Invar metal thin film portion to the silicon wafer support 30' at low temperature.

In addition, according to one embodiment, a reducing atmosphere should be maintained during the heat treatment H. The reducing atmosphere may be formed as $H_2$, Ar, or $N_2$ atmosphere, and may preferably use a dry $N_2$ gas to prevent oxidation of the Invar metal thin film portion. In order to prevent oxidation of the Invar metal thin film portion, it is necessary to manage the $O_2$ concentration to be less than 100 ppm. Alternatively, a vacuum atmosphere of $<10^{-2}$ torr may be formed. The heat treatment H may be performed for 30 minutes to 2 hours.

As the connection portion 40 (adhesive layer), such as Ni silicide, (Ni, Fe) Si silicide, etc., is formed on the interface of the electroformed metal thin film portion 111' on the silicon wafer support 30', the mask 20' and the support 30' may be connected to each other with the connection portion 40 interposed therebetween.

Meanwhile, to control the reaction of Ni and Fe—Ni with Si during the heat treatment H, a barrier film (not shown) may be formed on the support 30' before electroforming the metal thin film portion 111' on the support 30'. The barrier film may prevent the components (e.g., Ni and Fe—Ni) of the metal thin film portion 111' from permeating uncontrollably into the silicon support 30'. Also, the barrier film preferably has conductivity to allow electroforming to take place on the surface. Taking this into account, the barrier film may include a material, such as titanium nitride (TiN), titanium/titanium nitride (Ti/TiN), tungsten carbide (WC), titanium tungsten (WTi), graphene, or the like. A thin-film formation process such as deposition of barrier film may be used without limitations. The barrier film may control the reaction of Fe and Ni with Si to ensure the formation of a uniform silicide and allow the metal thin film portion 111 and the connection portion 40 to be attached to each other with appropriate adherence strength. In addition, the barrier film may be configured as a film or a combination of films capable of providing predetermined adhesion or adherence so that the metal thin film portion 111' is not separated from the support 30' in a state in which the metal thin film portion 111' is electroformed on the support 30'.

The thickness (silicide thickness) of the connection portion 40 may be controlled to 10 to 300 nm by adjusting temperature and time, facilitating the connection between the support 30' and the metal thin film portion 111'.

On the other hand, when the above-described auxiliary connection portion is further interposed, a phase change occurs where the auxiliary connection portion between the metal thin film portion 111' and the support 30' is melted by the heat treatment and then solidifies again during the heat treatment H process. Through this phase change, the auxiliary connection portion may mediate the connection between the metal thin film portion 111' and the support 30'. The auxiliary connection portion may act as an adhesion layer or a glue layer. From another perspective, the connection may be achieved by altering the interfacial state between the metal thin film portion 111', the support 30', and the auxiliary connection portion in a manner that metal components of the auxiliary connection portion diffuse into the metal thin film portion 111' and the support 30', or conversely, the components of the metal thin film portion 111' and the support 30' diffuse into the auxiliary connection portion, or in a manner that the components of the metal thin film portion 111', the support 30', and the auxiliary connection portion diffuse mutually into each other.

Meanwhile, although FIGS. 29 to 33 illustrate the state in which the connection portion 40 is formed after the heat treatment H, the heat treatment H process may be omitted, considering the connection strength between the metal thin film portion 111' and the support 30'.

Figure 30:
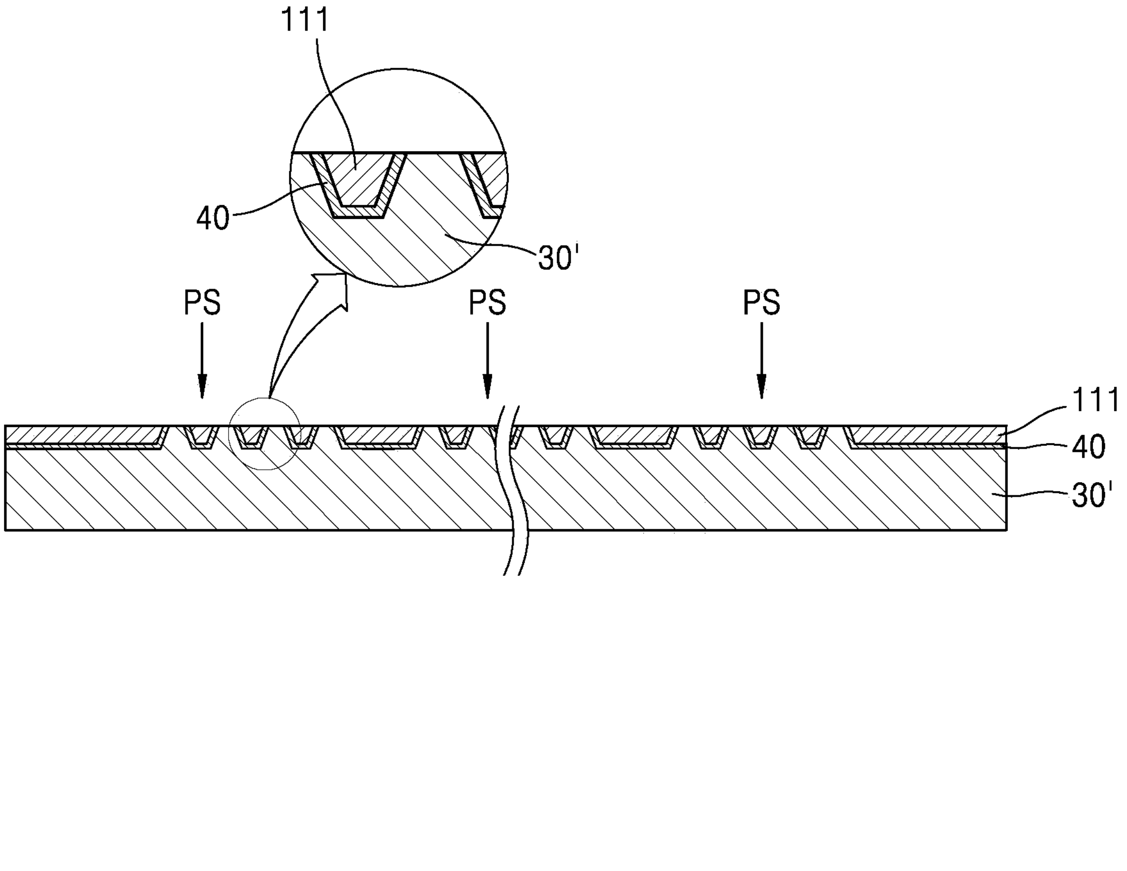

Then, referring to FIG. 30, planarization PS may be performed on the metal thin film portion 111'. Here, planarization PS refers to flattening one surface (upper surface) of the metal thin film portion 111' while simultaneously partially removing the upper part of the metal thin film portion 111' to reduce the thickness (111'→111). Planarization PS may be performed using methods such as lapping, polishing, buffing, and the like.

After the planarization PS, the metal thin film portion 111 and the support 30' may share at least the same upper surface. As the planarization PS is performed while the metal thin film portion 111 is accommodated in the trench portion TR of the support 30', the metal thin film portion 111 can share the same upper surface with the support 30'.

On the other hand, the heat treatment H of FIG. 29 and the planarization PS of FIG. 30 may also be applied in the reverse order. Planarization PS may be first performed on the metal thin film portion 111' to reduce the thickness (111'→111), and then, through the heat treatment H, the connection portion 40 may be formed.

Figure 31:
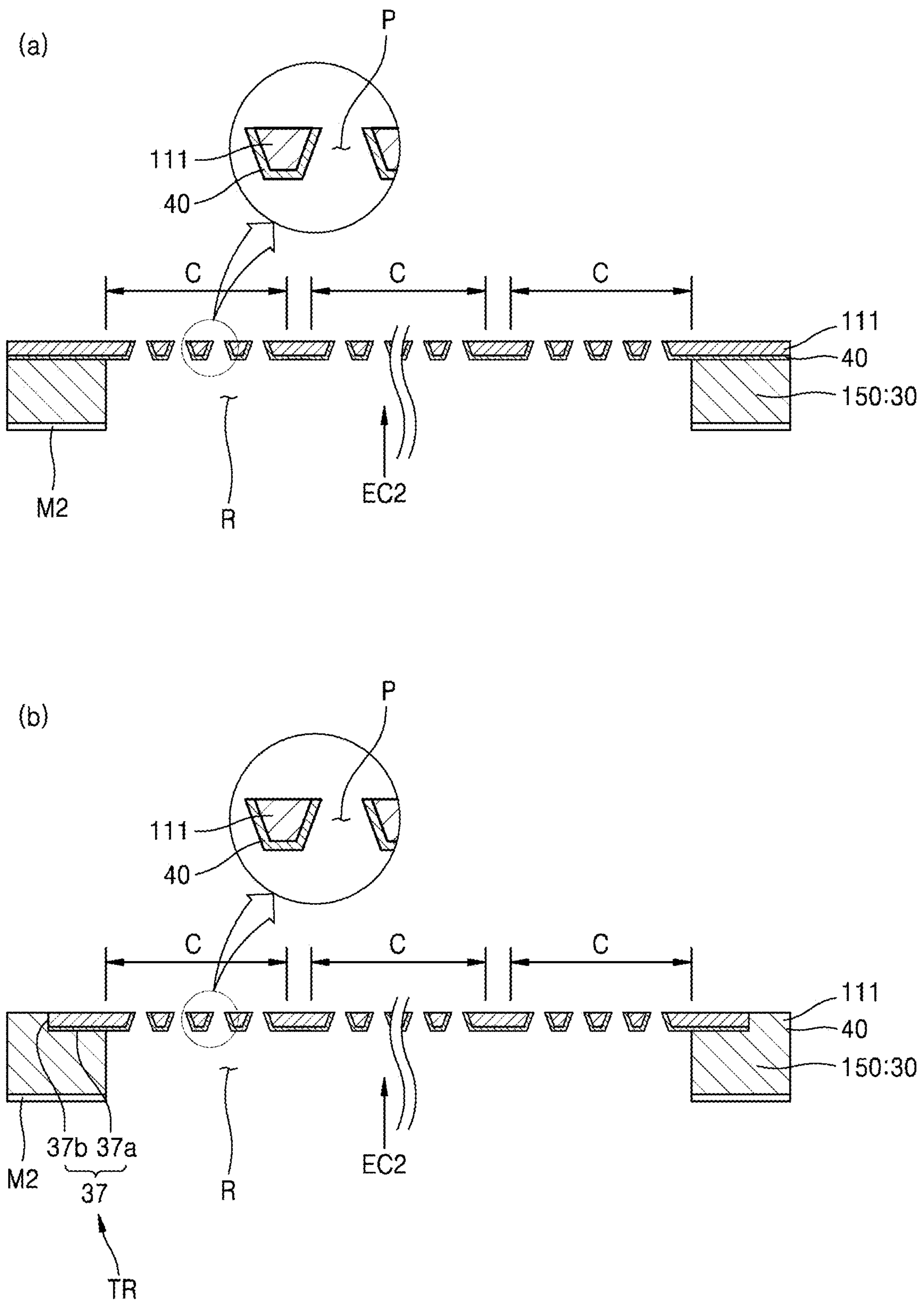

Then, referring to (a) of FIG. 31, the support 30' may be subjected to etching EC2. The etching EC2 may be performed on a second surface (lower surface) opposite to the first surface (upper surface) of the support 30' to which the metal thin film portion 111 is connected. The etching EC2 may be performed on a region of the support 30' corresponding to the cell portion C of the metal thin film portion 111. A region that corresponds to the outer edge of the cell portion C of the metal thin film portion 111 is not subjected to etching. Optionally, before etching EC2 of the support 30', a thickness reduction process may be performed on the entire lower surface (second surface) or the central part of the support 30'.

Once the etching EC2 is completed, the support 30 may take the form of providing a hollow region R with only the edge portion remaining. The support 30 may be provided as a holder portion 150. Since the support 30' is a silicon wafer, there is an advantage in that etching EC2 may be performed by utilizing existing semiconductor-related technologies and Micro-Electro Mechanical System (MEMS)-related technologies.

In order to impart etch resistance, an insulating portion M2 may be formed on the lower surface of the support 30' excluding the portions corresponding to the cell portions C. The insulating portion M2 may be formed of photoresist using a printing method or the like, and may be formed of silicon oxide or silicon nitride serving as a hard mask by a method such as thermal oxidation or thermal nitridation. Meanwhile, a metal may be used as a mask for etching. The exposed portion of the lower surface of the support 30', not covered by the insulating layer M2, may be subjected to etching EC2.

Additionally, the present invention has the effect of providing the connection portion 40 formed between the support 30' and the metal thin film portion 111 as a stopper during the etching EC2 process. As the etching EC2 progresses from the second surface of the support 30' toward the first surface, when it reaches the connection portion 40, the etching EC2 may not proceed any further. Consequently, damage to the metal thin film portion 111 or aperture patterns P may be prevented during the etching EC2 process.

The trench portion TR accommodates the metal thin film portion 111, allowing the metal thin film portion 111 to maintain its shape during the etching EC2 process. The portions between neighboring trench portions TR on the support 30' are removed after the etching EC2 process. This vacant space may be provided as the aperture pattern P of the metal thin film portion 111. If the side surface SS of the trench portion TR has an inclined or tapered shape, the side surfaces of the aperture pattern P may also have the corresponding inclined or tapered shape.

As the central portion of the support 30' is etched to provide the hollow region R, a connected structure in which the metal thin film portion 111 and the holder portion 150 (30) are integrally connected may be provided.

Meanwhile, referring to (b) of FIG. 31, the trench portion TR may have a recessed trench shape with side surfaces SS on both sides (see FIG. 26), and it may also have a recessed stepped shape with only one side surface SS. In (b) of FIG. 31, an example of a trench portion TR in the form of a step 37 having a bottom surface 37*a* and one side surface 37*b* is shown. A trench portion TR may have side surfaces inclined similar to a taper (see FIG. 26). In the connected structure where the metal thin film portion 111 and the holder portion 150 (30) are integrally connected as shown in (b) of FIG. 31, a trench portion TR in the form of a step 37 is formed in the holder portion 150 (30). Since the metal thin film portion 111 is formed within the trench portion TR using electroforming, at least a portion of the metal thin film portion 111 may be positioned in the recessed trench portion TR.

Figure 32:
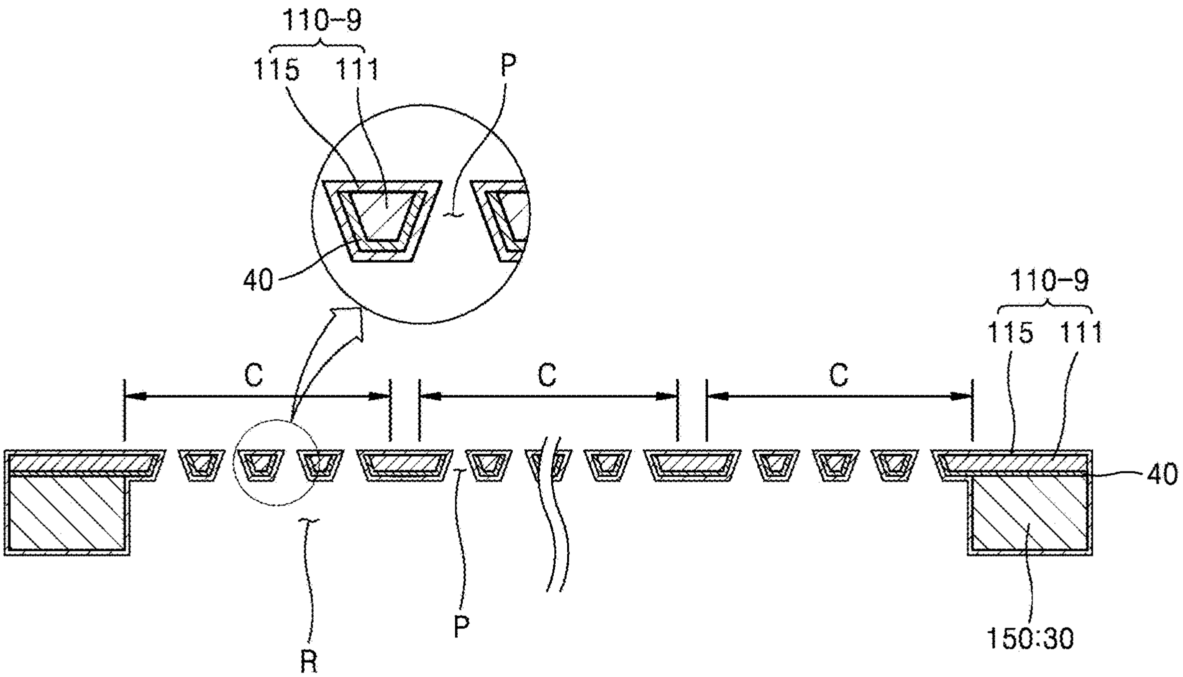

Next, referring to FIG. 32, the insulating portion M2 may be removed, and an insulating layer portion 115 may be coated on the surface of the connected structure of the metal thin film portion 111 and the holder portion 150 (30). The insulating layer portion 115 is coated on the aperture pattern P of the metal thin film portion 111, thereby finalizing the aperture pattern P of a membrane portion 110 (110-9). The process of forming the insulating layer portion 115 is the same as described above with reference to FIG. 12.

Figure 33:
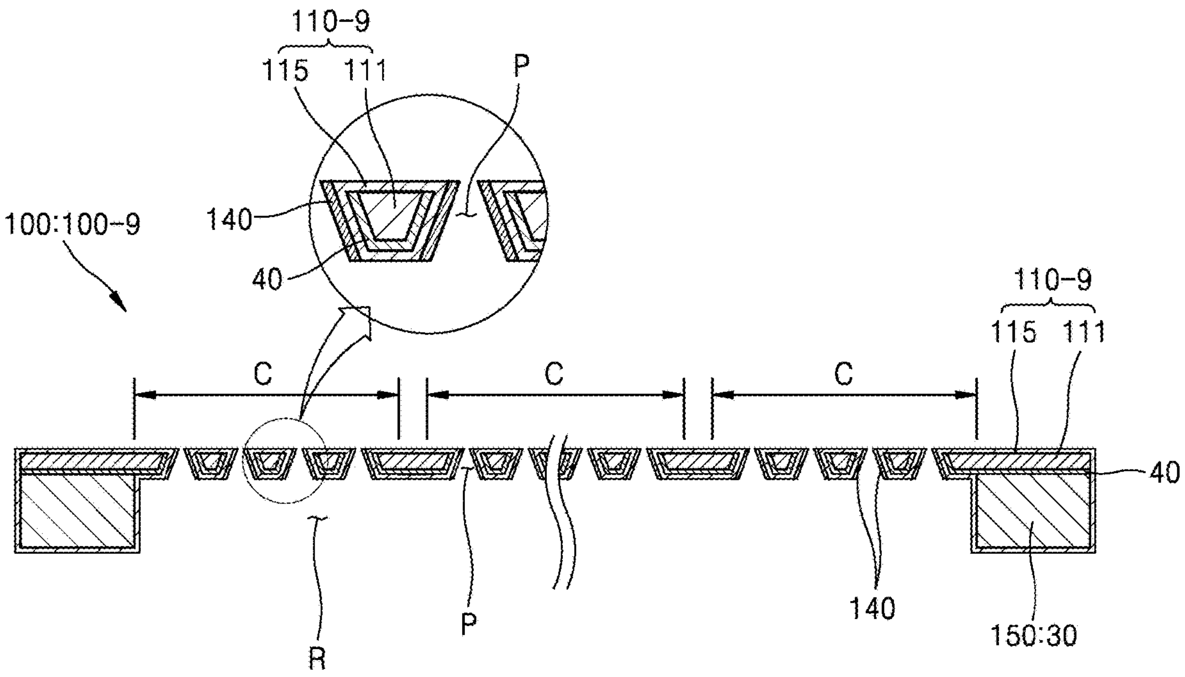

Next, referring to FIG. 33, a conductive thin film layer 140 may be formed on the side surfaces of the aperture pattern P. The process of forming the conductive thin film layer 140 is the same as described above with reference to FIG. 23. Through this process, the manufacturing of a semiconductor test device 100 (100-9), in which the membrane portion 110 (110-9) with the insulating layer portion 115 coated on the surface of the metal thin film portion 111 is connected to the holder portion 150 and the conductive thin film layer 140 is formed in the aperture pattern P, may be completed.

FIGS. 34 to 37 illustrate schematic diagrams showing a manufacturing process of a semiconductor test device 100 (100-10) according to a tenth embodiment of the present invention. FIGS. 34 to 37 illustrate an example in which a plurality of aperture patterns P are formed in a single cell portion C.

Figure 34:
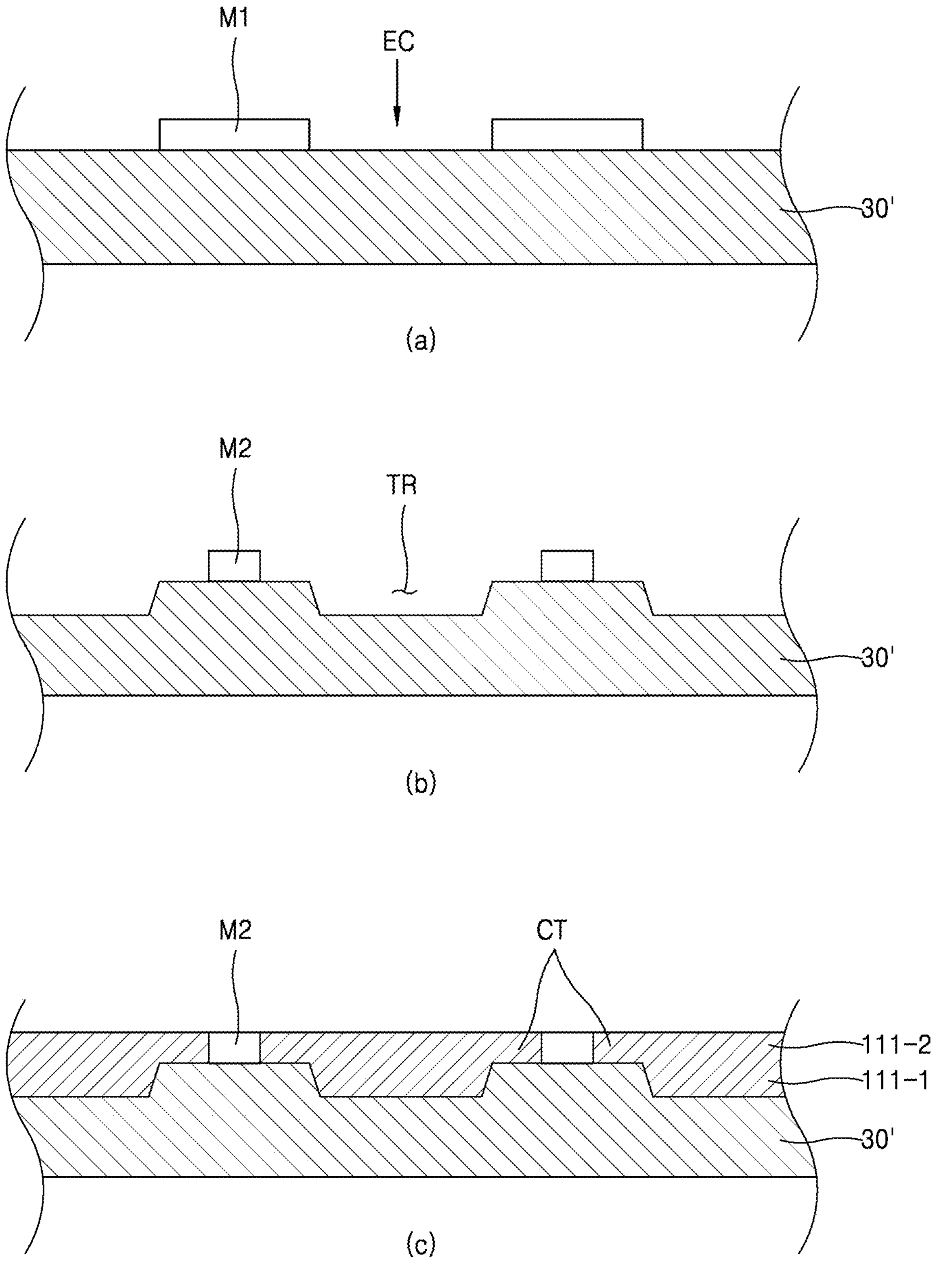
FIGS. 34 to 37 illustrate schematic diagrams showing a manufacturing process of a semiconductor test device according to a tenth embodiment of the present invention.

Referring to (a) of FIG. 34, a support 30' is prepared. Subsequently, after forming a patterned first insulating portion M1 on one surface of the support 30', etching EC may be performed on an exposed surface of the support 30' between the patterns of the first insulating portion M1.

Next, referring to (b) of FIG. 34, a trench portion TR recessed into the surface of the support 30' may be formed by etching EC. Subsequently, a patterned second insulating portion M2 may be formed on the upper surface of the support 30', except for the area where the trench portion TR is formed. The second insulating portion M2 may have a narrower width than the first insulating portion M1. The width of the second insulating portion M2 may correspond to the width of the aperture pattern P.

Next, referring to (c) of FIG. 34, electroforming may be performed on the support 30' to form a metal thin film portion 111 (111-1 and 111-2). A first metal thin film portion 111-1 may fill the trench portion TR, and a second metal thin film portion 111-2 may be formed further on top of the first metal thin film portion 111-1. The second metal thin film portion 111-2 may not be formed in the area where the second insulating portion M2 is disposed, and the area where the second insulating portion M2 is positioned may be provided as the aperture pattern P. The first and second metal thin film portions 111-1 and 111-2 may be formed simultaneously through the same process or individually through two separate processes.

The second metal thin film portion 111-2 may be electroformed with a wider width along both sides of the second insulating portion M2 than the first metal thin film portion 111-1. When considering only the metal thin film portion 111, the second metal thin film portion 111-2 has a shape where both sides protrude further. These protruding parts may be provided as cantilever portions CT, similar to the conductive cantilever portion CT described above with reference to FIGS. 24 to 25. In other words, based on the first metal thin film portion 111-1 with a first width corresponding to the width of the aperture pattern P and the second metal thin film portion 111-2 with a second width narrower than the first width, the portion of the second metal thin film portion 111-2 that protrudes further in the lateral direction than the first metal thin film portion 111-1 may be provided as the cantilever portion CT.

Meanwhile, the first and second metal thin film portions 111-1 and 111-2 may be formed using a method different from the steps shown in (a) to (c) of FIG. 34. Referring to (a') of FIG. 35, a first trench portion TR1 and a second trench portion TR2 may be formed on the support 30'. The width of the second trench portion TR2 may be formed wider than that of the first trench portion TR1.

Figure 35:
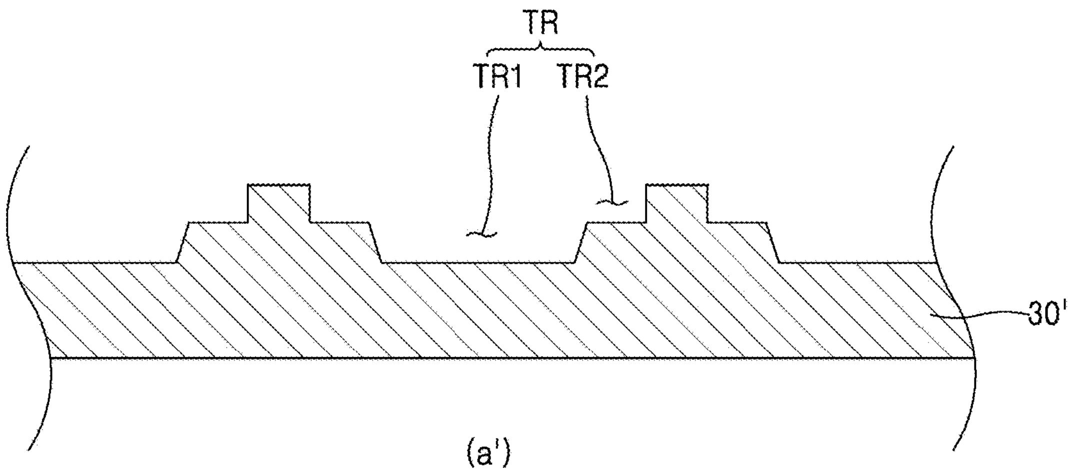
Figure 35:
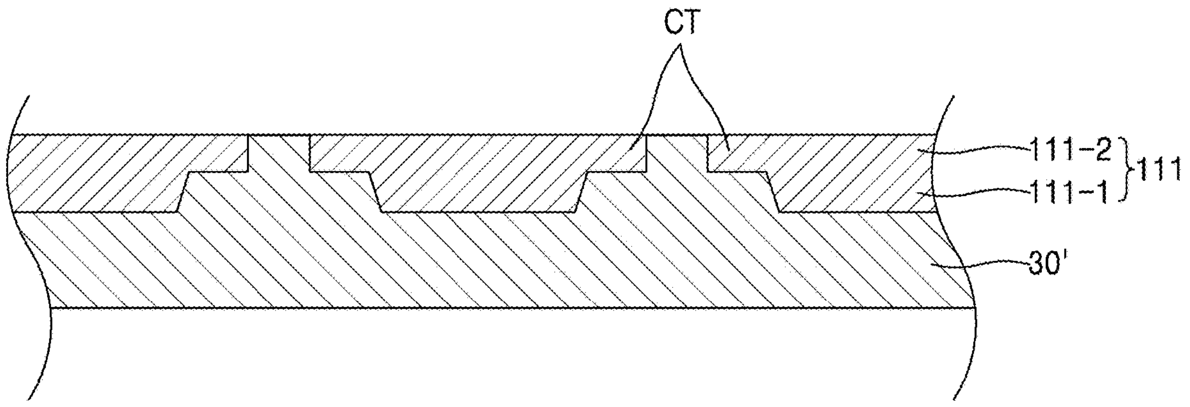

Next, referring to (b') of FIG. 35, electroforming may be performed on the support 30' to form a metal thin film portion 111 (111-1 and 111-2). A first metal thin film portion 111-1 may fill the first trench portion TR1, and a second metal thin film portion 111-2 may be formed while filling the second trench portion TR2 on the first metal thin film portion 111-1.

Meanwhile, after forming the metal thin film portion 111 shown in FIGS. 34 and 35, the heat treatment H process described above with reference to FIG. 29 and the planarization PS process described above with reference to FIG. 30 may be applied. Although the following description omits the connection portion 40 for convenience of explanation, if the heat treatment H process is performed, the connection portion 40 may be formed between the metal thin film portion 111 and the support 30'.

Figure 36:
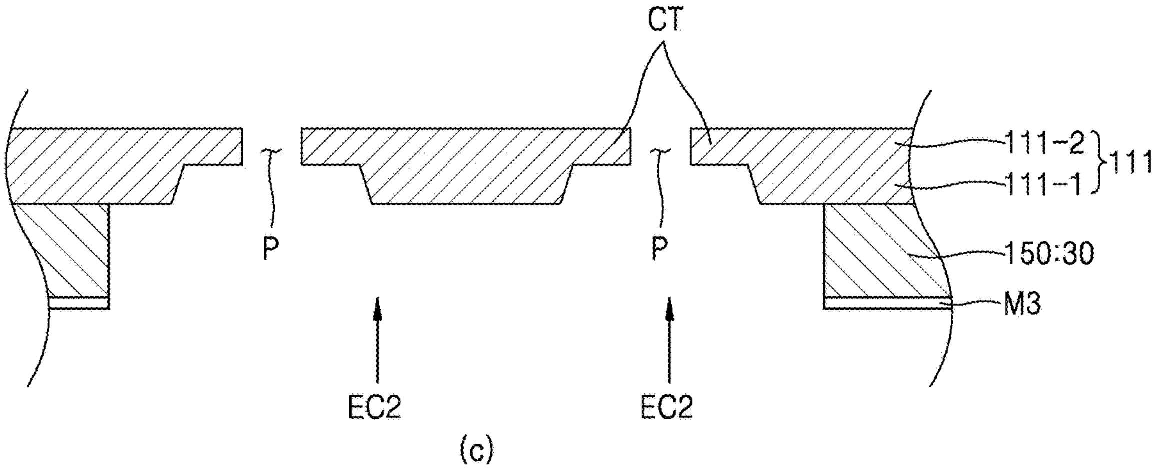

Next, referring to FIG. 36, the support 30' may be subjected to etching EC2. The etching EC2 may be performed on a second surface (lower surface) opposite to the first surface (upper surface) of the support 30' to which the metal thin film portion 111 is connected. Once the etching EC2 of the support 30' exposed between the patterns of a third insulating portion M3 is completed, the support 30 may take the form of providing a hollow region R with only the edge portion remaining. As the central portion of the support 30' is etched to provide the hollow region R, a connected structure in which the metal thin film portion 111 and the holder portion 150 (30) are integrally connected may be provided.

Figure 37:
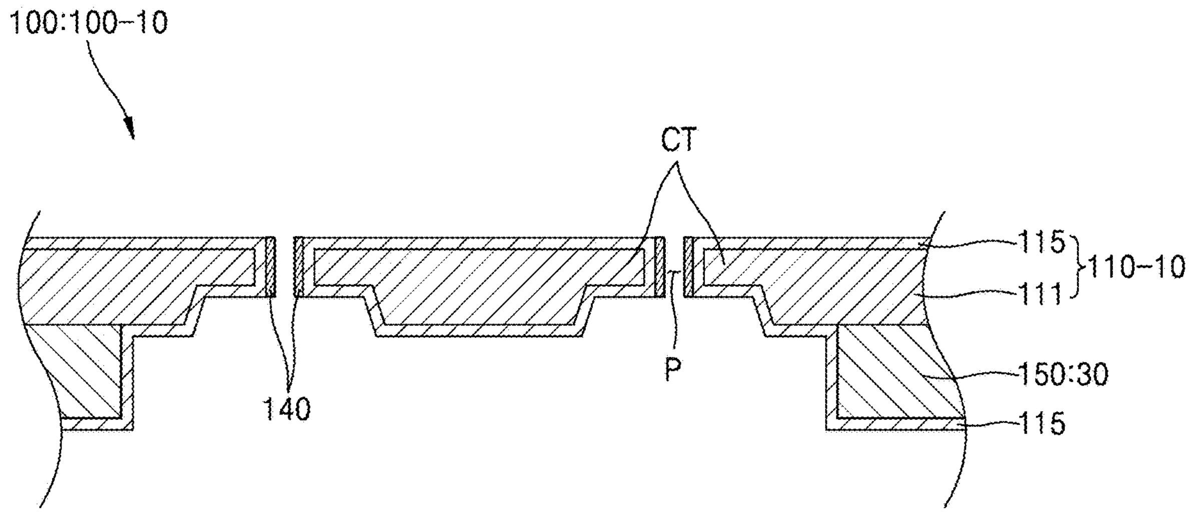

Next, referring to FIG. 37, the third insulating portion M3 may be removed, and an insulating layer portion 115 may be coated on the surface of the connected structure of the metal thin film portion 111 and the holder portion 150 (30). Subsequently, a conductive thin film layer 140 may be formed on the side surfaces of the aperture pattern P. Through this process, the manufacturing of a semiconductor test device 100 (100-10), in which the membrane portion 110 (110-10) with the insulating layer portion 115 coated on the surface of the metal thin film portion 111 is connected to the holder portion 150 and the conductive thin film layer 140 is formed in the aperture pattern P, may be completed.

Meanwhile, in the semiconductor test devices 100 (100-9 and 100-10) shown in FIGS. 33 and 37, instead of the conductive thin film layer 140, an electrical path portion 130 may be filled in the aperture pattern P to form an electrical connection path.

On the other hand, instead of forming a trench portion TR on the support 30', a patterned insulation portion (not shown) may be formed, and then electroforming may be performed on the support 30' to form the metal thin film portion 111 that includes a plurality of aperture patterns P. Subsequently, the support 30' may be etched to form a holder portion 150, and a conductive thin film layer 140 may be further formed on the insulating layer portion 115 and the side surfaces of the aperture patterns P to manufacture the semiconductor test device 100.

On the other hand, the step of forming the holder portion 150 by etching the support 30' described above with reference to FIGS. 31 and 36 may be modified. In the steps shown in FIGS. 31 and 36, the entire support 30' may be etched or removed. Subsequently, a separately prepared holder portion 150 may be connected to the membrane portion 110. Alternatively, after forming the conductive thin film layer 140 on the aperture pattern P of the membrane portion 110, the holder portion 150 may be finally connected to the membrane portion 110. The holder portion 150 is not limited to the materials described above, as long as it serves the purpose of supporting the membrane portion 110.

Figure 38:
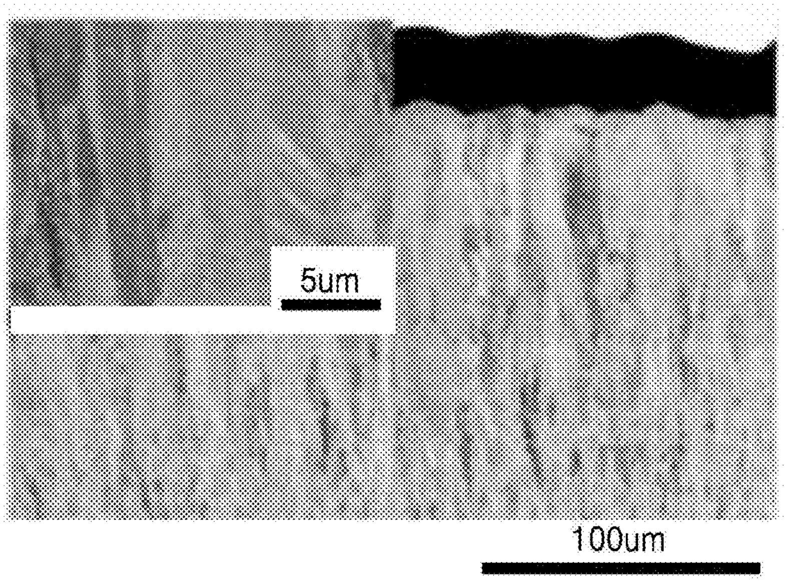
FIG. 38 is a cross-sectional microscopic photograph of a metal film formed by electroforming according to a comparative example.
Figure 39:
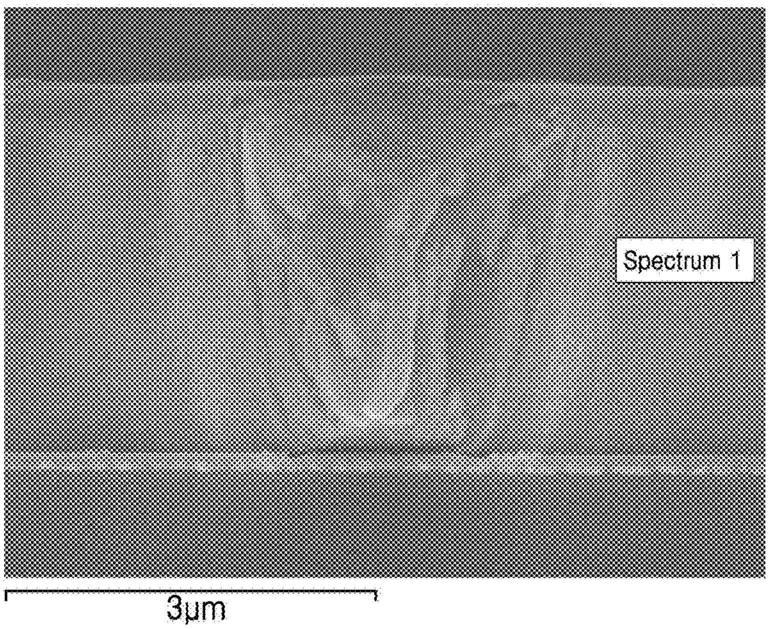
FIG. 39 is a cross-sectional microscopic photograph of a metal thin film portion formed by electroforming according to an embodiment of the present invention.

FIG. 38 is a cross-sectional microscopic photograph of a metal film formed by electroforming according to a comparative example. FIG. 39 is a cross-sectional microscopic photograph of a metal thin film portion formed by electroforming according to an embodiment of the present invention.

A comparative example in FIG. 38 shows a metal thin film formed by electroforming on a conductive substrate. It can be observed that the crystals of a plated film appear in a vertical direction or in a shape such as a column. From another perspective, it can also be seen that changes in composition of the plated film during the electroforming process occur along the vertical direction. This may be the result of a metal thin film forming crystals in a vertical direction from the surface of a conductive substrate when electroforming a thin film without an insulating portion such as PR. Alternatively, even with an insulating portion such as PR, this may be the result of the metal thin film forming crystals only in the vertical direction from the surface of the conductive substrate.

The embodiment of the present invention shown in FIG. 39 shows a metal thin film portion 111 formed by electroforming on a support 30' where a trench portion TR is formed through processes as shown in FIGS. 26 to 29 described above. Particularly, FIG. 39 shows an image of a body portion of the metal thin film portion 111 between adjacent aperture patterns P. Unlike the comparative example shown in FIG. 38, it can be observed that, in the present invention, the crystals of the metal thin film appear tilted at a predetermined angle to the vertical direction, rather than forming a vertical shape or a column-like shape. From another perspective, this may also be viewed as a change in composition of the metal thin film portion 111' (or the plated film) occurring through a combination of vertical and horizontal directions during the electroforming process.

Further comparisons will be described with reference to FIGS. 40 and 41 as follows.

Figure 40:
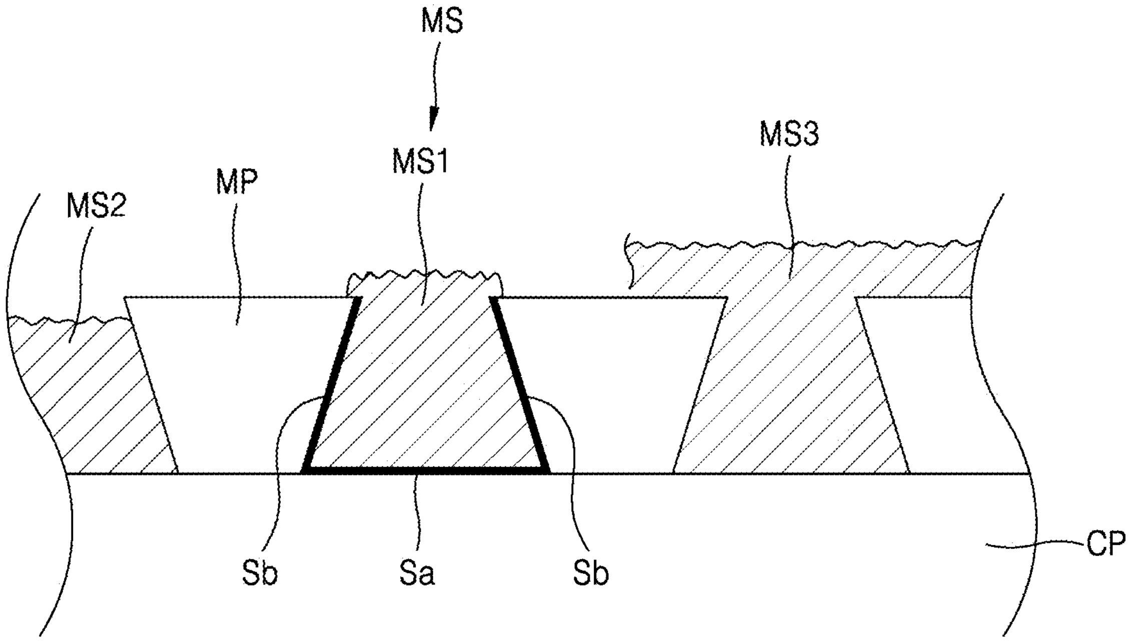
FIG. 40 illustrates a schematic side cross-sectional view showing a metal film formed by electroforming according to the comparative example.

FIG. 40 illustrates a schematic side cross-sectional view showing a metal film formed by electroforming according to the comparative example. FIG. 41 illustrates schematic side cross-sectional views showing a metal thin film portion formed by electroforming according to an embodiment of the present invention.

Referring to FIG. 40, the electroforming process according to the comparative example involves forming an insulating portion MP such as PR on a conductive substrate CP, and then forming a metal thin film MS (MS1 to MS3) through the spaces between the patterns of this insulating portion MP by electroforming. The metal thin film MS may be formed to a height slightly above the height of the insulating portion MP (e.g., MS1), to a height lower than the height of the insulating portion MP (e.g., MS2), or to a height exceeding the height of the insulating portion MP and covering the insulating portion MP (e.g., MS3).

What is common in the above three cases is that the mask metal film MS is electroformed, forming crystals in the vertical direction from the surface Sa of the conductive substrate CP exposed between the insulating portion MP patterns. Since the side surface Sb of the insulating portion MP is an insulator, it cannot serve as a starting point for electroforming. Ultimately, electroforming is performed only in the vertical direction from the exposed horizontal surface Sa of the conductive substrate CP that has conductive properties, and crystals may be formed.

Figure 41:
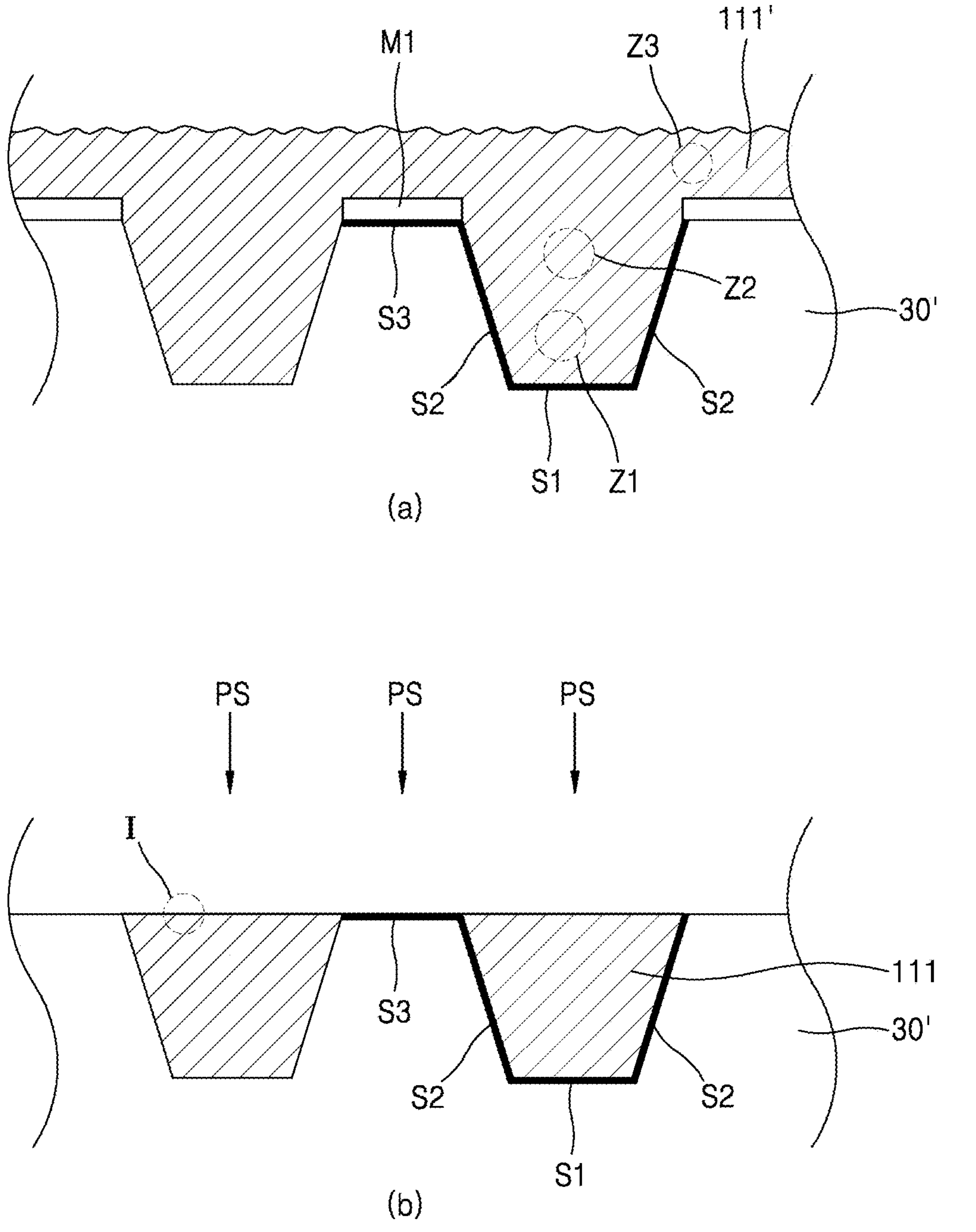
FIG. 41 illustrates schematic side cross-sectional views showing a metal thin film portion formed by electroforming according to an embodiment of the present invention.

Referring to (a) of FIG. 41, in the electroforming process according to the present invention, the surface of the support 30' is not formed only in the horizontal direction during electroforming, but due to the trench portion TR, not only the bottom surface S1 but also the side surfaces S2 of the trench portion TR of the support 30' may serve as starting points for electroforming. Consequently, crystals may form through a combination of electroforming performed in the vertical (normal) direction from the bottom surface S1 of the trench portion TR of the conductive substrate CP having conductive properties and electroforming performed in the vertical (normal) direction from the side surfaces S2 of the trench portion TR. In other words, the crystals may form while being influenced by forces in both the vertical and horizontal directions.

Figure 42:
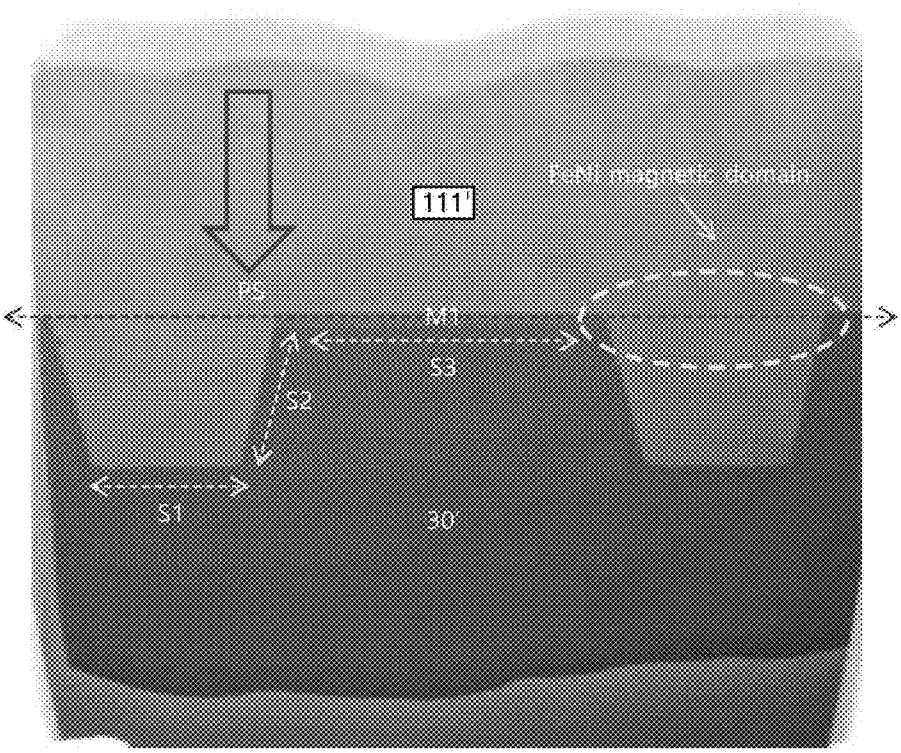
FIG. 42 is a cross-sectional microscopic photograph of a metal thin film portion formed on a support by electroforming according to an embodiment of the present invention.

FIG. 42 is a cross-sectional microscopic photograph of a metal thin film portion formed on a support by electroforming according to an embodiment of the present invention. FIG. 42 corresponds to the cross-sectional microscopic photograph of (a) of FIG. 41.

Referring further to (a) of FIG. 41 and FIG. 42, the composition and crystal form may vary across different regions Z1, Z2, and Z3 of a metal thin film portion 111'. As described above with reference to FIG. 28, the metal thin film portion 111' may be plated to form two layers with different compositions by adjusting a current density. In addition to this method, in the present invention, the composition and crystal form may vary across different regions Z1, Z2, and Z3 due to the structural factors involved in forming the trench portion TR.

The first region Z1 corresponds to a first surface S1, which is the lower surface of the metal thin film portion 111' (or the lower surface of the trench portion TR). The first region Z1 may be significantly influenced by the characteristics of electroforming that starts from the first surface S1. The crystal shape in this region may be more influenced by a force in the vertical direction than in the horizontal direction.

The second region Z2 may be influenced by the characteristics of electroforming that starts from both the first surface S1 and the second surfaces S2, which are the side surfaces of the aperture pattern P (or the side surfaces of the trench portion TR). As a result, the crystal shape in this region may be influenced by a combination of forces in both the vertical and horizontal directions.

The third region Z3 is an area where the insulating portion M1 may be disposed, and corresponds to the upper surface of the metal thin film portion 111'. The third region Z3 cannot serve as a starting point for electroforming due to the insulating portion M1 (such as silicon oxide, PR, etc.). Accordingly, as the electroforming continues from the second region Z2, crystals may form due to a combination of forces in the vertical and horizontal directions; however, due to a greater distance from the starting point for electroforming than the second region Z2, the nature of forces may be different.

Ultimately, the compositions of the first surface S1, which is the lower surface of the metal thin film portion 111, and the second surface S2, which is the side surface of the aperture pattern P, may differ from the composition of a third surface S3, which is the upper surface of the metal thin film portion 111.

Meanwhile, referring to (b) of FIG. 41, the metal thin film portion 111 may be provided by performing planarization PS after heat treatment H of the metal thin film portion 111', or by performing heat treatment of the metal thin film portion 111' after planarization PS (see FIGS. 29 and 30). Subsequently, the third surface S3 may become the upper surface of the aperture pattern P (or the upper surface of the metal thin film portion 111) through etching EC2 of the support 30' (see FIG. 31).

In the heat treatment H process, a magnetic domain may be formed as crystals within the metal thin film portion 111' grow. Referring to FIG. 42, it can be observed that irregular shapes in dark gray/light gray appear on the metal thin film portion 111'. These dark gray/light gray shapes may correspond to the magnetic domains.

Figure 43:
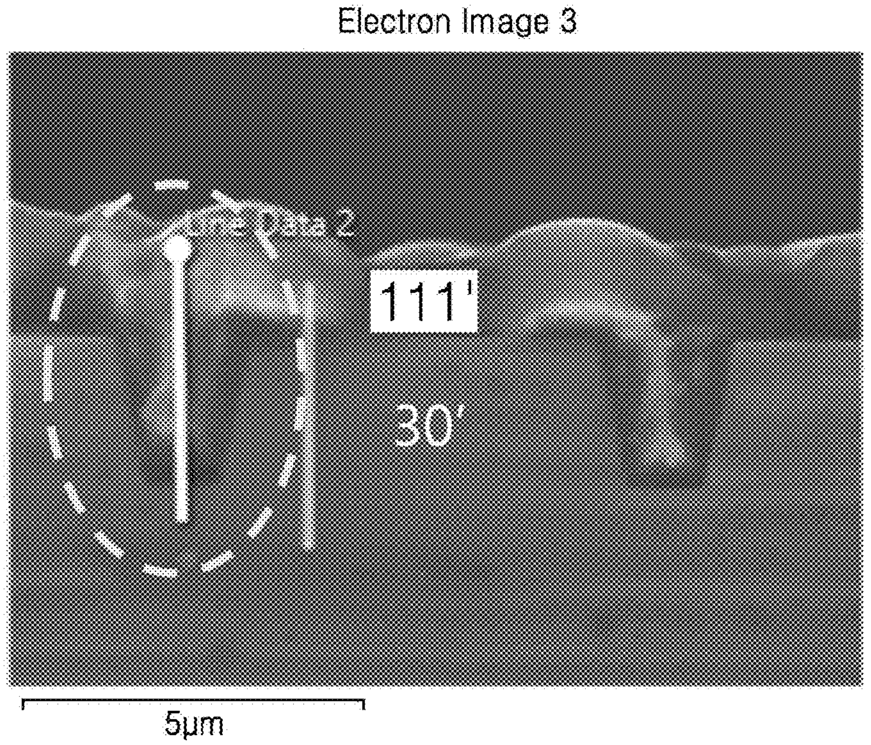
FIGS. 43 and 44 illustrate the line data and composition in the depth direction of the metal thin film portion formed on a support by electroforming according to an embodiment of the present invention.
Figure 44:
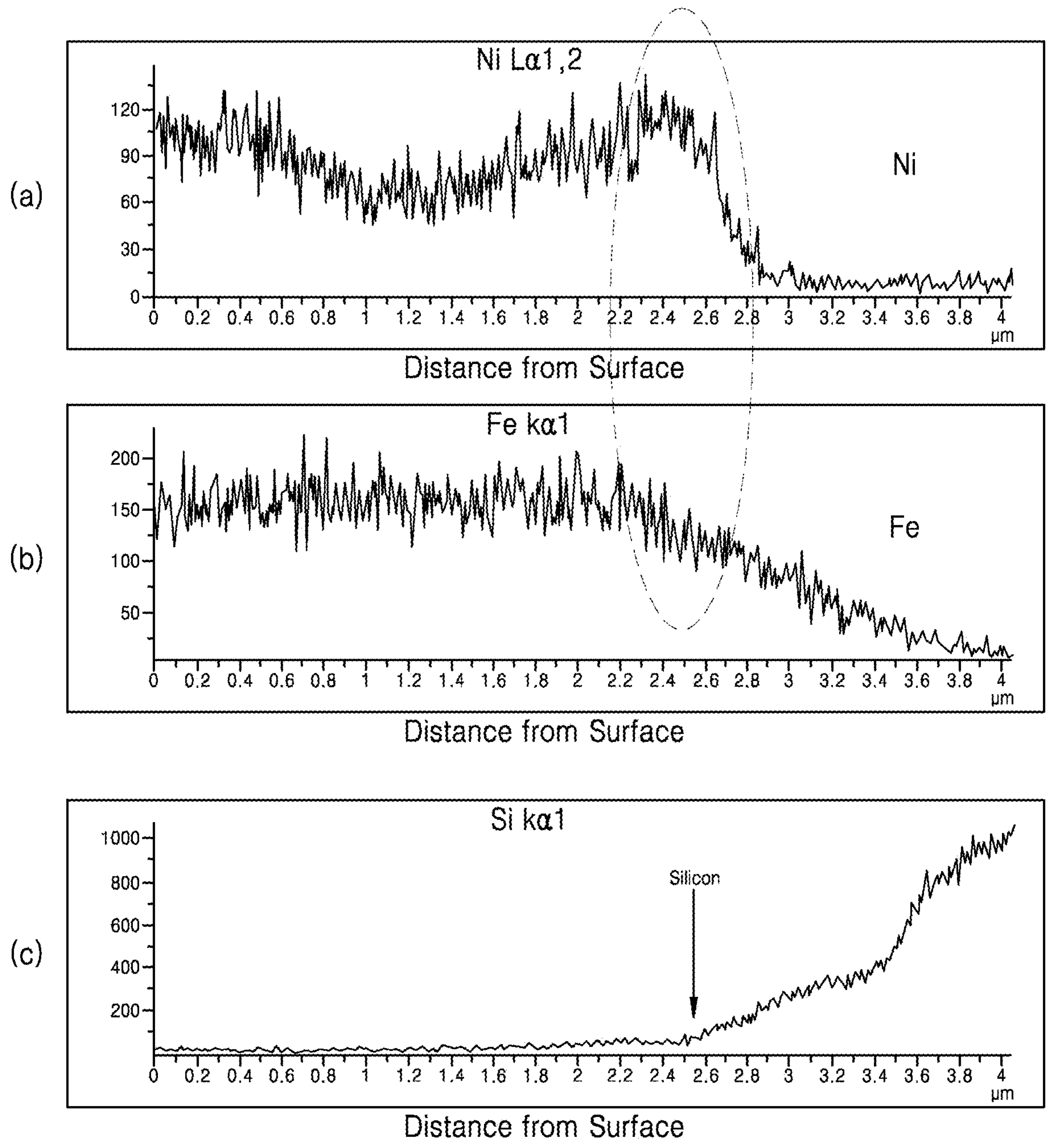

FIGS. 43 and 44 illustrate the line data and composition in the depth direction of the metal thin film portion formed on a support by electroforming, according to an embodiment of the present invention.

Composition analysis was performed in the direction from the surface of the metal thin film portion to the lower portion, as shown by the line data direction in FIG. 43. In FIG. 44, the X-axis represents the distance moved downward by 4 μm from the surface of the mask (starting at 0), and the Y-axis represents the amount of a component. Referring to (c) of FIG. 44, from approximately 2.6 μm, the amount of Si increases sharply. Therefore, it can be confirmed that the thickness of the metal thin film portion 111' formed in the trench portion TR is approximately 2.6 μm from the upper surface to the lower surface, and beyond 2.6 μm, a support 30' of a silicon wafer material appears.

In addition, referring to (a) of FIG. 44, it can be seen that the amount of Ni increases sharply around 2.6 μm. That is, in a part represented by the dotted ellipse in (a) and (b) of FIG. 44, it can be confirmed that the proportion of Ni is relatively higher than in other parts. In other words, this confirms that the composition near the first surface S1, which is the lower surface of the metal thin film portion 111', is Ni-rich compared to the composition near the third surface S3, which is the upper surface of the metal thin film portion 111'. Similarly, not only the first surface S1 but also the second surface S2, which is the starting surface of electroforming, may have a Ni-rich composition compared to the third surface S3. The metal thin film MS formed according to the comparative example described with reference to FIG. 40 is Ni-rich only at the lower surface, and is thus distinguishable from the metal thin film portion 111' of the present invention.

Figure 45:
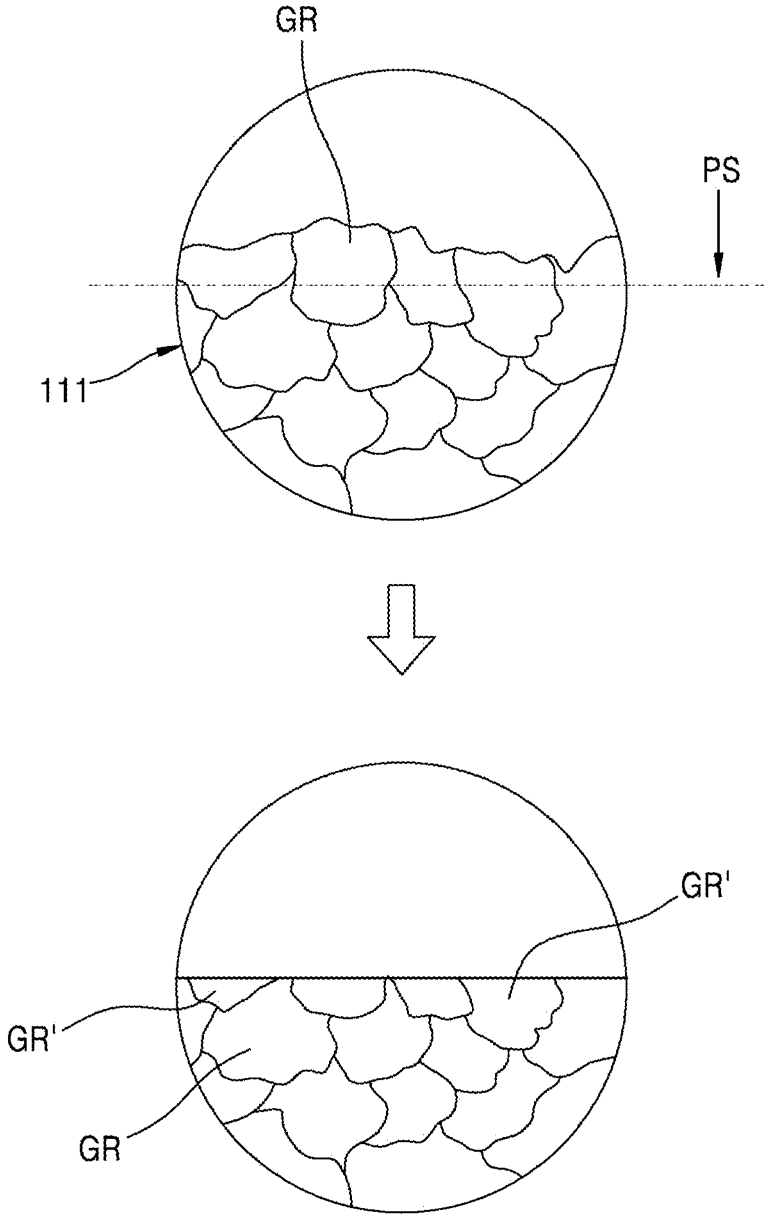
FIG. 45 is an enlarged schematic side cross-sectional view of area I in (b) of FIG. 41, showing the crystal shape of the metal thin film portion before and after the planarization process according to an embodiment of the present invention.
Figure 46:
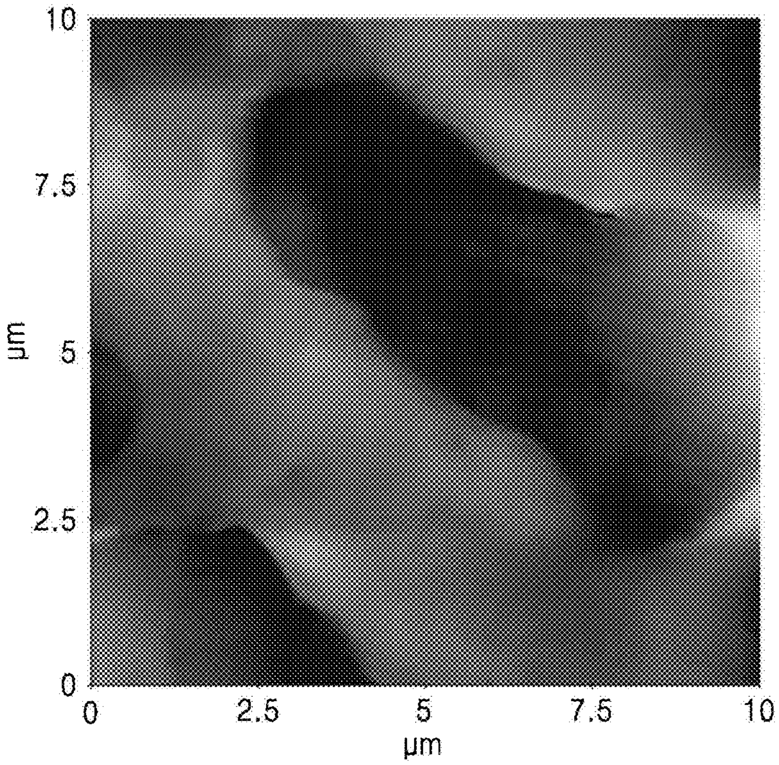
FIG. 46 is a planar microscopic photograph of a metal thin film portion after the planarization process according to an embodiment of the present invention.
Figure 46:
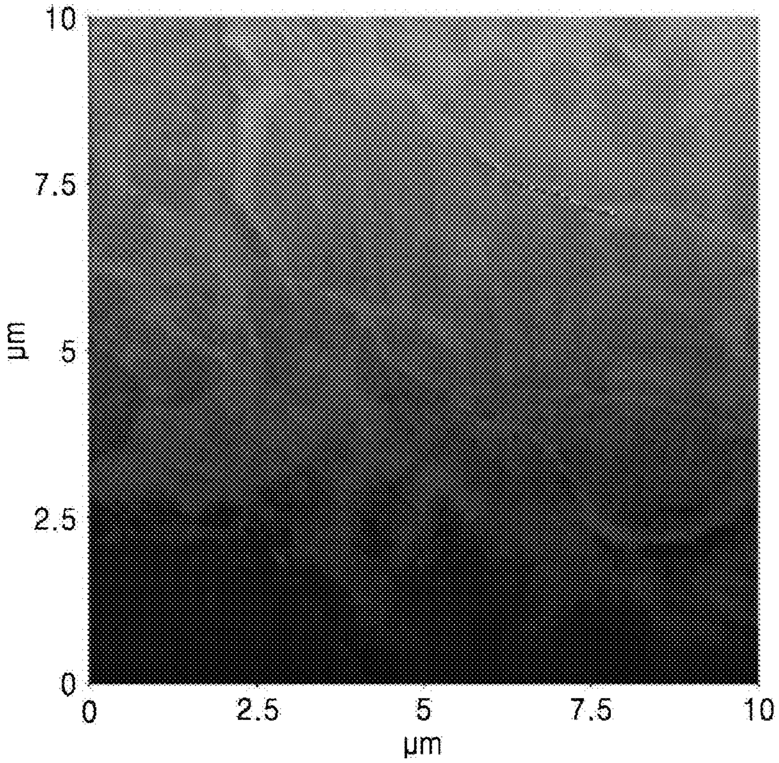

FIG. 45 is an enlarged schematic side cross-sectional view of area I in (b) of FIG. 41, showing the crystal shape of the metal thin film portion before and after the planarization process according to an embodiment of the present invention. FIG. 46 is a planar microscopic photograph of a metal thin film portion after the planarization process according to an embodiment of the present invention. (a) of FIG. 46 shows a Z-axis height difference map (Z-axis step map) observed in AFM mode at −100 to 100 nm, and (b) of FIG. 46 shows a magnetic domain map observed in MFM mode at −10 to 2.5 deg.

Referring to (a) of FIG. 45, as described above with reference to FIG. 42, magnetic domains GR may be formed as crystals within the metal thin film portion 111' grow during the heat process H. That is, the presence of magnetic domains GR is a result of the heat treatment of the metal thin film portion 111' and may distinguish the metal thin film portion from a plated film formed by ordinary electroforming alone. Additionally, the present invention may perform a planarization PS process after heat treatment H.

Referring to (b) of FIG. 45, as the upper portion of the metal thin film portion 111' becomes flat due to the planarization PS process, the magnetic domains GR' on the upper surface (the third surface S3) of the metal thin film portion 111' may also have a flat upper shape. Specifically, magnetic domains typically have irregular three-dimensional shapes, but as the upper portion becomes flat, they may have a three-dimensional shape that includes at least one horizontal side surface. The surface roughness Ra of the upper portion of the metal thin film portion 111' may also be controlled after the planarization PS process. The surface of the upper portion of the metal thin film portion 111' may have high roughness due to fine irregularities resulting from electroforming and heat treatment. However, after the planarization PS process, such as polishing, the surface roughness Ra may be reduced. Preferably, the surface roughness Ra may be less than 0.1 μm, and the surface roughness Rz may be less than 1.0 μm.

Referring to FIG. 46, magnetic domains GR' may be observed on the surface of the upper portion of the metal thin film portion 111'. The size of the magnetic domains GR' is on the scale of several micrometers, preferably around 1 μm, and can be observed depending on the grain size and orientation.

In addition, patterns such as ripples, stripes, and wrinkles may be observed in the magnetic domains GR', which appear to indicate the formation of patterns during the process where crystals with N and S poles are created by electroforming.

Figure 47:
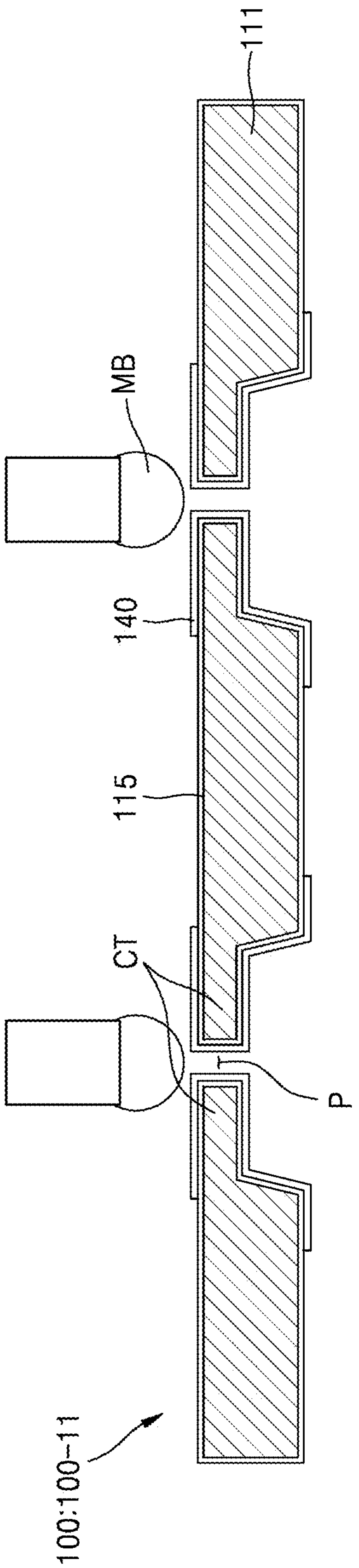
FIG. 47 illustrates a schematic diagram showing a semiconductor test device according to an eleventh embodiment.

FIG. 47 illustrates a schematic diagram showing a semiconductor test device 100 (100-11) according to an eleventh embodiment of the present invention.

Referring to FIG. 47, a semiconductor test device 100 (100-11) with a cantilever portion CT formed on a metal thin film portion 111, as described above with reference to FIG. 37, is shown. An insulating layer portion 115 may be formed on the surface of the cantilever portion CT, and a conductive thin film layer 140 may be formed on top of it.

The conductive thin film layer 140 may be formed on a side surface of an aperture pattern P. In addition, as shown in (c) of FIG. 21, the conductive thin film layer 140 may be further formed not only on the side surface of the aperture pattern P but also around the top and bottom of the aperture pattern P. A micro bump MB may come into contact with the conductive thin film layer 140 at the top of the aperture pattern P, enabling electrical connection from the top to the bottom of the aperture pattern P.

Figure 48:
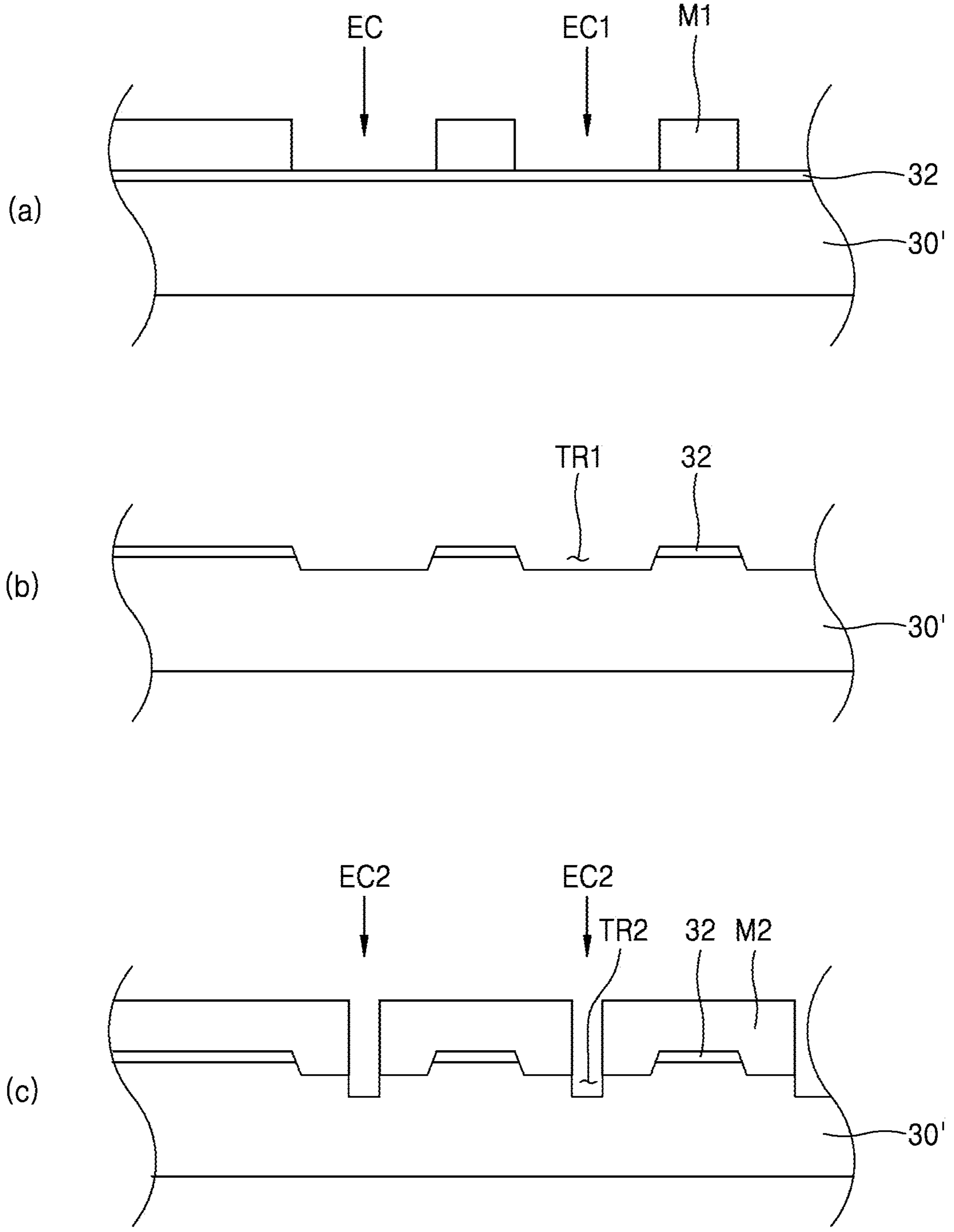
FIGS. 48 to 50 illustrate schematic diagrams showing a manufacturing process of a semiconductor test device according to the eleventh embodiment of the present invention.
Figure 49:
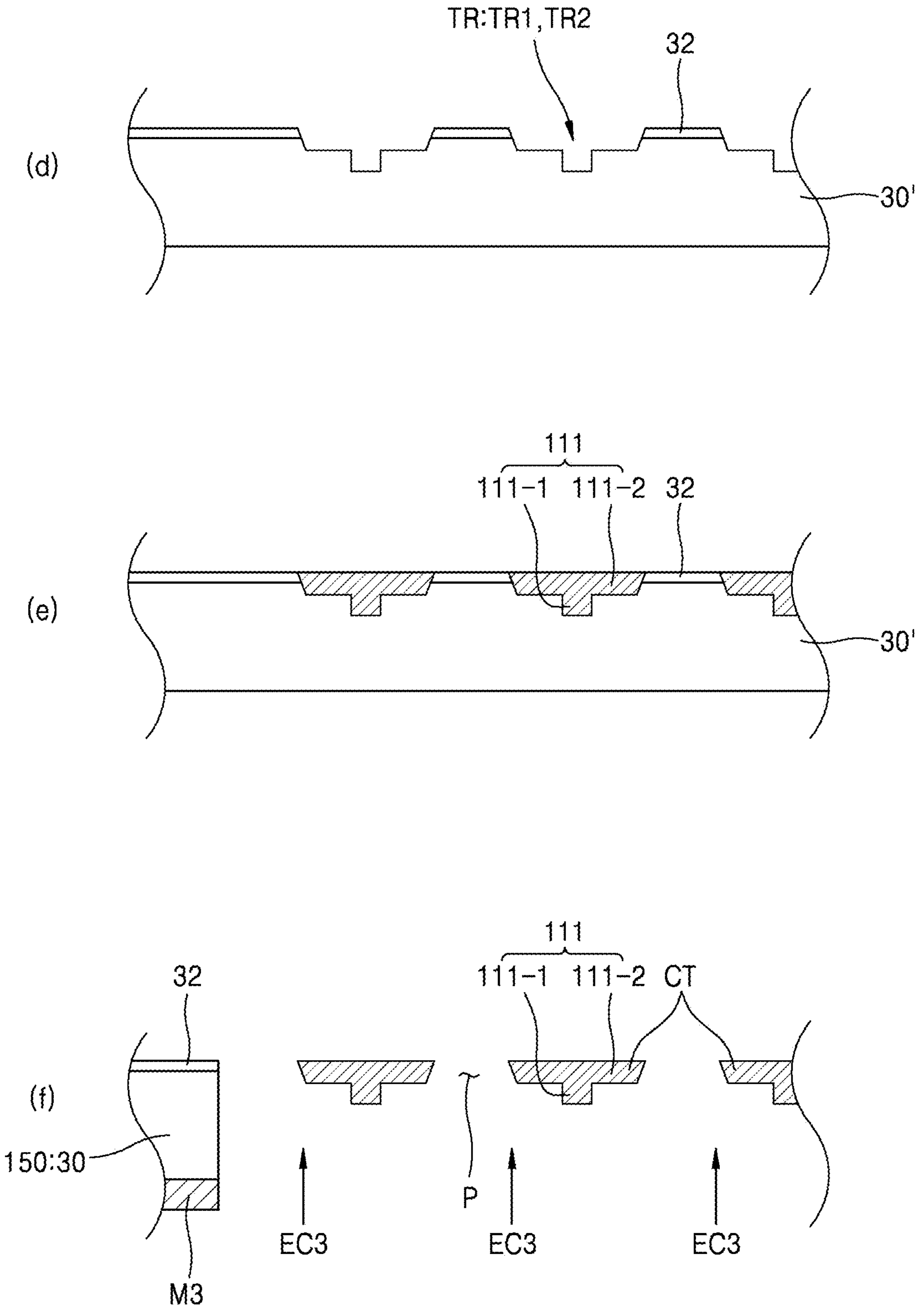
Figure 50:
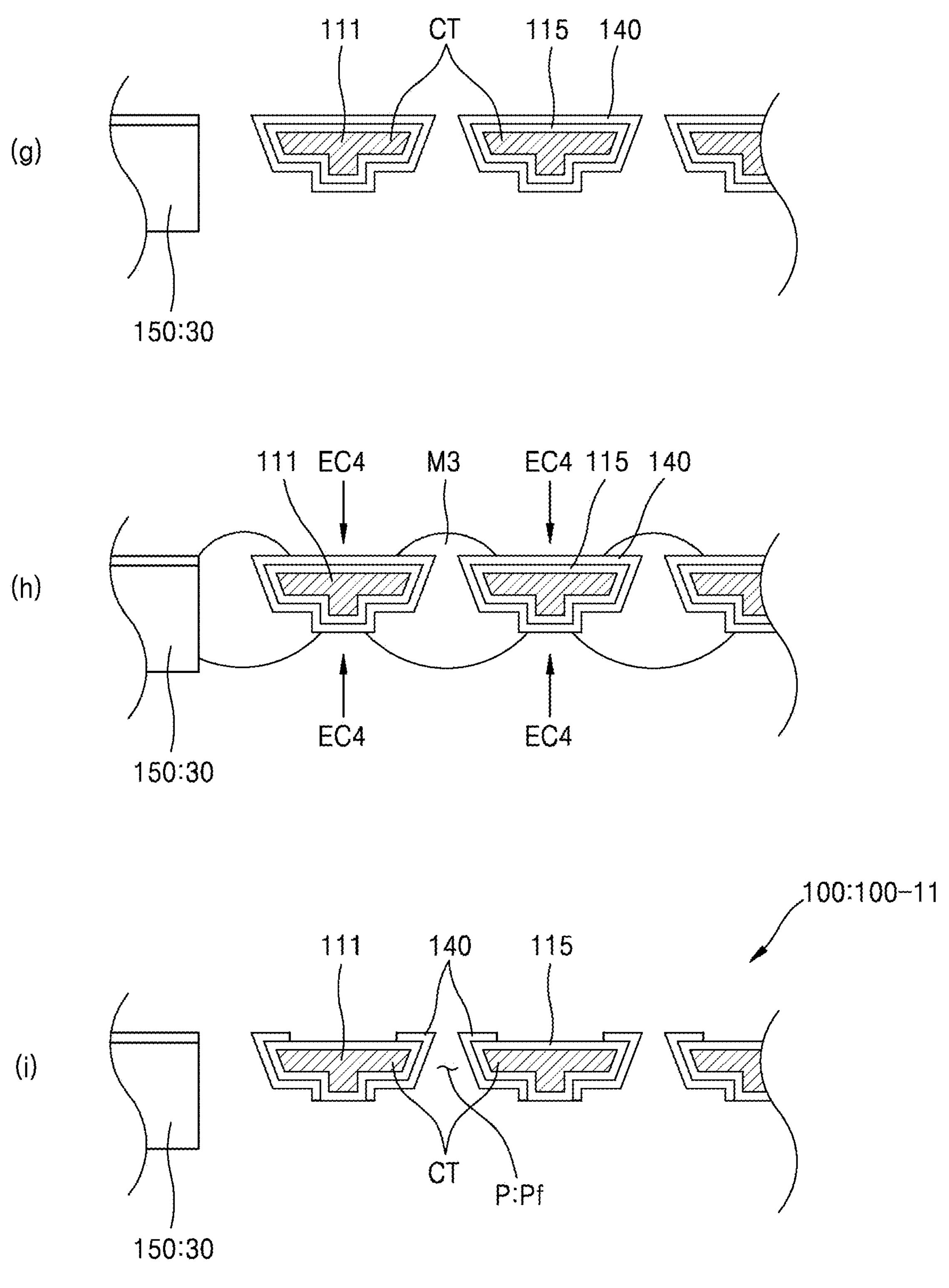

FIGS. 48 to 50 illustrate schematic diagrams showing a manufacturing process of the semiconductor test device 100 (100-11) according to the eleventh embodiment of the present invention.

Referring to (a) of FIG. 48, a support 30' is prepared. The support 30' may be made of a conductive material to enable electroforming. To achieve both conductivity and low resistance, the support 30' (or a conductive substrate 30') may be highly doped at a concentration higher than or equal to $10^{19}$ $cm^{-3}$. The doping may be performed over the entire support 30' or on only the surface of the support 30'. According to one embodiment, the surface resistance of the support 30' may be $5\times10^{-4}$ to $1\times10^{-2}$ ohm cm. The support 30' may be used as a cathode electrode during electroforming.

If the support 30' is made of silicon, a silicon oxide layer 32 may be formed on one surface.

Then, a patterned first insulating portion M1 may be formed on one surface of the support 30'. Then, a first etching EC1 may be performed on a surface of the support 30' exposed between patterns of the first insulating portion M1. Dry etching or wet etching may be used for the first etching EC1, but dry etching, which has anisotropic characteristics and can clearly reveal a desired shape, may be considered.

Then, referring to (b) of FIG. 48, a first trench portion TR1 recessed into a first surface (or upper surface) of the support 30' may be formed by the first etching EC1. A depth h of the first trench portion TR1 may approximately correspond to the thickness of the metal thin film portion 111 to be formed. For example, the depth h of the trench portion TR may be approximately 5 to 50 μm. Both ends of the first trench portion TR1 may serve as spaces where the cantilever portion CT is to be formed.

Next, referring to (c) of FIG. 48, a patterned second insulating portion M2 may be formed on one surface of the support 30' and on the first trench portion TR1. Subsequently, a second etching EC2 may be performed on the surface of the first trench portion TR1 exposed between patterns of the second insulating portion M2. The second etching EC2 may be performed using wet or dry methods, but dry etching, which has anisotropic etching characteristics and can clearly reveal the desired shape, may be considered.

Next, referring to (d) of FIG. 49, a second trench portion TR2, recessed with a narrower width than the first trench TR1, may be formed on the first trench portion TR1 through the second etching EC2. Together, the first and second trench portions TR1 and TR2 may constitute a trench portion TR.

Next, referring to (e) of FIG. 49, electroforming may be performed on the support 30' to form a metal thin film portion 111. The metal thin film portion 111 (111-1 and 111-2) may be formed within the trench portion TR (TR1 and TR2). A first metal thin film portion 111-1 may fill the second trench portion TR2, and a second metal thin film portion 111-2 may be further formed on the first metal thin film portion 111-1 while filling the first trench portion TR1.

Meanwhile, after forming the metal thin film portion 111, the heat treatment H process described above with reference to in FIG. 29 or the planarization PS process on the portion of the metal thin film portion 111 exceeding the height of the support 30' as described above with reference to FIG. 30 may be applied. Although the following description omits the connection portion 40 for convenience of explanation, if the heat treatment H process is performed, the connection portion 40 may be formed between the metal thin film portion 111 and the support 30'.

Next, referring to (f) of FIG. 49, the support 30' may be subjected to a third etching EC3. The third etching EC3 may be performed on a second surface (lower surface) opposite to the first surface (upper surface) of the support 30' to which the metal thin film portion 111 is connected. The third etching EC3 may be performed on the portion corresponding to the cell portion C, excluding the edge portion. Optionally, a thickness reduction process may be performed on the entire lower surface or the central part of the support 30' before the third etching EC3. Once the third etching EC3 of the support 30' exposed between the patterns of a third insulating portion M3 is completed, the support 30 may take the form of providing a hollow region R with only the edge portion remaining. The remaining edge portion is provided as the holder portion 150 (30), and a connected structure in which the metal thin film portion 111 and the holder portion 150 (30) are integrally connected may be provided.

A space between the patterns of the metal thin film portion 111 from which the support 30 has been removed may be provided as the aperture pattern P. The metal thin film portion 111 may provide cantilever portions CT on both sides of the pattern. The parts of the second metal thin film portion 111-2 protruding on both sides over the first metal thin film portion 111-1 may serve as the cantilever portions CT.

Meanwhile, heat treatment may be performed prior to etching the lower surface of the support 30'. Through the heat treatment, the metal thin film portion 111 and the support 30' maybe connected. The heat treatment process and the connection portion are the same as described with reference to FIG. 29.

Next, referring to (g) of FIG. 50, an insulating layer portion 115 may be formed on the metal thin film portion 111. Subsequently, a conductive thin film layer 140 may be further formed on the insulating layer portion 115 using plating or other thin-film formation methods.

Next, referring to (h) of FIG. 50, a fourth insulating portion M4, such as PR, may be formed in the area corresponding to the aperture pattern P. Then, a fourth etching EC4 may be performed to etch away the exposed portions of the conductive thin film layer 140 to leave the areas covered by the fourth insulating portion M4.

Next, referring to (i) of FIG. 50, after the fourth etching EC4, only the conductive thin film layer 140 around the perimeter of the aperture pattern P may remain. In other words, in the semiconductor test device 100 (100-11), the conductive thin film layer 140 may be formed only on the surface of the cantilever portion CT.

Figure 51:
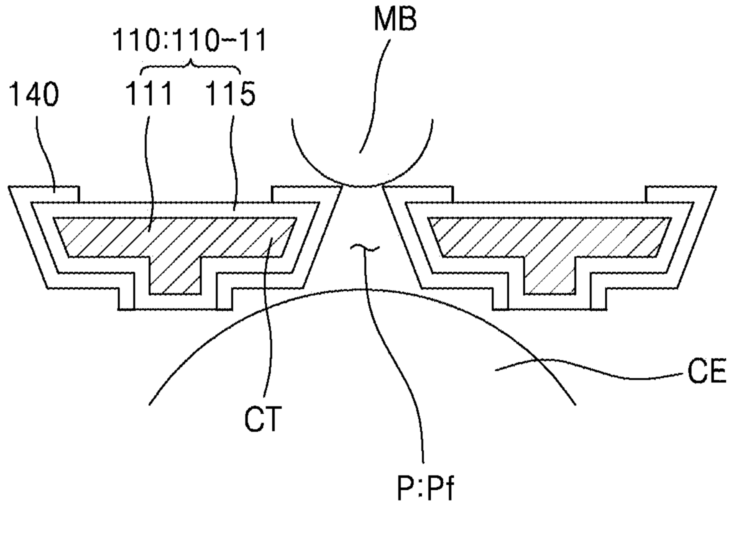
FIG. 51 illustrates a schematic diagram showing how to test an electrical connection by applying the semiconductor test device in accordance with the eleventh embodiment of the present invention.

Meanwhile, when manufacturing the semiconductor test device 100 (100-11) according to the eleventh embodiment, instead of the processes shown in FIGS. 49 to 51, the processes shown in FIGS. 26 to 37 may also be applied, with only the formation position of the conductive thin film layer 140 being different.

FIG. 51 illustrates a schematic diagram showing how to test an electrical connection by applying the semiconductor test device in accordance with the eleventh embodiment of the present invention.

Referring to FIG. 51, each of the aperture patterns P formed in a membrane portion 110 (110-11) may correspond one-to-one to micro bumps MB (MB2) on the lower portion of the stacked semiconductor memory 15 (or a semiconductor memory). On the opposite side, since the width of the aperture pattern P is relatively wide, the connection electrode CE of the interposer 13' or similar components may be allowed to be guided along the tapered sides and make contact with the conductive thin film layer 140. Since the conductive thin film layer 140 is formed on the cantilever portion CT, which protrudes in a cantilever form, the micro bump MB/connection electrode CE may elastically contact the upper and lower surfaces. With a large space created by the cantilever portion CT positioned above and below the aperture pattern P, elastic contact can be more easily achieved.

According to one embodiment, the width of the aperture pattern may be approximately 10 μm, the width of the cantilever portion CT approximately 8 to 10 μm, the thickness of the cantilever portion CT approximately 3 to 5 μm, and the thickness of the metal thin film portion 111, excluding the cantilever portion CT, approximately 10 μm.

Figure 52:
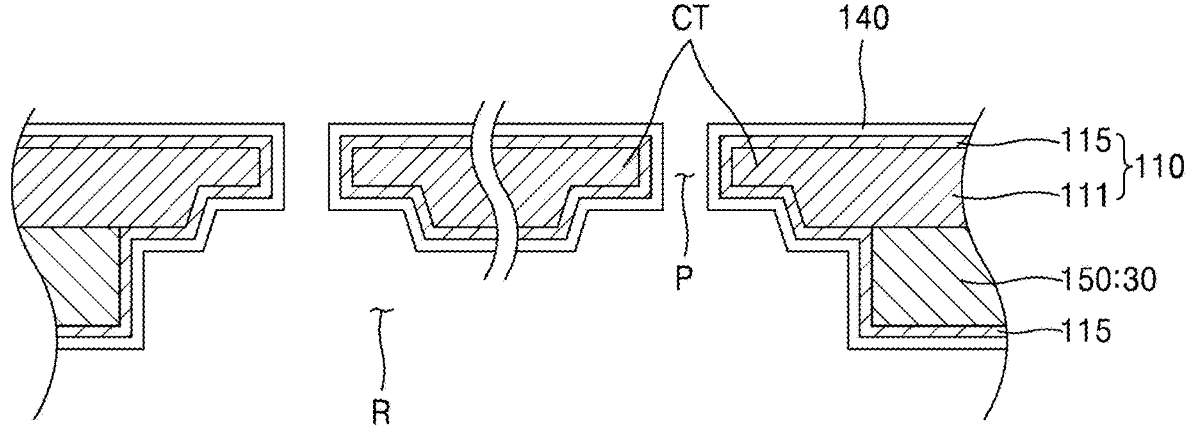
FIGS. 52 to 54 illustrate schematic diagrams showing a manufacturing method of a semiconductor test device according to a twelfth embodiment of the present invention.
Figure 52:
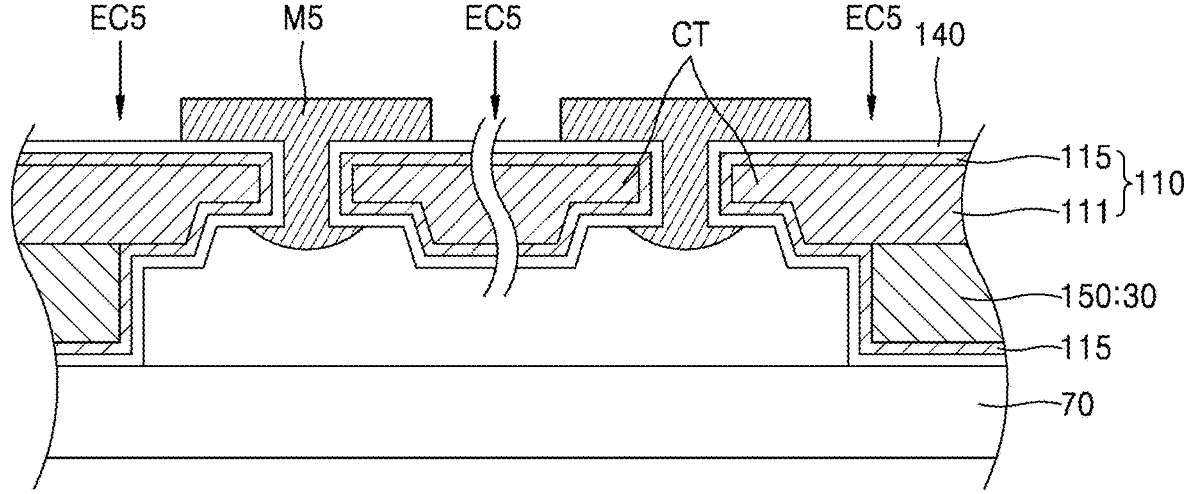
Figure 53:
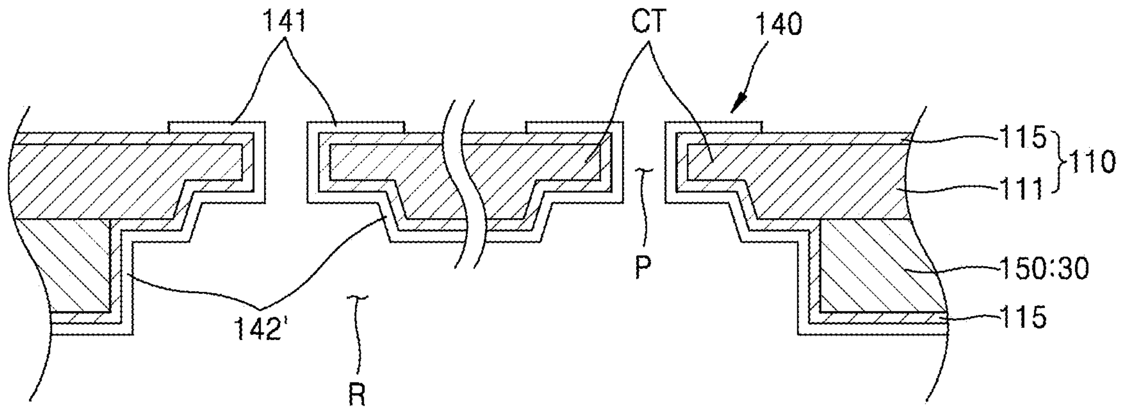
Figure 53:
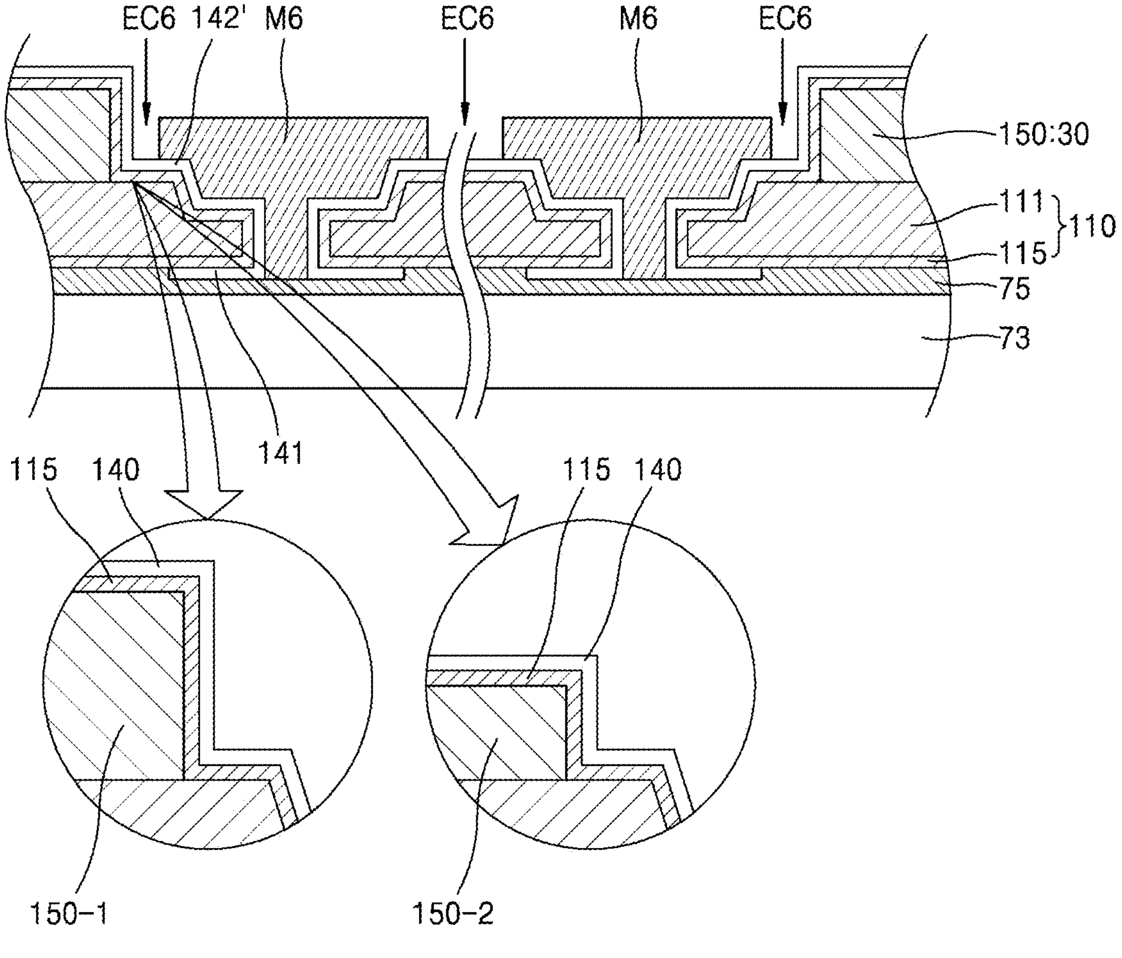
Figure 54:
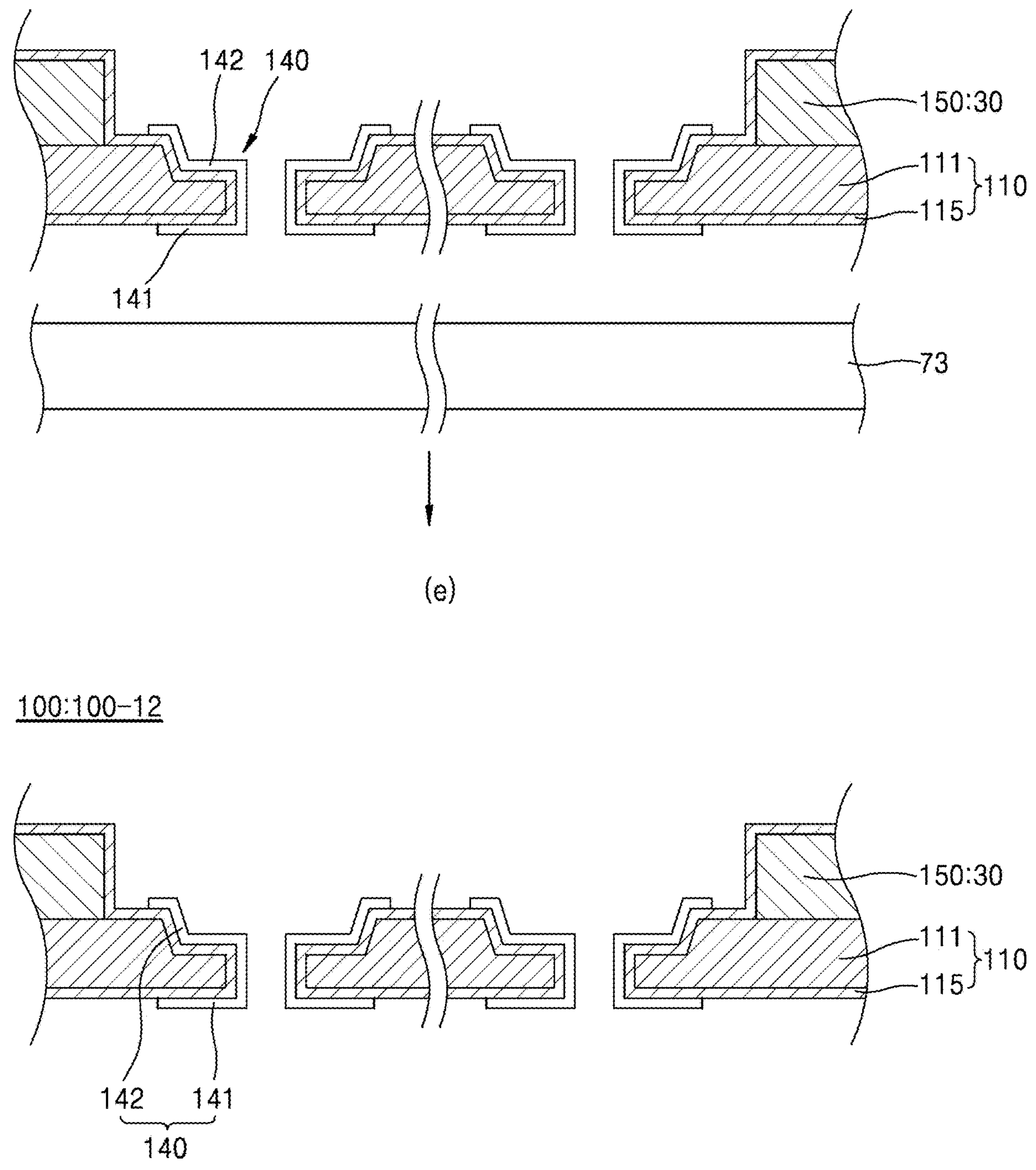

FIGS. 52 to 54 illustrate schematic diagrams showing a manufacturing method of a semiconductor test device 100 (100-12) according to a twelfth embodiment of the present invention.

In the following, description is given of a manufacturing method of a semiconductor test device, specifically detailing step (h) of FIG. 50 described above. A process of forming an insulating portion, which serves as an etch-resistant pattern (or etch-resistant layer), on the upper surface of the membrane portion 110 and a process of forming an insulating portion, also serving as an etch-resistant pattern (or etch-resistant layer), on the lower surface of the membrane portion 110 are each performed to form a conductive thin-film layer 140 corresponding to each aperture pattern P.

The process following the step of preparing a connected structure, in which the membrane portion 110 with a plurality of aperture patterns, and the holder portion 150 (30) are connected by forming the insulating layer portion 115 on the metal thin film portion 111, as described in step (g) of FIG. 50, will now be described.

First, referring to (a) of FIG. 52, a conductive thin film layer 140 may be formed on at least the surface of the membrane portion 110. The conductive thin film layer 140 may be formed on the membrane portion 110 or the insulating layer portion 115 using plating, deposition, or other thin-film formation methods. The conductive thin film layer 140 may also be formed on the surface of the holder portion 150 (30) in addition to the membrane portion 110.

Next, referring to (b) of FIG. 52, a first etch-resistant pattern M5 (or a fifth insulating portion M5) may be formed on the upper surface (first surface) of the membrane portion 110 in the aperture pattern P. Hereinafter, the upper surface of the membrane portion 110, as illustrated in (b) of FIG. 52, is referred to as the "first surface," and the lower surface is referred to as a "second surface." After coating the upper surface of the membrane portion 110 with a photoresist or similar material, the first etch-resistant pattern M5 may be formed through an exposure/development process. The position of the first etch-resistant pattern M5 formed on the upper surface of the membrane portion 110 may correspond to the conductive thin film layer 140 (141) that will remain later (see (c) of FIG. 53). That is, the position of the first etch-resistant pattern M5 formed on the upper surface (first surface) of the membrane portion 110 may correspond to the conductive thin film layer 140 (141) that is further formed in the horizontal direction at the top of the side surface of the aperture pattern P.

Subsequently, etching EC5 (or fifth etching EC5) may be performed in one direction on the upper surface (first surface) of the membrane portion 110 to etch exposed portions of the conductive thin film layer 140, excluding the areas covered by the first etch-resistant pattern M5 (or fifth insulating portion M5).

Meanwhile, optionally, a template 70 may be placed beneath the connected structure of the membrane portion 110 and the holder portion 150 to prevent unintended etching on the lower surface (second surface) of the membrane portion 110. The template 70, provided in a broad plate shape, supports the holder portion 150 while simultaneously preventing an etchant solution from penetrating in the direction of the aperture pattern P through the hollow region R of the holder portion 150, thereby ensuring that the etching process is carried out only on the upper surface of the membrane portion 110. On the other hand, if the etching process can be performed on the upper surface of the membrane portion 110 without using the template 70, the template 70 may not be used.

Next, referring to (c) of FIG. 53, the first etch-resistant pattern M5 (or fifth insulating portion M5) may be removed. On the upper surface (first surface) of the membrane portion 110, the conductive thin film layer 140 may remain as a conductive thin-film layer 141 that is further formed in the horizontal direction at the top of the side surface of the aperture pattern P. On the other hand, as no etching is performed on the lower surface (second surface) of the membrane portion 110, a conductive thin film layer 142' on the lower surface (second surface) of the membrane portion 110 may remain intact, covering the surface of the lower surface (second surface) of the membrane portion 110.

Next, referring to (d) of FIG. 53, after flipping the connected structure of the membrane portion 110 and the holder portion 150, a second etch-resistant pattern M6 (or a sixth insulating portion M6) may be formed on the lower surface (second surface) of the membrane portion 110 in the aperture pattern P. After coating the lower surface (second surface) of the membrane portion 110 with a photoresist or similar material, the second etch-resistant pattern M6 may be formed through an exposure/development process. The position of the second etch-resistant pattern M6 formed on the membrane portion 110 may correspond to the conductive thin film layer 140 (142) that will remain later (see (e) of FIG. 54). That is, the position of the second etch-resistant pattern M6 formed on the lower surface (second surface) of the membrane portion 110 may correspond to the conductive thin film layer 140 (142) that is further formed in the horizontal direction at the bottom of the side surface of the aperture pattern P.

Subsequently, etching EC6 (or sixth etching EC6) may be performed in one direction on the lower surface (second surface) of the membrane portion 110 to etch exposed portions of the conductive thin film layer 140, excluding the areas covered by the second etch-resistant pattern M6 (or fifth insulating portion M6).

Meanwhile, optionally, a second template 73 may be placed on the upper surface (first surface) of the membrane portion 110 to prevent unintended etching on the upper surface (first surface) of the membrane portion 110. After step (c) in FIG. 53, the connected structure of the membrane portion 110 and the holder portion 150 may be flipped and supported by the second template 73. Alternatively, the second template 73 may be adhered to the upper surface (first surface) of the membrane portion 110 without flipping the connected structure of the membrane portion 110 and the holder portion 150.

The template 70 or the second template 73 may be made of a material that allows the transmission of lasers, light for exposure of the etch-resistant pattern, or the like. A Material for the template 70 and/or the second template 73 may include glass, silica, quartz, alumina ($Al_2O_3$), borosilicate glass, zirconia, or the like.

The upper surface (first surface) of the membrane portion 110 and the second template 73 may be adhered to each other via a temporary adhering portion 75 interposed therebetween. The temporary adhering portion 75 may use a dry film resist layer (DFR layer), which may be provided as a film-type photoresist. Alternatively, the temporary adhering portion 75 may use liquid wax or liquid photoresist. However, using a dry film resist layer allows adhesion to be performed at low temperatures of approximately 60° C. or below and achieves both adhesion and etch-resistant pattern formation without requiring the use of a liquid wax layer and a liquid photoresist layer. Therefore, using a dry film resist layer as the temporary adhering portion 75 may be more preferably considered.

Meanwhile, the holder portion 150 (30) may have a thickness reduced to 100 μm to 300 μm. The process of reducing the thickness of the holder portion 150 (30) may be performed 1) during the formation of the connected structure of the membrane portion 110 and the holder portion 150 (30), 2) before forming the conductive thin film layer 140 on the surface of the membrane portion 110 in (a) of FIG. 52, or 3) between processes (c) and (d) of FIG. 53.

As shown in the enlarged view on the right side of (d) of FIG. 53, using a relatively thin holder portion 150-2 with a thickness of 100 μm to 300 μm may facilitate etching of the exposed portion of the conductive thin-film layer 140, excluding the areas covered by the second etch-resistant pattern M6 (or sixth insulating portion M6). If the holder portion 150 (30) is too thick, it may make the formation of the second etch-resistant pattern M6 (or sixth insulating portion M6), as well as a masking process for exposure/development, difficult. Additionally, a thicker second etch-resistant pattern M6, such as a photoresist pattern, may be required, resulting in inconvenience. Therefore, it is preferable to reduce the thickness. Of course, if there are no issues with the smooth formation of the second etch-resistant pattern M6, a holder portion 150 (30) without reduced thickness, as shown in the enlarged view on the left side of (d) of FIG. 53, may also be used.

Next, referring to (e) of FIG. 54, the second etch-resistant pattern M6 (or sixth insulating portion M6) may be removed. On the lower surface (second surface) of the membrane portion 110, the conductive thin film layer 140 may remain as a conductive thin-film layer (142'→142) that is further formed in the horizontal direction at the bottom of the side surface of the aperture pattern P.

After the conductive thin film player 142 is formed, the second template 73 may be separated (debonded) from the membrane portion 110. The separation (debonding) of the second template 73 may be performed by applying at least one of heat, chemical treatment, ultrasonic waves, or UV to the temporary adhering portion 75. For example, when at least one of heat, chemical treatment, ultrasonic waves, or UV is applied to the temporary adhering portion 75, which is a dry film resist layer, the adhesive strength between the second template 73 and the membrane portion 110 weakens, allowing the second template 73 to be debonded.

Next, referring to (f) of FIG. 54, in the semiconductor test device 100 (100-12), the conductive thin film layer 141 may remain not only on the side surface of the aperture pattern P, but also extend horizontally from the top of the side surface of the aperture pattern P. In addition, the conductive thin film layer 142 may remain extending horizontally from the bottom of the side surface of the aperture pattern P. Since each unit of the interconnected conductive thin-film layer 140 is formed spaced apart for each aperture pattern P, the aperture patterns P may be mutually insulated.

Figure 55:
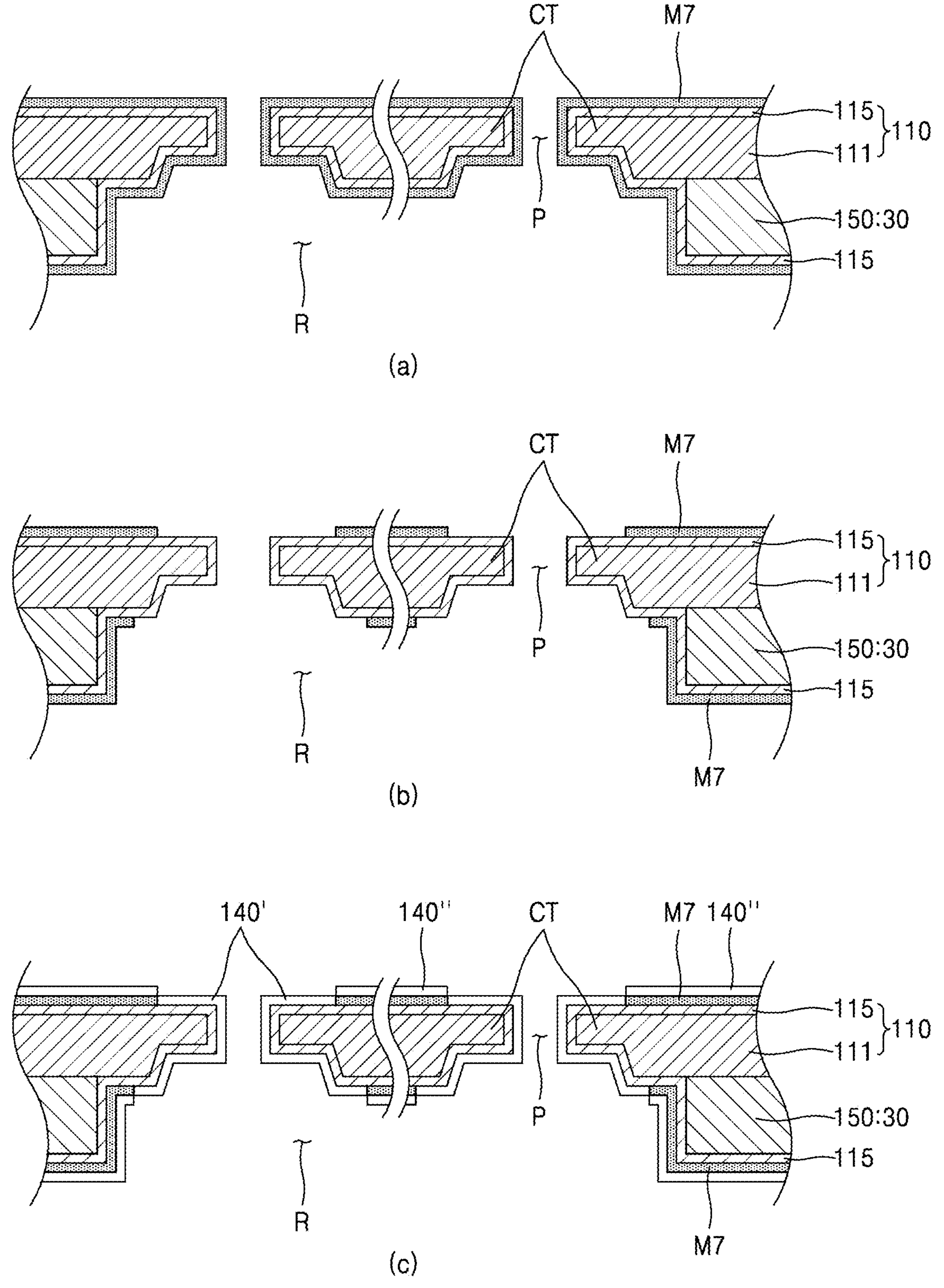
FIGS. 55 to 56 illustrate schematic diagrams showing another manufacturing method of the semiconductor test device in accordance with the twelfth embodiment of the present invention.
Figure 56:
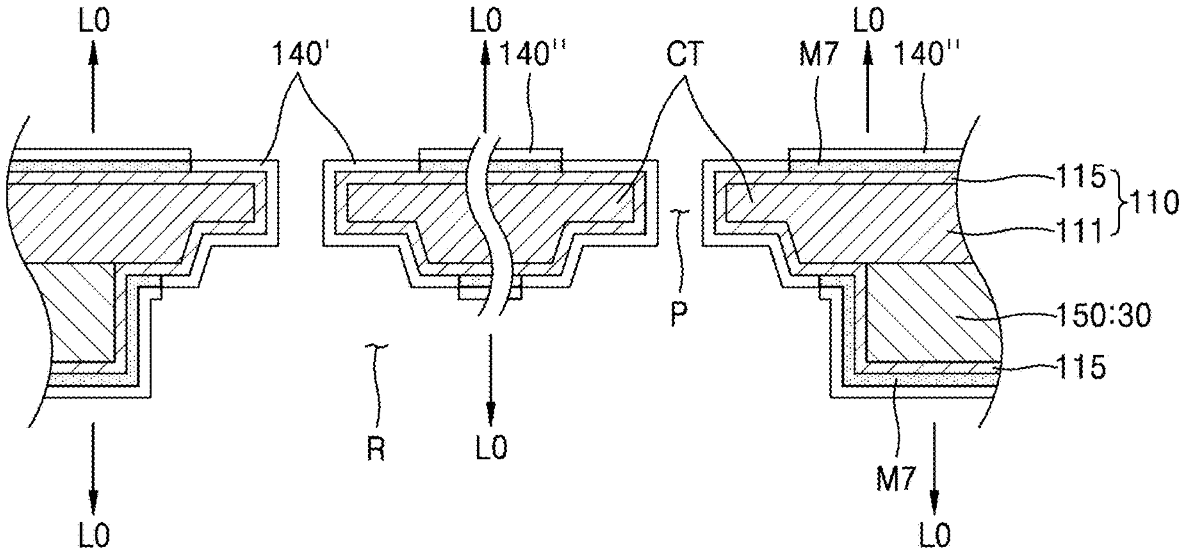
Figure 56:
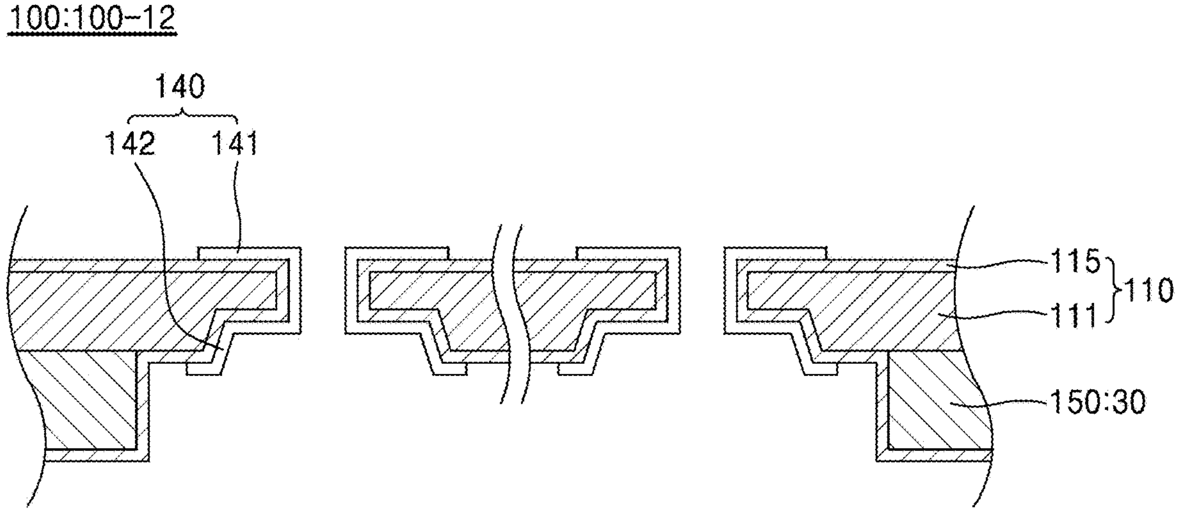

FIGS. 55 to 56 illustrate schematic diagrams showing another manufacturing method of the semiconductor test device in accordance with the twelfth embodiment of the present invention. Hereinafter, descriptions of configurations identical to the manufacturing process of the conductive thin film layer 140 described above with reference to FIGS. 52 to 54 will be omitted, and only the differences will be explained. The process following the step of preparing a connected structure, in which the membrane portion 110 with a plurality of aperture patterns, and the holder portion 150 (30) are connected by forming the insulating layer portion 115 on the metal thin film portion 111, as described in step (g) of FIG. 50, will now be described.

First, referring to (a) of FIG. 55, a sacrificial layer M7 (or an etch-resistant layer M7 or a seventh insulating portion M7) such as photoresist or the like may be formed on the surface of the membrane portion 110. The sacrificial layer M7 may also be formed on the surface of the holder portion 150 (30) in addition to the membrane portion 110.

Next, referring to (b) of FIG. 55, a part of the sacrificial layer M7 may be patterned through an exposure/development process. The sacrificial layer M7 (or etch-resistant layer M7 or seventh insulating portion M7) may be left only in areas outside the regions where the conductive thin film layer 140 is to be formed.

Next, referring to (c) of FIG. 55, a conductive thin film layer 140 (140' and 140") may be formed on the surface of the membrane portion 110 and the sacrificial layer M7. The conductive thin film layer formed on the surface of the membrane portion 110 is denoted as 140', and the conductive thin film layer formed on the sacrificial layer M7 is denoted as 140". The conductive thin film layer 140 may be formed on the membrane portion 110 and the sacrificial layer M7 using plating, deposition, or other thin-film formation methods. The conductive thin film layer 140 may also be formed on the surface of the holder portion 150 (30) in addition to the membrane portion 110.

Next, referring to (d) of FIG. 56, the sacrificial layer M7 may be removed. If the sacrificial layer M7 is removed using a lift-off (LO) method, the conductive thin film layer 140" on the sacrificial layer M7 may also be lifted off and removed.

Next, referring to (e) of FIG. 56, in the semiconductor test device 100 (100-12), the conductive thin film layer 141 may remain not only on the side surface of the aperture pattern P, but also extend horizontally from the top of the side surface of the aperture pattern P. In addition, the conductive thin film layer 142 may remain extending horizontally from the bottom of the side surface of the aperture pattern P. Since each unit of the interconnected conductive thin-film layer 140 is formed spaced apart for each aperture pattern P, the aperture patterns P may be mutually insulated.

Figure 57:
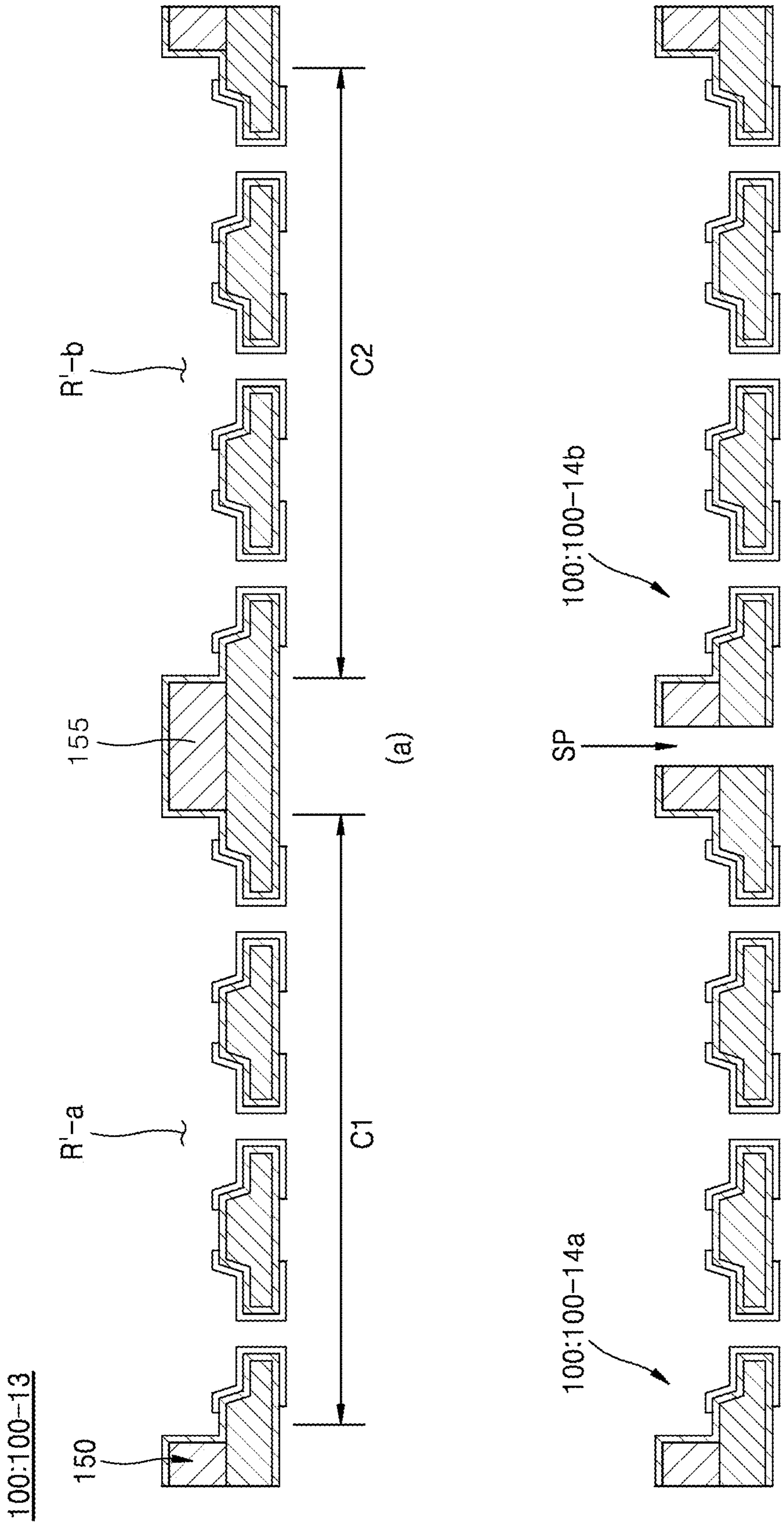
FIG. 57 illustrates schematic diagrams showing the forms of semiconductor test devices according to thirteenth to fourteenth embodiments of the present invention.

FIG. 57 illustrates schematic diagrams showing the forms of semiconductor test devices according to thirteenth to fourteenth embodiments of the present invention.

Referring to (a) of FIG. 57, a semiconductor test device 100 (100-13) is configured similarly to the semiconductor test device in FIGS. 54 and 56, with a conductive thin-film layer 140, 141, and 142 formed on the side surfaces of the aperture pattern P. The semiconductor test device 100 (100-13) may provide a plurality of hollow regions R (R'-a and R'-b) (or a plurality of cell portions C1 and C2). For convenience, (a) of FIG. 57 shows two hollow regions R (R'-a and R'-b) or two cell portions C1 and C2, but more may be included. The plurality of hollow regions R may be arranged in the X-axis and Y-axis directions on a horizontal plane.

The size (horizontal area) of each hollow region R' (R'-a and R'-b) may correspond to the size of a single stacked semiconductor memory 15, which is several millimeters to several tens of millimeters in width and height. In addition to a holder portion 150 being disposed at the edge of the semiconductor test device 100 (100-13) to partition each hollow region R', grid portions 155 with a thickness corresponding to the holder portion 150 may be formed in the central part of the semiconductor test device 100 (100-13), dividing the hollow region R' into multiple sections. As a result, the semiconductor test device 100 (100-13) may test multiple semiconductor memories simultaneously.

In another example, referring to (b) of FIG. 57, cutting SP may be performed on the semiconductor test device 100 (100-13) shown in (a) of FIG. 57. Through the cutting SP of the grid portion 155, the semiconductor test device 100 (100-13) may be divided into multiple semiconductor test devices 100 (**100-14*a* and 100-14*b*). Each of the semiconductor test devices 100 (100-14*a* and 100-14*b*) may be used to test a semiconductor memory. Therefore, the present invention has the advantage of enabling the mass production of multiple semiconductor test devices 100 (100-14*a* and 100-14*b***).

Figure 58:
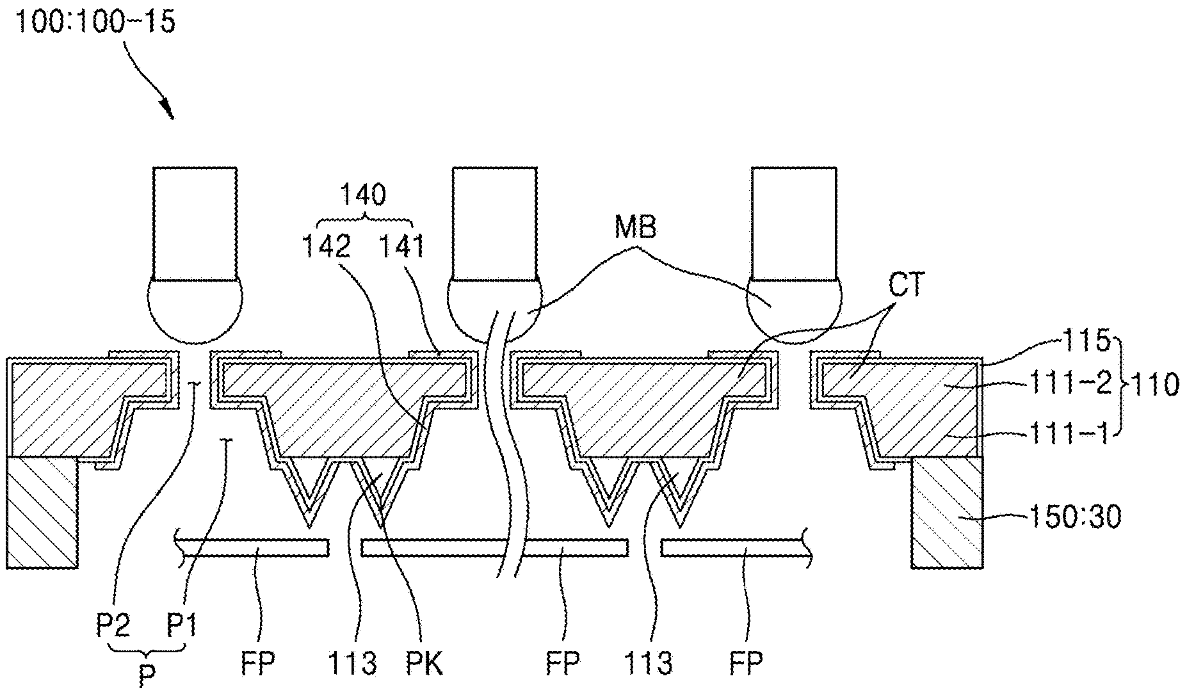
FIG. 58 illustrates a schematic diagram showing a semiconductor test device according to a fifteenth embodiment of the present invention.

FIG. 58 illustrates a schematic diagram showing a semiconductor test device 100 (100-15) according to a fifteenth embodiment of the present invention.

Referring to FIG. 58, a semiconductor test device 100 (100-15) according to the fifteenth embodiment of the present invention is configured similarly to the semiconductor test device in FIGS. 54 and 56, with a conductive thin-film layer 140, 141, and 142 formed on the side surfaces of an aperture pattern P. Optionally, a holder portion 150 may be connected onto the edge of a membrane portion 110.

The membrane portion 110 may include a plurality of aperture patterns P. The membrane portion 110 may include a metal thin film portion 111 and the metal thin film portion 111 may have a cantilever portion CT formed thereon. An insulating layer portion 115 may be formed on the surface of the cantilever portion CT, and the conductive insulating layer 140 may be formed thereon.

A micro bump MB having a rounded shape is easily brought into elastic contact with the conductive thin film layer 140 of the cantilever portion CT protruding in a cantilever form. Since the micro bump MB has a rounded surface, part of it may be accommodated within the aperture pattern P, enabling stable contact with the conductive thin film layer 140. However, a flat pad FP, which has a flat shape rather than a rounded one and a width larger than that of the aperture pattern P, may result in unstable contact with the conductive thin film layer 140. Therefore, unlike the micro bump MB, the flat pad FP may require a structure that enables the semiconductor test device to approach and establish stable contact.

To facilitate contact with the flat pad FP, a contact protrusion portion 113 may be further formed on the lower surface of the metal thin film portion 111. The metal thin film portion 111 may include a first metal thin film portion 111-1 at its lower part and a second metal thin film portion 111-2 at its upper part, and the contact protrusion portion 113 may be formed on the lower surface of the first metal thin film portion 111-1. The first metal thin film portion 111-1 may include a first aperture pattern P1 formed therein, while the second metal thin film portion 111-2 may include a second aperture pattern P2 formed therein. The first and second aperture patterns P1 and P2 may combine to form an aperture pattern P. FIG. 58 illustrates an example in which two contact protrusion portions 113 make contact with the flap pad FP, but the number of contact protrusion portions 113 in contact with the flat pad FP may be one or multiple.

The contact protrusion portion 113 may be formed to protrude downward from the lower surface of the first metal thin film portion 111-1. Neighboring contact protrusion portions 113 may be electrically insulated from each other. The insulating layer portion 115 may be formed on the metal thin film portion 111 and the contact protrusion portion 113 and the conductive thin film layer 140 is formed on the insulating layer portion 115, allowing electrical signals to be transmitted through the conductive thin film layer 140. Since neighboring contact protrusion portions 113 are each covered by different conductive thin film layers 140, the neighboring contact protrusion portions 113 may remain insulated from each other.

Since the contact protrusion portion 113 further protrudes downward from the horizontal plane (lower surface) where the first metal thin film portion 111-1 is formed, it is advantageous for making contact with the flat pad FP.

According to an embodiment, the contact protrusion portion 113 may have a shape with a width decreasing from the top to the bottom thereof. In other words, the part of the contact protrusion portion 113 that is in contact with the first metal thin film portion 111-1 has a wider width, and its width gradually narrows in the downward direction, forming a pointed end. Alternatively, according to another embodiment, at least the lower end of the contact protrusion portion 113 may be narrower than the rest of the contact protrusion portion 113, forming a pointed shape. Accordingly, the contact protrusion portion 113 may have a convex middle portion with a relatively wider width while having a narrower width at the lower end.

A thin oxide film may be naturally formed on the surface of the flat pad FP or micro bump MB. The contact protrusion portion 113, with its pointed lower end, may penetrate the oxide film formed on the surface of the flat pad FP or micro bump MB and establish a close-contact connection with the body of the flat pad FP or micro bump MB, thereby improving electrical conductivity.

In some embodiments, while FIG. 58 illustrates an embodiment in which the metal thin film portion 111 and the contact protrusion portion 113 are directly connected, with the insulating layer portion 115 formed on their surfaces, the insulating layer portion 115 may be formed on the surface of the metal thin film portion 111 and the contact protrusion portion 113 may be further formed on the insulating layer portion 115. In this case, the conductive thin film layer 140 still needs to be formed on the contact protrusion portion 113.

Figure 59:
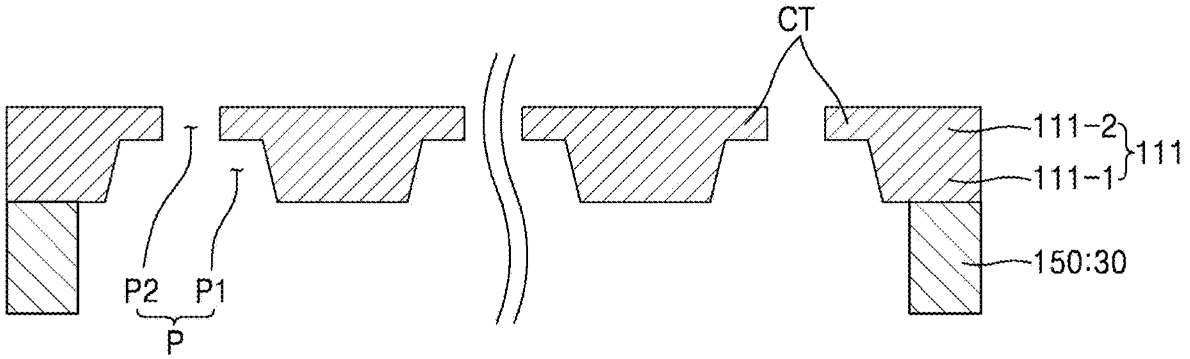
FIGS. 59 to 61 illustrate schematic diagrams showing a manufacturing process of the semiconductor test device in accordance with the fifteenth embodiment of the present invention.
Figure 59:
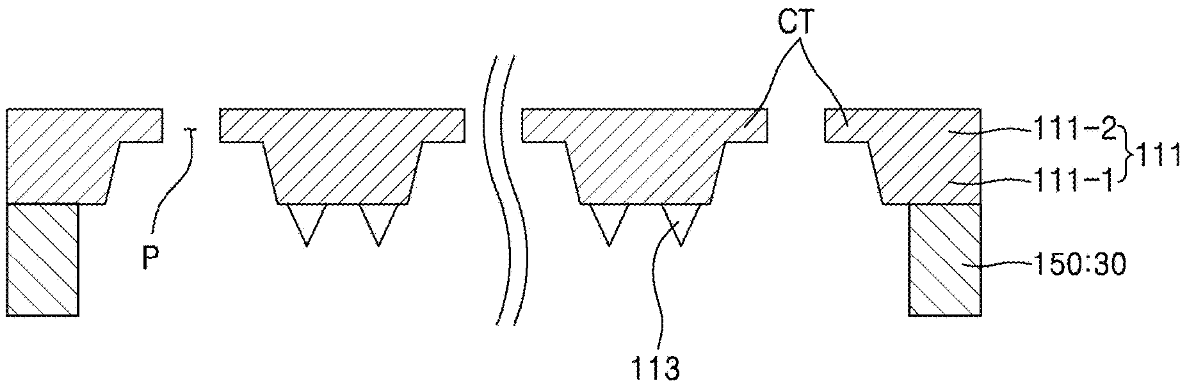
Figure 60:
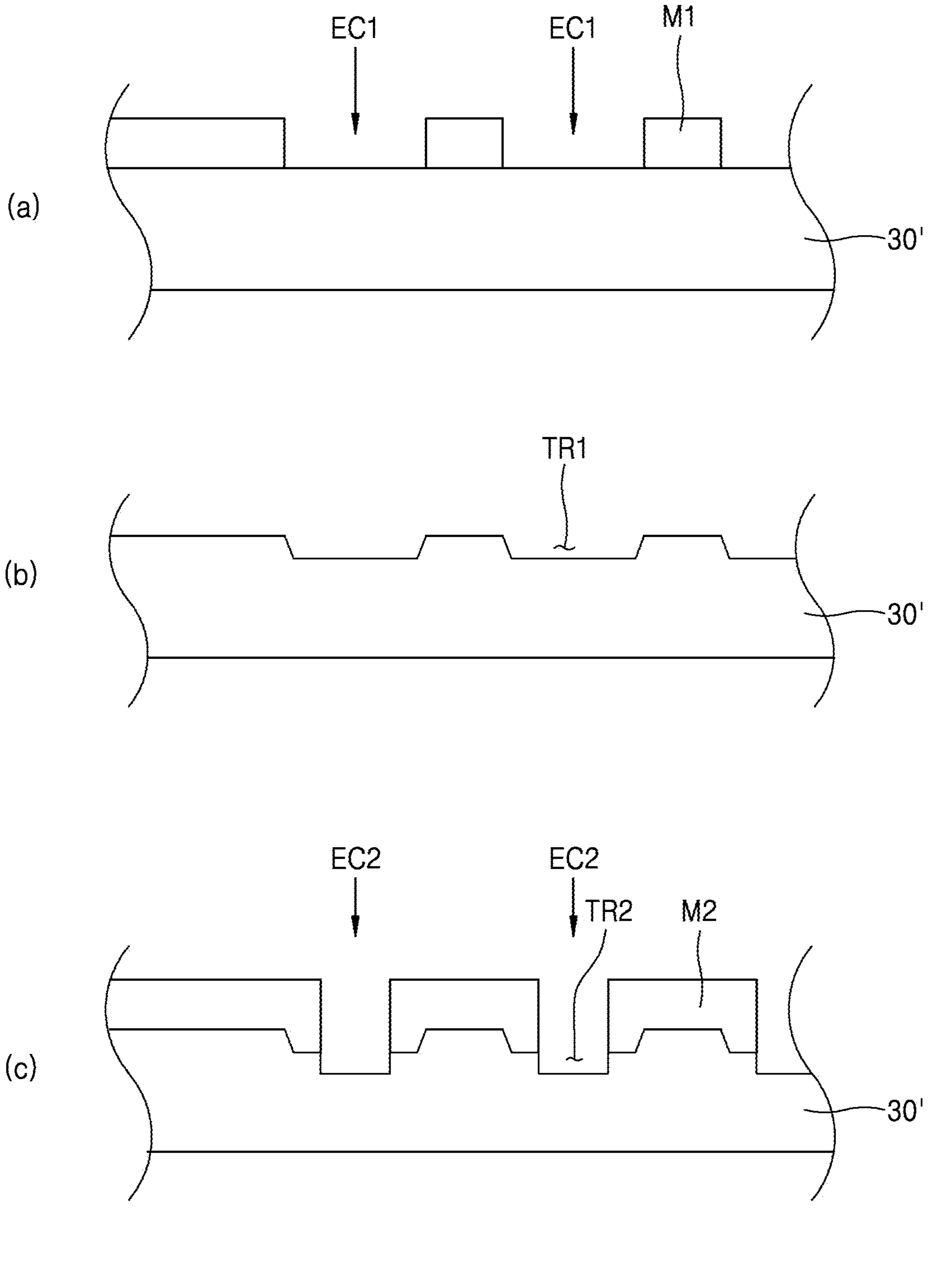
Figure 61:
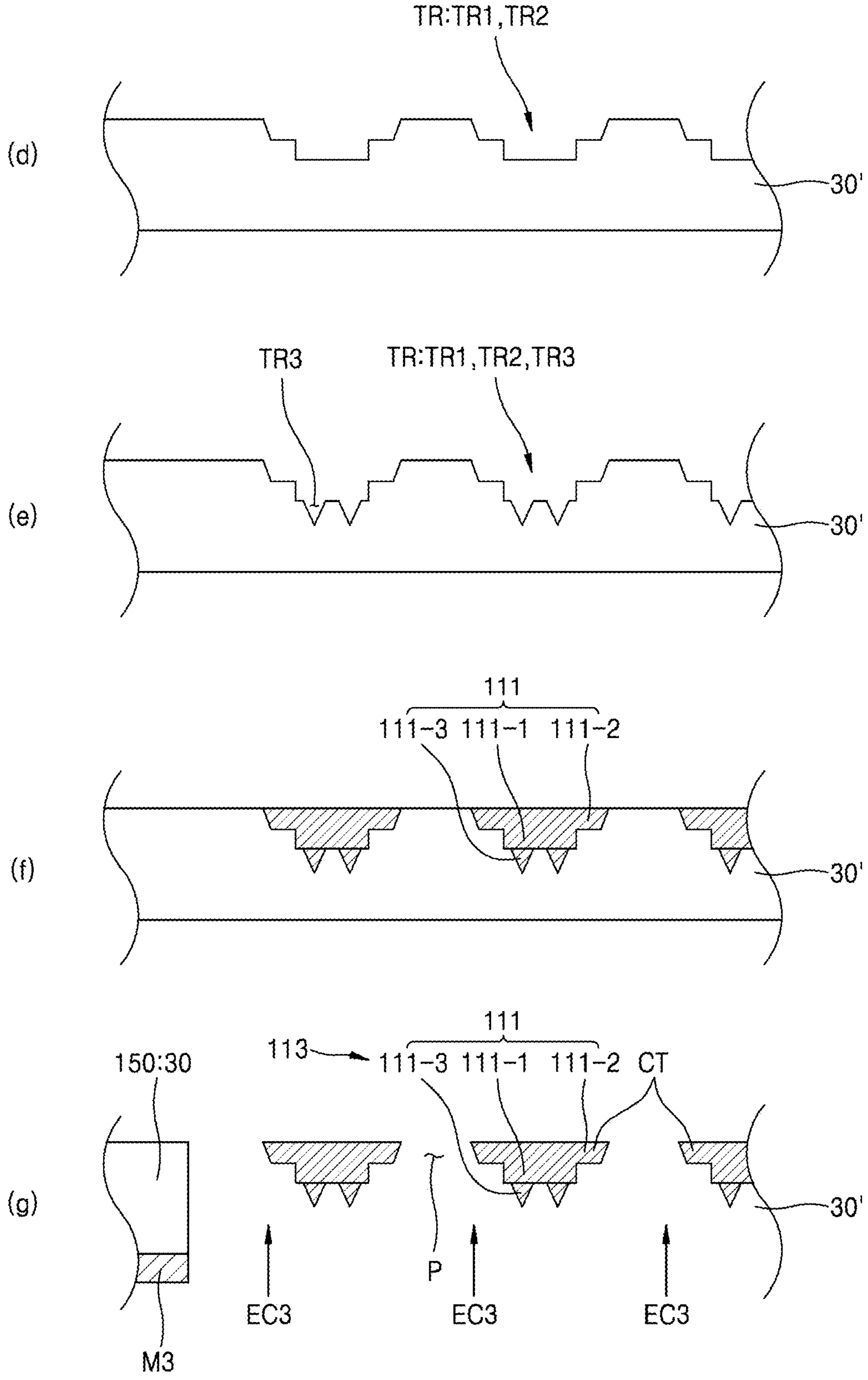

FIGS. 59 to 61 illustrate schematic diagrams showing a manufacturing process of the semiconductor test device in accordance with the fifteenth embodiment of the present invention.

As the first manufacturing process, referring to (a) of FIG. 59, first, a connected structure of the metal thin film portion 111 and the holder portion 150 (30) may be prepared. The processes shown in FIGS. 34 to 36 and FIGS. 48 to 49 may be applied without limitation.

Next, referring to (b) of FIG. 59, the contact protrusion 113 may be formed on the first surface (lower surface) of the metal thin film portion 111 (or the first metal thin film portion 111-1). The contact protrusion portion 113 may be formed using any thin-film formation method such as 3D printing or deposition, without limitation.

According to an embodiment, the metal thin film portion 111 may be formed to have a thickness of approximately 10 μm, the cantilever portion CT may be formed to have a thickness of approximately 3 to 5 μm, and the contact protrusion portion 113 may be formed to have a thickness of approximately 3 to 5 μm. The contact protrusion portion 113 may have an overall conical or polygonal pyramidal shape, or it may be formed by sequentially stacking multiple cylindrical or polygonal columnar layers such that the width gradually narrows from top to bottom.

As the second manufacturing process, referring to (a) of FIG. 60, first, a support 30' with a patterned first insulating portion M1 formed on one surface may be prepared. Then, a first etching process EC1 may be performed on the surface of the support 30' exposed between the patterns of the first insulating portion M1.

Subsequently, referring to (b) of FIG. 60, a first trench portion TR1 recessed into the upper surface of the support 30' may be formed by the first etching EC1. Both ends of the first trench portion TR1 may serve as spaces for forming the cantilever portion CT.

Then, referring to (c) of FIG. 60, a patterned second insulating portion M2 may be formed on one surface of the support 30' as well as on the first trench portion TR1. Subsequently, a second etching EC2 may be performed on the surface of the first trench portion TR1 exposed between the patterns of the second insulating portion M2.

Next, referring to (d) of FIG. 61, a second trench portion TR2, recessed with a narrower width than the first trench TR1, may be formed on the first trench portion TR1 through the second etching EC2. Together, the first and second trench portions TR1 and TR2 may constitute a trench portion TR.

Then, referring to (e) of FIG. 61, a third trench portion TR3, recessed with an even narrower width than the second trench portion TR2, may be formed on the second trench portion TR2 through a third etching EC3 (not shown). Wet etching or drying etching methods may be used for the third etching without limitation.

Next, referring to (f) of FIG. 61, electroforming may be performed on the support 30' to form a metal thin film portion 111. The metal thin film portion 111 may include a contact protrusion portion 111-3 in addition to the first and second metal thin film portions 111-1 and 111-2. The first and second metal thin film portions 111-1 and 111-2 and the contact protrusion portion 111-3 may be formed within the trench portion TR (TR1, TR2, and TR3). The contact protrusion portion 111-3 may fill the third trench portion TR3, and the first metal thin film portion 111-1 may fill the second trench portion TR2. The second metal thin film portion 111-2 may be further formed on the first metal thin film portion 111-1 while filling the first trench portion TR1. The contact protrusion portion 111-3 may correspond to the contact protrusion portion 113 described above with reference to FIG. 58.

Subsequently, referring to (g) of FIG. 61, the support 30' may be subjected to a third etching EC3. The third etching EC3 may be performed on the lower surface opposite to the upper surface of the support 30' to which the metal thin film portion 111 is connected. The third etching EC3 may be performed on the portion corresponding to the cell portion C, excluding the edge portion. Once the third etching EC3 of the support 30' exposed between the patterns of a third insulating portion M3 is completed, the support 30 may take the form of providing a hollow region R with only the edge portion remaining. The remaining edge portion may be provided as the holder portion 150 (30).

Next, the insulating layer portion 115 and the conductive thin film layer 140 may be formed by applying the process described above with reference to FIGS. 50 to 56.

Figure 62:
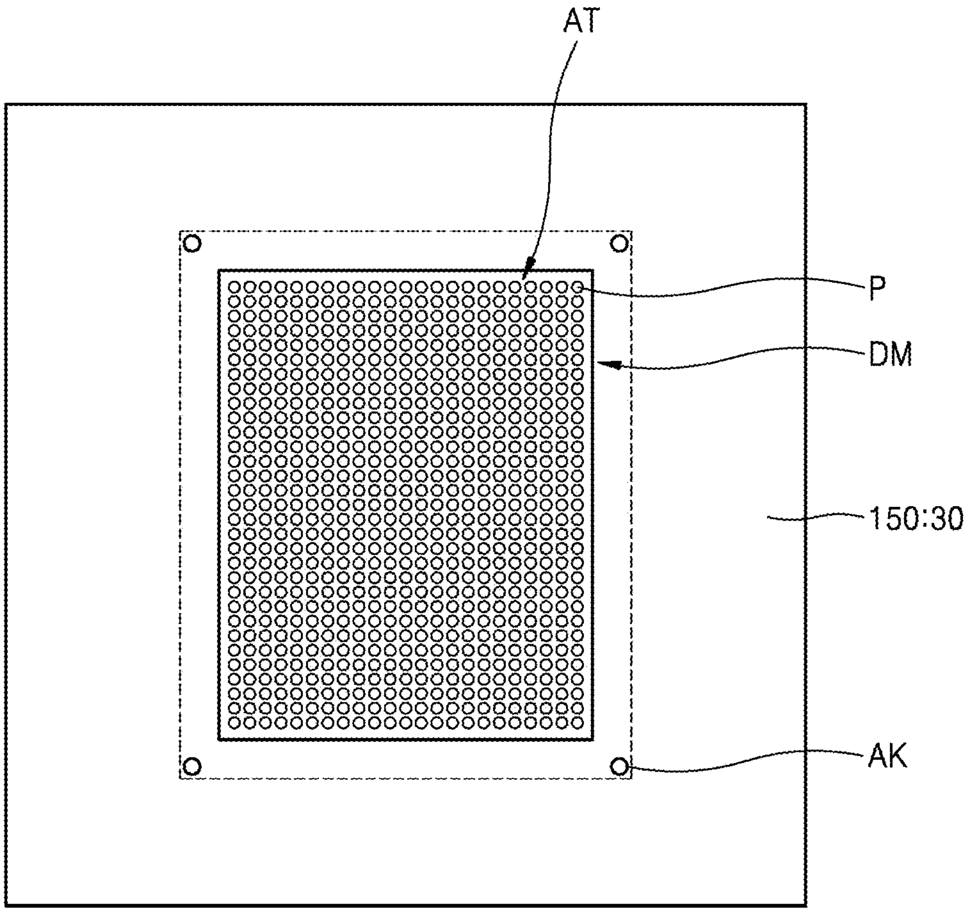
FIG. 62 illustrates a plan view (a) and a side view (b) showing the layout of a semiconductor test device according to an embodiment of the present invention.
Figure 62:
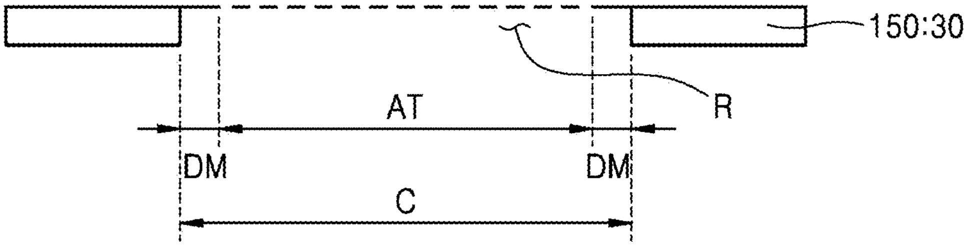

FIG. 62 illustrates a plan view (a) and a side view (b) showing the layout of a semiconductor test device according to an embodiment of the present invention.

The holder portion 150 (30) may support the perimeter of the semiconductor test device as a frame, and the space within the hollow region R of the holder portion 150 (30) may be provided as a cell portion C. The cell portion C may include an active region AT where the aperture pattern P is substantially arranged and the contact is made with the micro bump MB, the flat pad FP, and the like, as well as a dummy region DM outside the active area AT. The conductive thin film layer 140 may be formed in the active region AT. The dummy region DM may include an alignment key AK. The alignment key AK may provide a reference position to ensure that a semiconductor aligns with the aperture pattern P when it is placed on the upper portion of the semiconductor test device or when it is accommodated in the hollow region R of the holder portion 150 (30).

Figure 63:
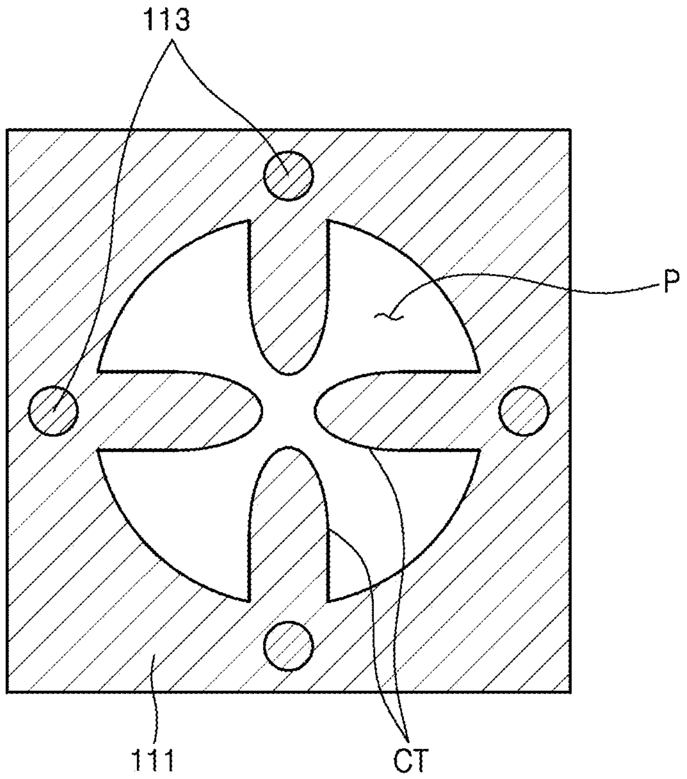
FIG. 63 illustrates schematic bottom views of the area around an aperture pattern of the semiconductor test device in accordance with the fifteenth embodiment of the present invention.
Figure 63:
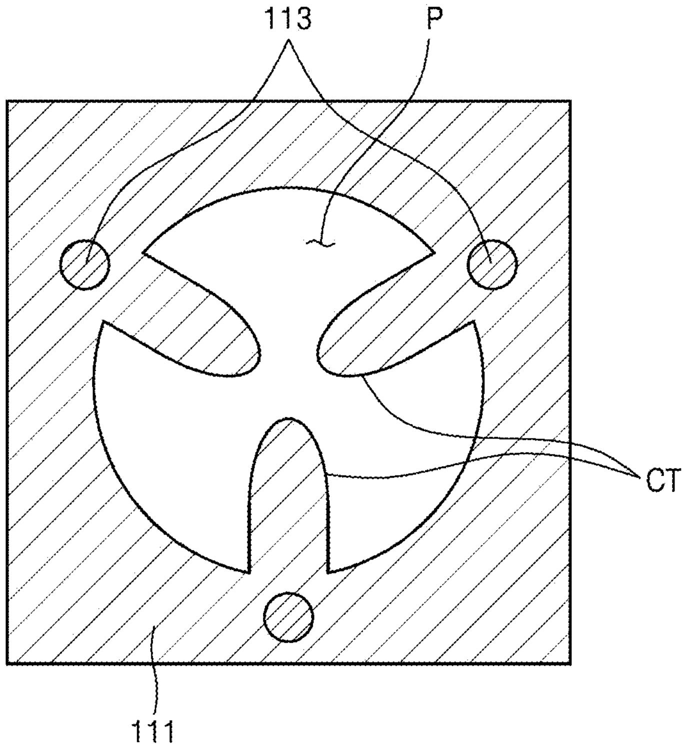

FIG. 63 illustrates views of the area around an aperture pattern of the semiconductor test device in accordance with the fifteenth embodiment of the present invention.

In (a) of FIG. 63, an example is shown in which four cantilever portions CT protrude inward into the aperture pattern P (or the second aperture pattern P-2) of the upper second metal thin film portion 111-2, based on FIG. 58. The four cantilever portions CT may be arranged at 90-degree intervals around the center of the aperture pattern P. Additionally, four contact protrusions 113 may be formed on the lower surface of the first metal thin film portion 111-1 around the periphery of the aperture pattern P (or the first aperture pattern P-1).

In (b) of FIG. 63, an example is shown in which three cantilever portions CT protrude inward into the aperture pattern P (or the second aperture pattern P-2) of the upper second metal thin film portion 111-2, based on FIG. 58. The three cantilever portions CT may be arranged at 120-degree intervals around the center of the aperture pattern P. Three contact protrusion portions 113 may be formed on the lower surface of the first metal thin film portion 111-1 around the periphery of the aperture pattern P (or the first aperture pattern P-1).

Additionally, at least one or more cantilever portions CT may be formed to protrude inward into the aperture pattern P.

Figure 64:
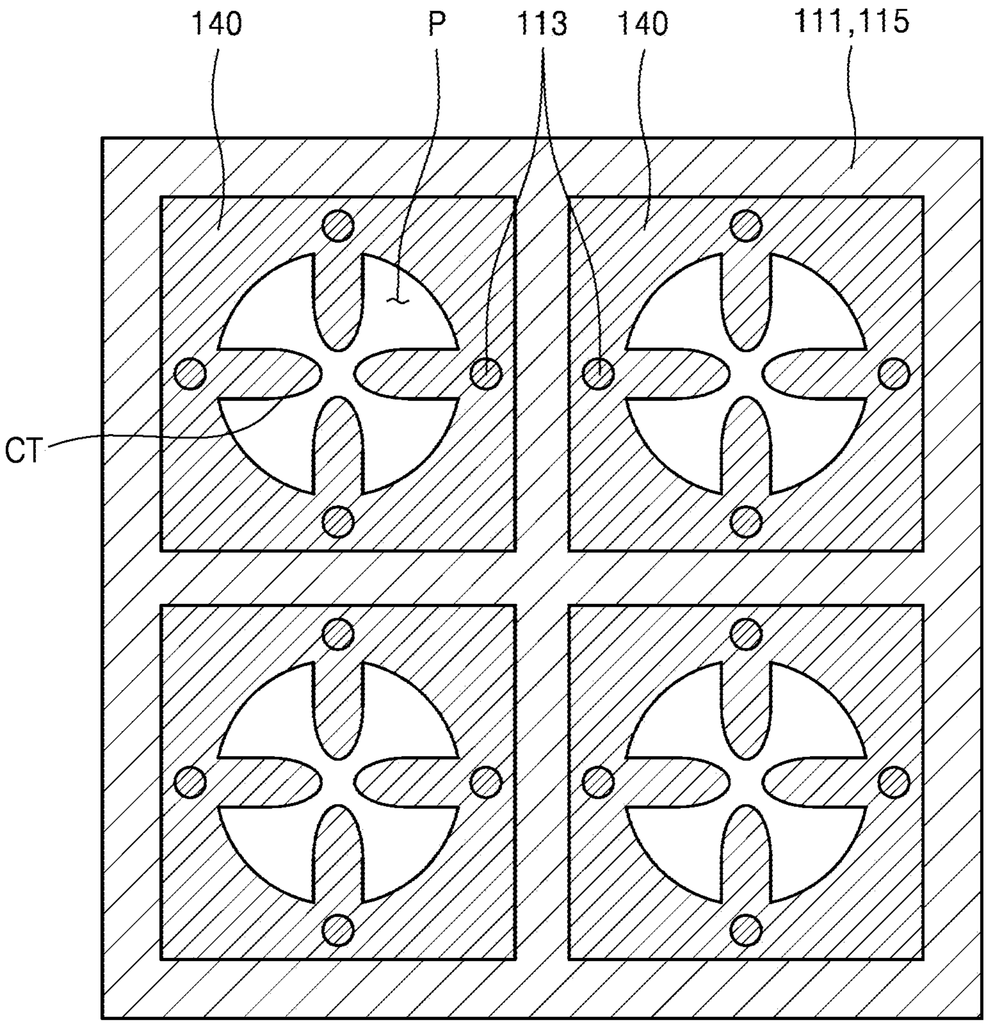
FIG. 64 illustrates a schematic bottom view of the area around a plurality of aperture patterns on each of which a conductive thin film layer is formed in accordance with the fifteenth embodiment of the present invention.

FIG. 64 illustrates a schematic bottom view of the area around a plurality of aperture patterns P on each of which the conductive thin film layer 140 (141 and 142) is formed in accordance with the fifteenth embodiment of the present invention.

Since the insulating layer 115 is formed on the metal thin film layer 111 and each unit of the conductive thin film layer 140 is formed spaced apart for each aperture pattern P, the aperture patterns P may be mutually insulated. As a result, an electrical connection path is established from the top to the bottom of each aperture pattern P via the conductive thin film layer 140 (141 and 142), while the aperture patterns P remain insulated from one another in the horizontal direction.

Figure 65:
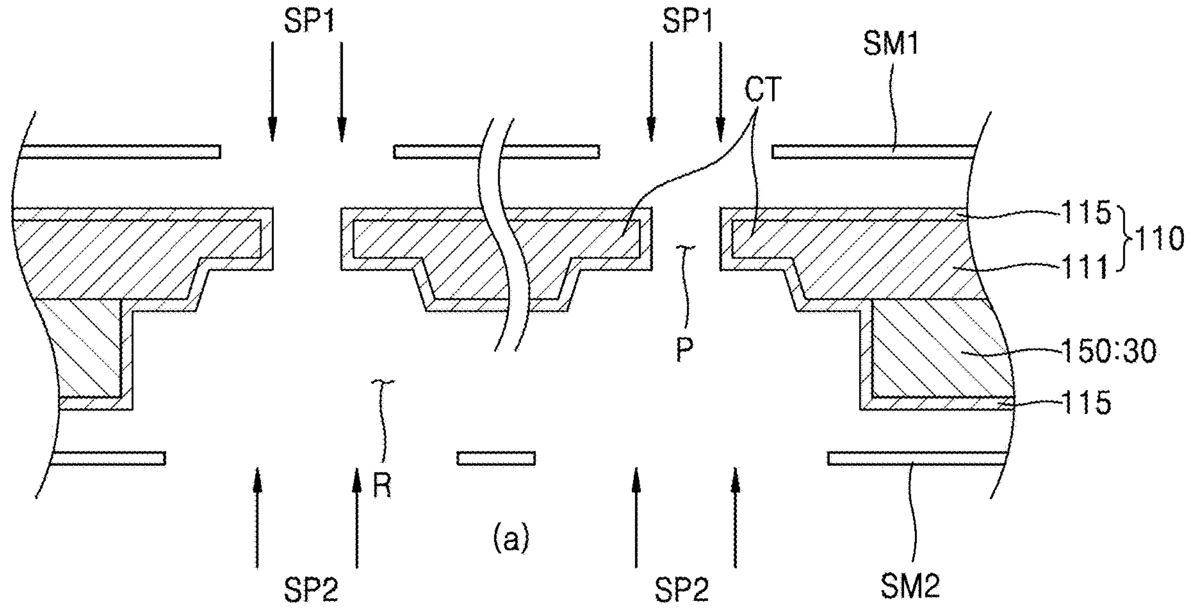
FIGS. 65 to 66 illustrate schematic diagrams showing a manufacturing process of a semiconductor test device using a method of forming a conductive thin film layer according to another embodiment of the present invention.
Figure 66:
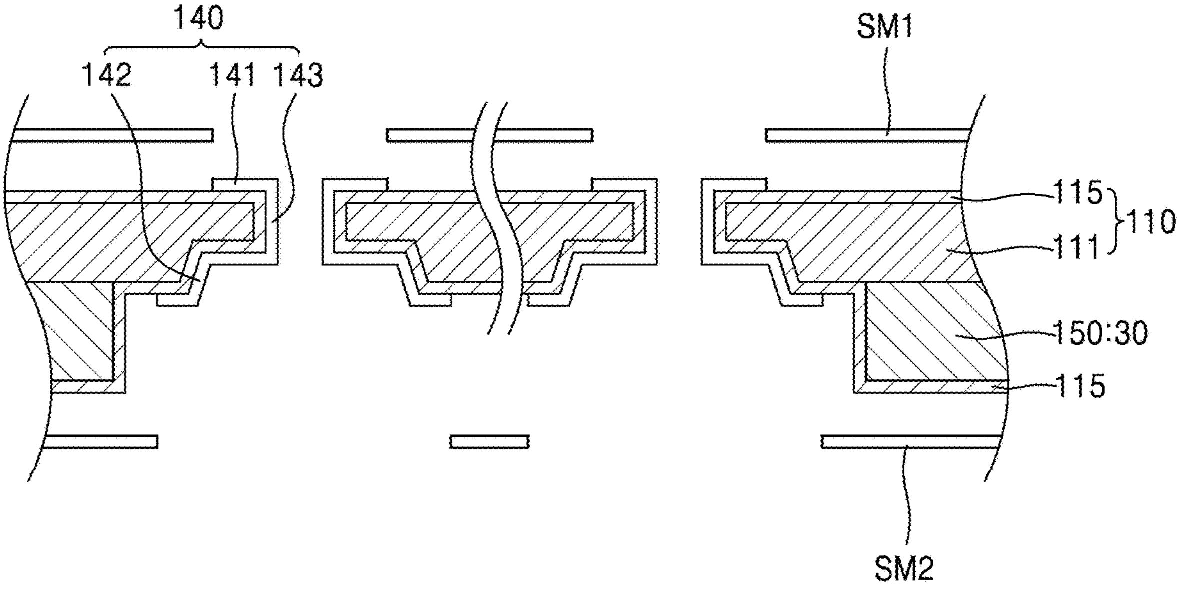

FIGS. 65 to 66 illustrate schematic diagrams showing a manufacturing process of a semiconductor test device using a method of forming a conductive thin film layer according to another embodiment of the present invention. The process subsequent to the stage in which an insulating layer portion 115 is formed on a metal thin film portion 111, as in step (g) of FIG. 50 described above, but before a conductive thin film layer 140 is formed, will be described.

First, referring to FIG. 65, a first sputtering mask SM1 for forming a conductive thin film layer 140 may be prepared on an upper surface of a membrane portion 110. A through pattern of the first sputtering mask SM1 may be aligned in correspondence to an aperture pattern P (or the second aperture pattern P2) of the membrane portion 110.

Subsequently, a first sputtering SP1 may be performed on the first sputtering mask SM1. A part of the conductive thin film layer 140 may be formed on at least the upper surface of the membrane portion 110 or around a second aperture pattern P2 through the first sputtering SP1.

Next, a second sputtering mask SM2 for forming the conductive thin film layer 140 may be prepared on a lower surface of the membrane portion 110. A through pattern of the second sputtering mask SM2 may be aligned in correspondence to the aperture pattern P (or the first aperture pattern P1) of the membrane portion 110.

Subsequently, a second sputtering SP2 may be performed on the second sputtering mask SM2. A part of the conductive thin film layer 140 may be formed on at least the lower surface of the membrane portion 110 or around the first aperture pattern P1 through the second sputtering SP2.

Alternatively, after aligning the first sputtering mask SM1 and the second sputtering mask SM2 on the upper and/or lower surfaces of the membrane portion 110 in the same process, the conductive thin film layer 140 may be formed by performing the first sputtering SP1 and the second sputtering SP2 in the same process.

Next, referring to FIG. 66, the conductive thin film layer 140 (141, 142, and 143) may be formed through the first sputtering SP1 and the second sputtering SP2.

A first conductive thin film layer 141, which is formed to extend in a horizontal direction by a predetermined distance from a top of a side surface of the aperture pattern P, may be formed through the first sputtering SP1. In addition, a third conductive thin film layer 143 may be formed on the side surface of the aperture pattern P through the first sputtering SP1. Due to the directionality of sputtering, a second conductive thin film layer 142 on the opposite side is not formed through the first sputtering SP1.

The second conductive thin film layer 142, which is formed to extend in a horizontal direction by a predetermined distance from a bottom of the side surface of the aperture pattern P, may be formed through the second sputtering SP2. In addition, the third conductive thin film layer 143 may be formed on the side surface of the aperture pattern P through the second sputtering SP2. Due to the directionality of sputtering, the first conductive thin film layer 141 on the opposite side is not formed through the second sputtering SP2.

As described above, according to the embodiment of the present invention, the conductive thin film layer 140 (141, 142, and 143) can be easily formed on at least a side portion of the aperture pattern P through the first and second sputtering SP1 and SP2.

Figure 67:
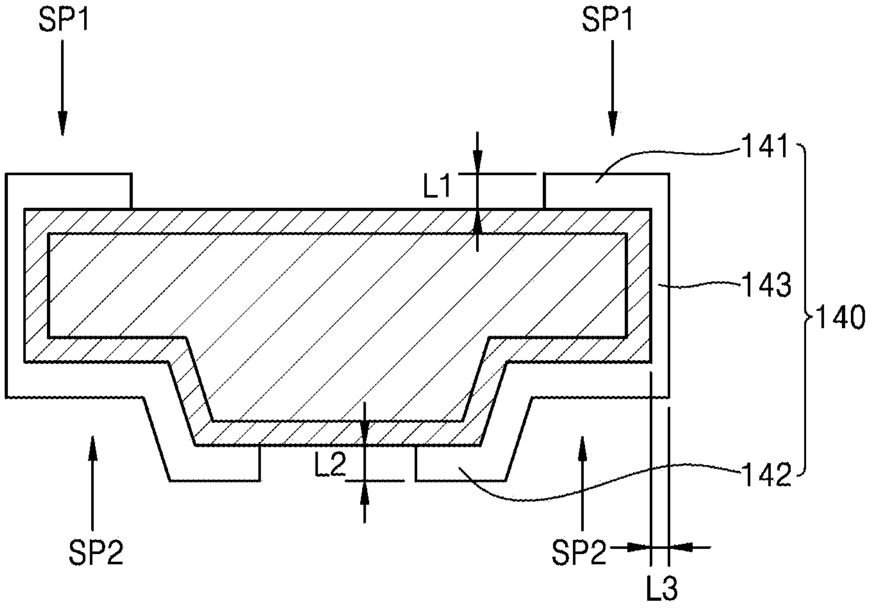
FIG. 67 illustrates a schematic diagram showing a form of a conductive thin film layer of a semiconductor test device manufactured by the method of FIGS. 65 to 66.

FIG. 67 illustrates a schematic diagram showing a form of a conductive thin film layer of a semiconductor test device manufactured by the method of FIGS. 65 to 66.

Referring to FIG. 67, due to the directionality of the first sputtering SP1, the first conductive thin film layer 141 may be formed with a first thickness L1 at the top of the side surface of the aperture pattern P. In addition, since the side surface of the aperture pattern P is also exposed during the first sputtering SP1, the third conductive thin film layer 143 may be formed to have a third thickness L3 on the side surface of the aperture pattern P. However, since the first conductive thin film layer 141 is formed by deposition on a surface perpendicular to the direction in which the first sputtering SP1 is performed, it may be formed thick, whereas the third conductive thin film layer 143 is formed by deposition on a surface parallel to the direction in which the first sputtering SP1 is performed, and thus may be formed with a relatively small thickness. The first thickness L1 formed by the first sputtering SP1 may be greater than the third thickness L3, and a ratio of the first thickness L1 to the third thickness L3 may be approximately 3:1 to 20:1.

Likewise, due to the directionality of the second sputtering SP2, the second conductive thin film layer 142 may be formed with a second thickness L2 at the bottom of the side surface of the aperture pattern P. In addition, since the side surface of the aperture pattern P is also exposed during the second sputtering SP2, the third conductive thin film layer 143 may be formed to have the third thickness L3 on the side surface of the aperture pattern P. However, since the second conductive thin film layer 142 is formed by deposition on a surface perpendicular to the direction in which the second sputtering SP2 is performed, it may be formed thick, whereas the third conductive thin film layer 143 is formed by deposition on a surface parallel to the direction in which the second sputtering SP2 is performed, and thus may be formed with a relatively small thickness. The second thickness L2 formed by the second sputtering SP2 may be greater than the third thickness L3, and a ratio of the second thickness L2 to the third thickness L3 may be approximately 3:1 to 20:1.

Since the third conductive thin film layer 143 may be formed in both processes of the first sputtering SP1 and the second sputtering SP2, the final ratio of the first thickness L1, the second thickness L2, and the third thickness L3 may be approximately 1:1:1/3 to 1:1:10. From another perspective, it can be seen that the aspect ratios of the first conductive thin film layer 141, the second conductive thin film layer 142, and the third conductive thin film layer 143 differ from one another.

Accordingly, by examining the thicknesses L1 to L3 at respective portions of the conductive thin film layer 140 (141, 142, and 143), the process method of the conductive thin film layer 140 may be inferred in reverse.

Figure 68:
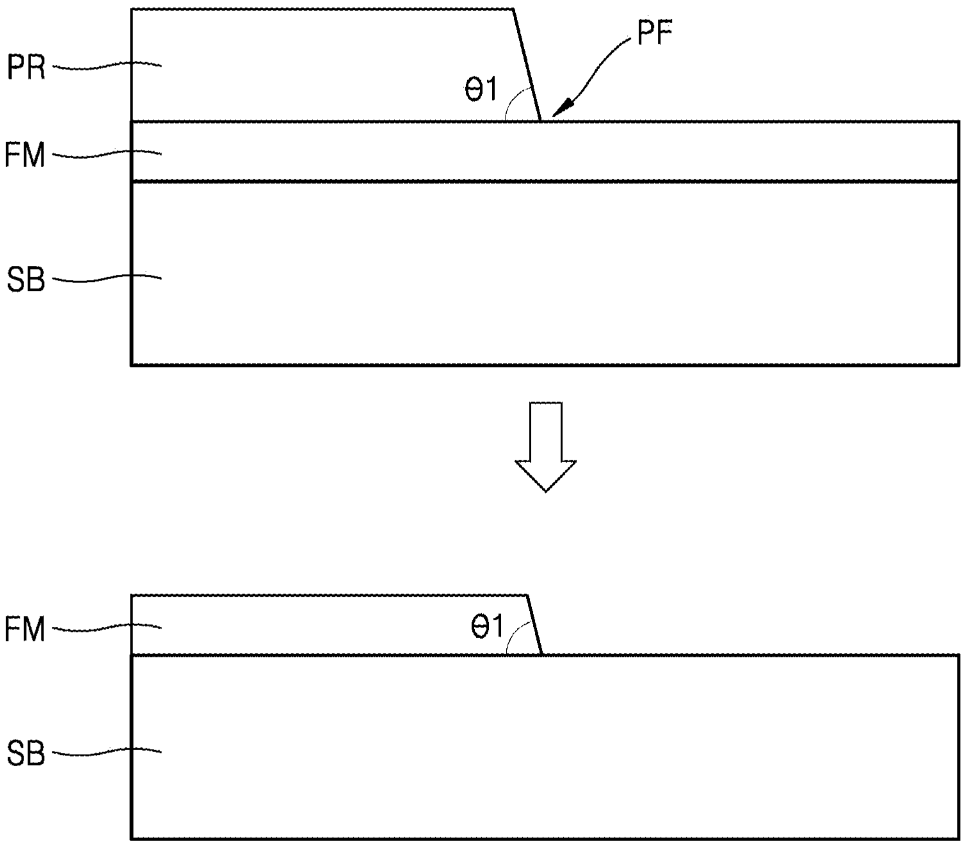
FIG. 68 illustrates a schematic diagram showing a form of a conductive thin film layer manufactured by a method according to a comparative example.
Figure 69:
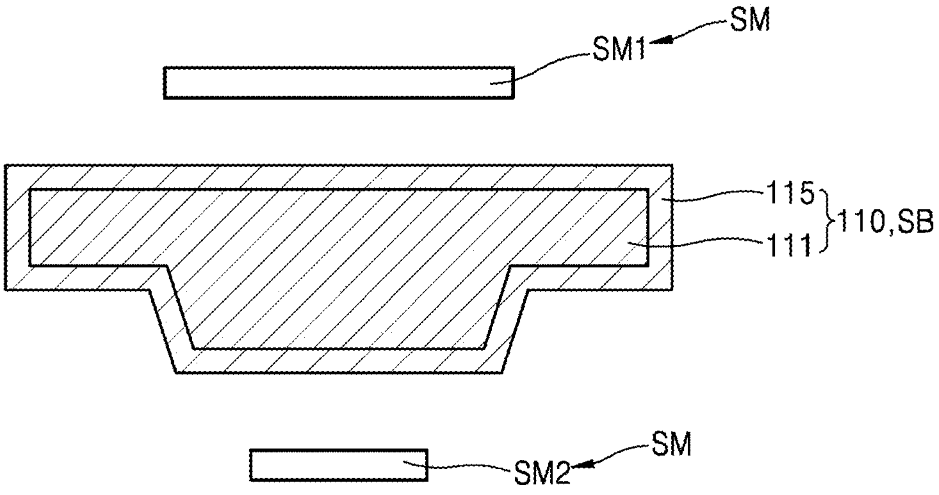
FIG. 69 illustrates a schematic diagram showing a form of a conductive thin film layer manufactured by the method of FIGS. 65 to 66.
Figure 69:
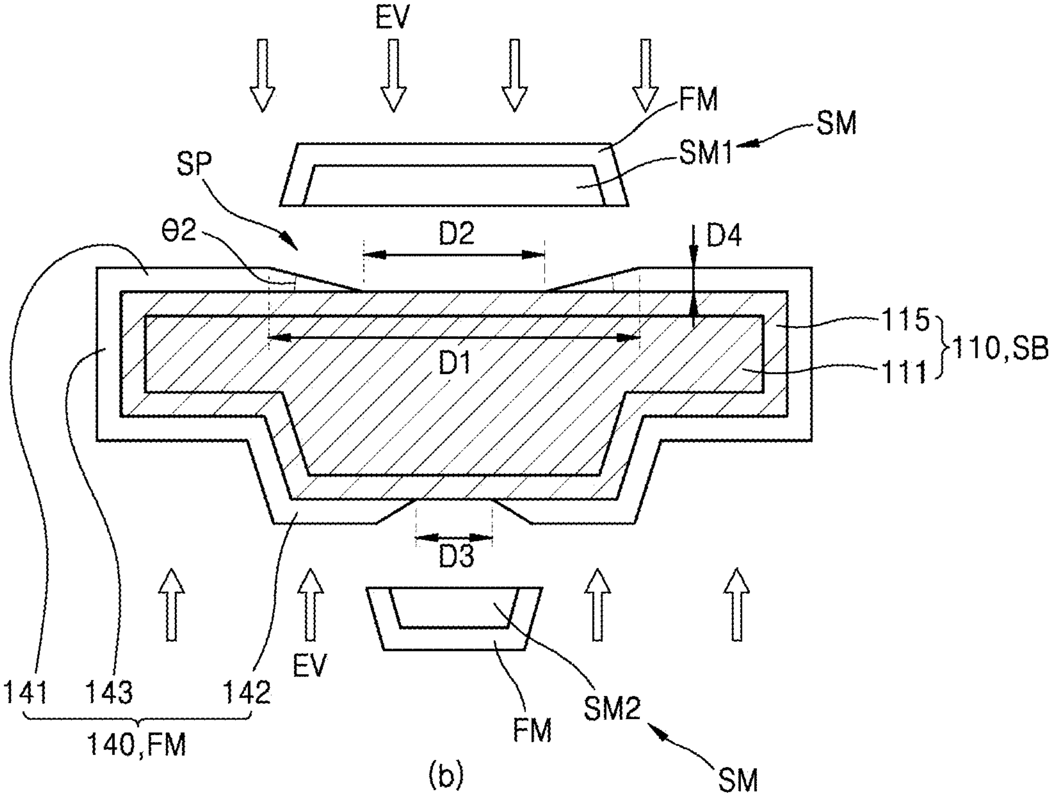

FIG. 68 illustrates a schematic diagram showing a form of a conductive thin film layer manufactured by a method according to a comparative example. FIG. 69 illustrates a schematic diagram showing a form of a conductive thin film layer manufactured by the method of FIGS. 65 to 66.

Referring to FIG. 68, when a conductive thin film layer FM is etched by applying a photoresist PR on a target substrate SB, the photoresist PR may be in a completely close-contact state PF on the conductive thin film layer FM. Accordingly, a sidewall angle θ1 of the conductive thin film layer FM after the etching process may appear uniform in a wide range of typically about 70° to 90°.

Referring to (a) of FIG. 69 and FIGS. 65 to 67, a sputtering mask and/or shadow mask SM is difficult to bring into complete close contact with the membrane portion 110 (or the target substrate SB), and may be in partial contact. A gap SP spaced apart by approximately 1.0 to several tens of micrometers may be formed in a portion between the sputtering mask SM (SM1 and SM2) and the membrane portion 110 (or the target substrate SB) where complete close contact is not achieved.

Referring to (b) of FIG. 69, when deposition EV such as sputtering, CVD, or plating is performed, the conductive thin film layer 140 (or the conductive thin film layer FM) may be formed even in the spaced gap SP. Accordingly, a form different from the sidewall angle θ1 that appears when the conductive thin film layer FM is etched using the photoresist PR of FIG. 68 is obtained. In (b) of FIG. 69, a sidewall angle θ2 of the conductive thin film layer 140 (or the conductive thin film layer FM) is shown.

In other words, deposition EV in the lateral direction may proceed beyond the form of the aperture pattern of the sputtering mask/shadow mask SM (SM1 and SM2). The sidewall angle θ2 of the conductive thin film layer 140 or FM may appear non-uniform in a wide range of typically about 5° to 90°. From another perspective, the sidewall angle θ2 may have an angle smaller than at least the sidewall angle θ1 of FIG. 68, or may have a smaller average angle value. Preferably, the sidewall angle θ2 may be 5° to 60°.

For example, the thickness of the conductive thin film layer 140 may be formed by deposition to be approximately 0.1 μm to 1 μm, and a designed distance D1 between the neighboring conductive thin film layers 141 may be set to be approximately 10 μm to 50 μm. It is preferable that actual distances D2 and D3 between neighboring conductive thin film layers 141 and 143 after the deposition process be at least 1 μm. If the distance is less than 1 μm, a short circuit may occur between the neighboring conductive thin film layers 141 and 143. The sidewall angle θ2 may be determined in consideration of the thickness of the conductive thin film layer 140 and the distances D2 and D3 between the neighboring conductive thin film layers 141 and 143 being greater than at least 1 μm.

Figure 70:
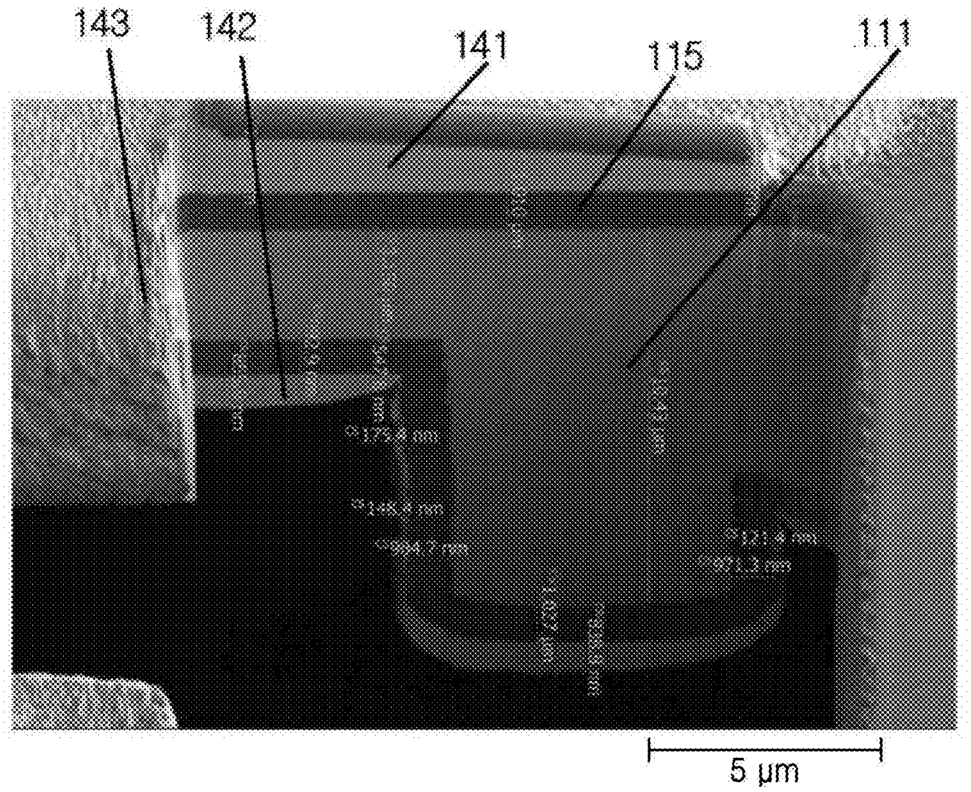
FIGS. 70 and 71 are cross-sectional microscopic photographs showing a form of a conductive thin film layer manufactured according to an experimental example of the present invention.
Figure 71:
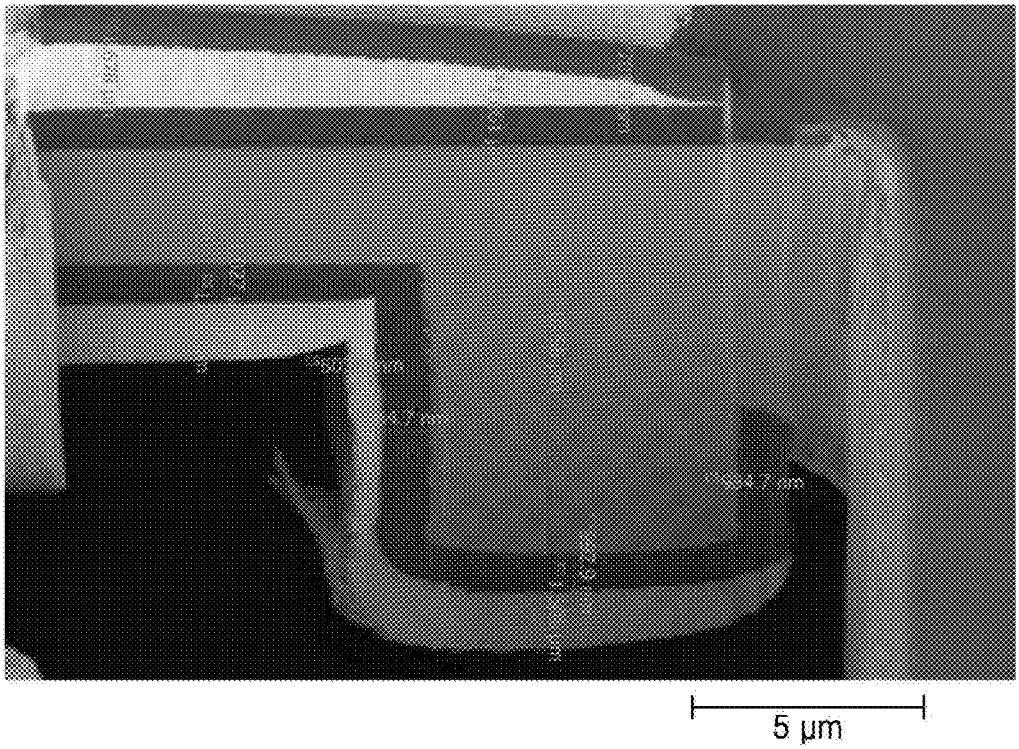

FIGS. 70 and 71 are cross-sectional microscopic photographs showing a form of a conductive thin film layer manufactured according to an experimental example of the present invention.

After an insulating layer 115 is formed on a metal thin film portion 111 made of Invar material, a conductive thin film layer 140 (141, 142, and 143) made of Ag material is formed with a thickness of about 2 μm through first and second sputtering SP1 and SP2 processes as in the method of FIGS. 65 to 66.

Referring to FIGS. 70 and 71, it can be seen that ratios of the thicknesses L1 to L3 at respective portions of the conductive thin film layer 140 (141, 142, and 143) differ from one another.

In addition, in particular, a first conductive thin film layer 141 has a form in which the thickness is large on the left side and becomes thinner toward the right (or a form in which the thickness becomes thinner in the horizontal direction away from the aperture pattern), which is the result of deposition EV being formed through the spaced gap SP between the first sputtering mask SM1 and the membrane portion 110 as described above. That is, similarly to a shadow effect, the first conductive thin film layer 141 is formed having the sidewall angle θ2 through the gap SP. This angle may be set to be smaller than the angle of the etched surface to which the PR is applied, as described above in FIG. 68.

Similarly, the second conductive thin film layer 142 also has a form in which a thickness on the left side is relatively large and becomes thinner toward the right (or a form in which the thickness becomes thinner in the horizontal direction away from the aperture pattern), which is the result of deposition EV being formed through the spaced gap SP between the second sputtering mask SM2 and the membrane portion 110.

As such, in addition to examining the thicknesses L1 to L3 at respective portions of the conductive thin film layer 140 described above, the process method of the conductive thin film layer 140 may be inferred in reverse from the form of the conductive thin film layer 140 and the sidewall angle θ2 of the conductive thin film layer 140.

As described above, the present invention may provide a semiconductor test device capable of performing a test by contacting micro bumps of a semiconductor device and a manufacturing method thereof, and has the effect of preventing damage to the micro bumps and enabling precise alignment during connection.

According to the present invention configured as described above, a test can be performed by contacting micro bumps of a semiconductor device.

Additionally, according to the present invention, there is an effect of preventing damage to the micro bumps and enabling precise alignment during connection.

However, the scope of the present invention is not limited by the above effects.

While the present invention has been particularly shown and described with reference to embodiments thereof, it will be understood by one of ordinary skill in the art that various changes in form and details may be made therein without departing from the scope of the present invention as defined by the following claims.

REFERENCE NUMERALS

10: SEMICONDUCTOR DEVICE
13: INTERPOSER
15: SECOND SEMICONDUCTOR PACKAGE, STACKED SEMICONDUCTOR MEMORY
30': SUPPORT, CONDUCTIVE SUBSTRATE
40: CONNECTION PORTION
100: SEMICONDUCTOR TEST DEVICE
110: MEMBRANE PORTION
111: METAL THIN FILM PORTION
113: CONTACT PROTRUSION PORTION
115: INSULATING LAYER PORTION
130: ELECTRICAL PATH PORTION
140, 141, 142, 143: CONDUCTIVE THIN FILM LAYER
150: HOLDER PORTION
CT: CANTILEVER PORTION
MB, MB2: MICRO BUMP
P: APERTURE PATTERN
R: HOLLOW REGION
TR: TRENCH PORTION

What is claimed is:

1. A semiconductor test device for testing an electrical connection of a semiconductor, comprising:
- a membrane portion comprising a first surface and a plurality of aperture patterns penetrating in a direction of a second surface opposite to the first surface,
- wherein the membrane portion comprises:
- a metal thin film portion having the plurality of aperture patterns;
- an insulating layer portion having an insulating material coated on a surface of the metal thin film portion,
- wherein neighboring aperture patterns among the plurality of aperture patterns are insulated from each other; and
- a conductive thin film layer formed on at least a side surface of each of the plurality of aperture patterns to provide an electrical connection path from a top to a bottom of each of the plurality of aperture patterns,
- wherein the conductive thin film layer comprises:
- a first conductive thin film layer formed to extend in a horizontal direction by a predetermined distance from a top of the side surface of each of the plurality of aperture patterns;
- a second conductive thin film layer formed to extend in a horizontal direction by a predetermined distance from a bottom of the side surface of each of the plurality of aperture patterns; and
- a third conductive thin film layer formed on the side surface of each of the plurality of aperture patterns, and
- wherein micro-bumps of the semiconductor are received in the plurality of aperture patterns to be in contact with the conductive thin film layer.

2. The semiconductor test device of claim 1, wherein a thickness of the first conductive thin film layer or the second conductive thin film layer is greater than a thickness of the third conductive thin film layer.

3. The semiconductor test device of claim 1, wherein the third conductive thin film layer provides the electrical connection path by mediating between the first conductive thin film layer and the second conductive thin film layer.

4. The semiconductor test device of claim 1, further comprising a holder portion which includes a hollow region and is connected to an edge of the membrane portion.

5. The semiconductor test device of claim 1, wherein the metal thin film portion comprises: a first metal thin film portion including the first surface; and a second metal thin film portion connected to an upper part of the first metal thin film portion and including the second surface, and widths of the first metal thin film portion and the second metal thin film portion differ from each other.

6. The semiconductor test device of claim 5, wherein a width of a first aperture pattern in the first metal thin film portion is greater than a width of a second aperture pattern in the second metal thin film portion, and a portion where the first aperture pattern of the first metal thin film portion and the second aperture pattern of the second metal thin film portion differ is provided as a cantilever portion protruding inward into each of the plurality of aperture patterns.

7. The semiconductor test device of claim 6, wherein the first conductive thin film layer is formed on at least an upper part of the cantilever portion, and the third conductive thin film layer is formed on at least a side part of the cantilever portion.

8. The semiconductor test device of claim 1, wherein a contact protrusion portion is formed to protrude from the first surface of the metal thin film portion.

9. The semiconductor test device of claim 8, wherein on the first surface, the contact protrusion portion comes into contact with a flat pad of a semiconductor, and on the second surface, the conductive thin film layer formed on each of the plurality of aperture patterns comes into contact with a micro bump of the semiconductor.

10. The semiconductor test device of claim 1, wherein the conductive thin film layer is formed by performing sputtering or deposition on each of the first surface and the second surface.

11. The semiconductor test device of claim 10, wherein the conductive thin film layer is formed through a through pattern of a sputtering mask after placing the sputtering mask on each of the first surface and the second surface.

12. The semiconductor test device of claim 1, wherein the first conductive thin film layer or the second conductive thin film layer is formed to have a sidewall angle of 5° to 60°.

13. The semiconductor test device of claim 11, wherein the conductive thin film layer has a length that extends further in a lateral direction than the through pattern of the sputtering mask.

14. The semiconductor test device of claim 1, wherein the first conductive thin film layer is formed such that its thickness decreases in a horizontal direction away from each of the plurality of aperture patterns, and the third conductive thin film layer is formed such that its thickness decreases in the horizontal direction away from each of the plurality of aperture patterns.

15. A method for manufacturing a semiconductor test device for testing an electrical connection of a semiconductor, the method comprising:

(a) providing a membrane portion including a first surface and a plurality of aperture patterns penetrating in a direction of a second surface opposite to the first surface, wherein the membrane portion includes a metal thin film portion having the plurality of aperture patterns, and an insulating layer portion having an insulating material coated on a surface of the metal thin film portion; and (b) forming a conductive thin film layer on at least a side surface of each of the plurality of aperture patterns to provide an electrical connection path from a top to a bottom of each of the plurality of aperture patterns, wherein the conductive thin film layer in step (b) is formed by performing sputtering on each of the first surface and the second surface, and wherein the conductive thin film layer comprises:

a first conductive thin film layer formed to extend in a horizontal direction by a predetermined distance from a top of the side surface of each of the plurality of aperture patterns;

a second conductive thin film layer formed to extend in a horizontal direction by a predetermined distance from a bottom of the side surface of each of the plurality of aperture patterns; and a third conductive thin film layer formed on the side surface of each of the plurality of aperture patterns, and wherein micro-bumps of the semiconductor are received in the plurality of aperture patterns to be in contact with the conductive thin film layer.

* * * * *